(12) United States Patent
Snoeijs

(10) Patent No.: US 6,972,706 B2
(45) Date of Patent: Dec. 6, 2005

(54) CURRENT FOLDING CELL AND CIRCUIT COMPRISING AT LEAST ONE FOLDING CELL

(76) Inventor: Walter Jan Maria Snoeijs, Sous-Verzin, Cernex (FR)

( * ) Notice: Subject to any disclaimer, the term of this patent is extended or adjusted under 35 U.S.C. 154(b) by 0 days.

(21) Appl. No.: 10/669,590

(22) Filed: Sep. 23, 2003

(65) Prior Publication Data
US 2004/0130473 A1  Jul. 8, 2004

Related U.S. Application Data

(63) Continuation of application No. PCT/EP02/03410, filed on Mar. 22, 2002.

(60) Provisional application No. 60/311,622, filed on Aug. 10, 2001.

(51) Int. Cl.$^7$ .............................................. H03M 1/34

(52) U.S. Cl. ...................................... 341/158; 341/155

(58) Field of Search ............................... 341/122, 123, 341/124, 125, 155–161, 118, 120, 168, 129; 307/352, 491, 494, 570, 572, 443; 327/91–96, 327/336, 337; 330/9

(56) References Cited

U.S. PATENT DOCUMENTS

| 3,984,832 A | | 10/1976 | Henry | |
|---|---|---|---|---|
| 4,970,703 A | * | 11/1990 | Hariharan et al. | 367/138 |
| 5,291,074 A | * | 3/1994 | Nayebi | 327/96 |
| 5,874,912 A | * | 2/1999 | Hasegawa | 341/161 |
| 6,535,156 B1 | * | 3/2003 | Wang et al. | 341/156 |
| 6,806,745 B2 | * | 10/2004 | Fujimoto | 327/94 |

FOREIGN PATENT DOCUMENTS

GB  1 266 962 A  3/1972

\* cited by examiner

Primary Examiner—Brian Young
(74) Attorney, Agent, or Firm—Pearne & Gordon LLP

(57) ABSTRACT

A current folding cell has current inputs and current outputs. Input currents are transferred from one current path to another and finally leading to the current outputs to establish a continuous folding characteristic. The signal current through one of the current paths often does not need to be substantially zero around the folding point in the folding characteristic. Comparator outputs in the cell provide digital outputs corresponding to the currents at the current inputs. An A/D converter can be constructed utilizing such current folding circuit cells in cascade and/or in parallel. The well-determined relationship between folder outputs can be used in a feedback loop to reduce or eliminate mismatch contributions. A mixer can be constructed using such current folding cells.

63 Claims, 38 Drawing Sheets

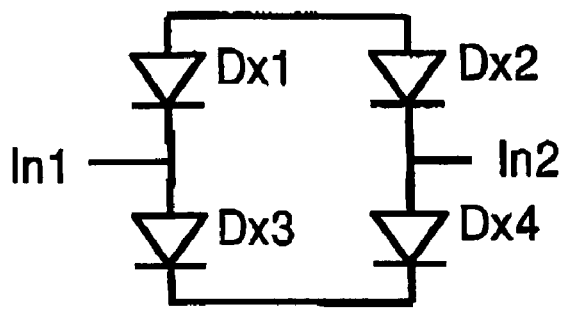
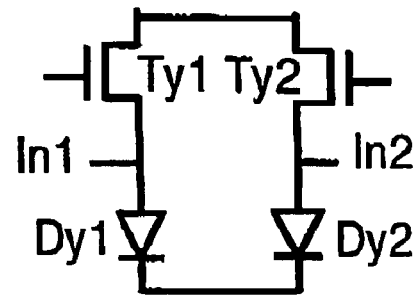
Fig. 19   Fig. 20
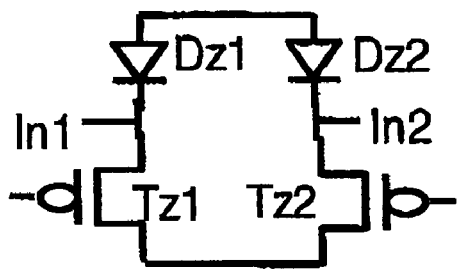
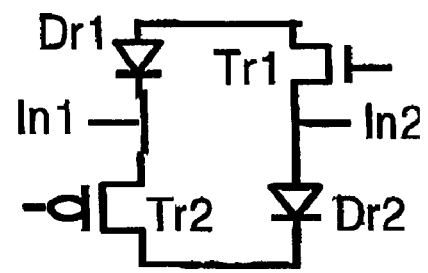
Fig. 21   Fig. 22
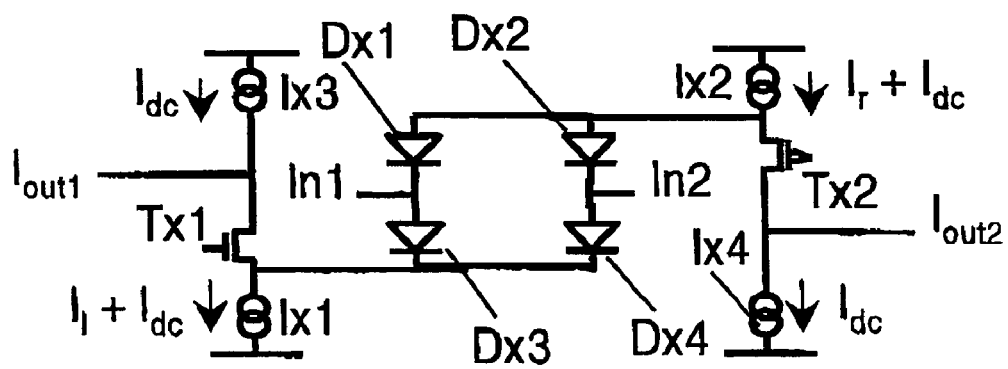
Fig. 23

CURRENT FOLDING CELL AND CIRCUIT COMPRISING AT LEAST ONE FOLDING CELL

This application is a Continuation of PCT/EP20/03410 filed on Mar. 22, 2002, claiming priority of European Application No. EP01107305.3 filed on Mar. 21, 2001 and U.S. Provisional Application No. 60/311,622 filed Aug. 10, 2001.

FIELD OF THE INVENTION

The invention relates to current folding circuit cells. It also relates to an analog-to-digital conversion circuit (A/D conversion circuit) and mixers employing such folding circuit cells. It also relates to signal processors incorporating such A/D conversion circuits, mixers or folding cells.

DESCRIPTION OF THE PRIOR ART

Folding circuit cells have been extensively used to reduce the number of components and hence the cost and power consumption in analog-to-digital converters. As an example, FIG. 1 shows a schematic diagram of a conventional serial type analog-to-digital converter comprising folding circuits F0 . . . F4 in cascade. Each folding circuit produces a V-shaped output signal, which is presented to the input of the next folding circuit. FIG. 2a to 2e show the outputs of the folding circuits as a function of the input signal. FIG. 2a shows the output of F0, FIG. 2b the output of F1, etc . . . . Each folding block F0 . . . F4 also contains a comparator which provides a digital output D0 . . . D4 (D0 corresponds to F0, D1 to F1, etc . . . ) indicating the sign of the signal at the input of the folding block. Such a converter needs one folding circuit cell per bit, and therefore only needs a small number of components.

To produce such a continuous V-shaped signal exhibiting two opposite slopes from a single signal, a sign reversal operation for part of the input range or a difference producing circuit is required. Continuous means in this context that the folded current signal does not exhibit abrupt steps, it only changes slope abruptly.

U.S. Pat. No. 4,599,602 describes such a conventional serial type A/D converter using folding circuit cells in cascade, where each cell converts a differential potential input into a current difference using a differential amplifier. A comparator included in the cell switches over the current paths for the differential current to implement the sign reversal and to obtain a folding characteristic. The current difference is further converted into a differential voltage, which serves as output of the folding circuit cell and is applied to the next cell in the cascade.

Continuous folded output currents exhibiting changing slopes as a function of the input currents can be obtained without sign reversal operations or conversions to voltage and back in the folding cell if more than one time-varying current is applied to the current folding cell. An example of applying input currents to more than one current input to obtain two different slopes is described in GB1266962. One current input receives the input current while the second one receives the input current with the opposite sign. The signals are fully rectified and then transferred to the next stage. The disadvantage of such full rectifier circuit is that when current paths for the signal currents are switched from one current path to another, the current in both paths is zero. This requires operating the non-linear elements at effectively zero current around the switching point. This yields a large input impedance around the switching points requiring large voltage swings around the zero transition. Any capacitance associated with the input nodes has to be charged and discharged by the input current over this large voltage range rendering this circuit slow.

A current folding cell addressing this problem in part is described in U.S. Pat. No. 4,179,687. The circuit provides two current paths, only one of which is conducting significant current at a given time. The current in one of the two paths is fed to a current sink. The current in the other path is used for further comparisons. A cascade of N such cells leads to a folded signal with N+1 line segments.

Another way to obtain a continuous V-shaped signal is the use of switches. In one case (FIG. 5 of U.S. Pat. No. 4,179,687) reference currents are switched in or out the current path of an input current. In another case (FIG. 6 of U.S. Pat. No. 4,179,687) switches are used to open or close current paths to recover the correct residue current for subsequent comparisons.

Also in other cases switches have been used to switch from one current path to another. These switches are controlled by some controlling input, i.e. the differential voltage on the gates of a differential transistor pair. These switches often are the cause of large switching transients in the signal current, or they require complicated circuitry to minimize this effect. In addition, when a current path is changed by means of switches, the switches are driven from on to fully off or vice versa. Therefore a large voltage swing is often required to control the switches. If this large swing is to be applied at high frequency, a power penalty is incurred.

In addition, in several embodiments in U.S. Pat. No. 4,179,687 use is made of current dividers which are subject to mismatch.

Another current folding cell is described in U.S. Pat. No. 4,325,054. It provides two alternate paths for the input current. The value of the input current determines along which of the two current paths the input current will flow. The currents flowing through these two alternate paths are fed to a difference producing circuit, which in the embodiment described is implemented using a current-to-voltage conversion for the current in each of the two current paths, and a difference producing circuit using the two voltages generated in these current to voltage converters as input.

An alternate implementation for the difference producing circuit is based on taking the difference of the two currents directly, which requires a sign reversal of one of the two currents. Such a sign inversion can be implemented using a current mirror or a circuit using an operational amplifier. An example of this is described in U.S. Pat. No. 4,574,270. Without a sign reversal the folding circuit of U.S. Pat. No. 4,325,054 still works, but N−1 folding cells are needed to obtain a folding characteristic with N segments, which yields a slow signal and a costly solution in terms of area and power for large values of N.

Voltage-to-current conversion circuits, current-to-voltage conversion circuits, current mirrors, and circuits implementing a current sign reversal are sensitive to device parameters and device parameter mismatch. Device parameter mismatch can be improved by increasing device size but this leads to higher cost and larger capacitive load. If this larger capacitive load is seen by the varying signal a slower circuit is obtained.

Folding circuit cells which include voltage-to-current or current-to-voltage conversion circuits acting on the time-varying signal, or which include current mirrors or current sign reversal circuits in the path of the time-varying signal, therefore limit the speed and/or the accuracy of the serial analog-to-digital converter in which they are used.

In the prior art, all folding circuits with current inputs and current outputs which can be cascaded without any intermediate circuitry to produce a continuous folded signal at the output with 2N segments where N is the number of stages satisfy at least one of the following conditions:

The folding cell contains a current sign reversal operation on the time-varying signal (like a current mirror for instance);

The folding cell contains a current difference operation which requires a current sign reversal operation on the time-varying signal;

The folding cell requires a current-to-voltage conversion operation on the time-varying signal and later on a voltage-to-current conversion;

The folding cell requires comparatively large voltage transitions around at least some of the switching points, because the currents through some of the various current paths provided for each input signal are substantially zero when current paths are switched from one to another for that input signal.

It is an aim of the invention to provide a folding circuit which can be cascaded to construct an analog-to-digital converter without the need for a sign reversal, or voltage-to-current or current-to-voltage conversion, and which provides the possibility of obtaining a folding characteristic with 2 to the power N segments with only N folding circuit cells.

Advantageously, as will be seen, the folding cell of the invention does not require that currents through the various current paths provided for the different input signals are substantially zero when current paths are switched from one to another. As the currents are transferred from one current path to another without requiring substantially zero current in at least one of the current paths near the switching point, a higher speed can be reached.

Advantageously, as will be seen, the folding cell of the invention requires only a small number of components even for a large number of segments in the folding characteristic, thus presenting a low cost and low power solution.

Advantageously, the folding cell of the invention should have a limited sensitivity to mismatch of the components in the path of the time-varying signal, so that those components can be made small, thus yielding lower parasitic capacitances and higher speed.

Advantageously, as will be seen, the limited number of components in the folding cell allows to actively compensate some fraction of the parasitic capacitances, the small number of components allowing this without a large power penalty.

Due to its economic importance significant effort has been invested in decreasing the density of memory. One approach has been the use of multi-level memory cells. The use of such cells requires a multilevel readout. Traditionally power and spatial constraints of the cell readout (multilevel sense amplifier) have limited the number of levels per cell to only a small number.

It is another aim of the invention to propose a new current folding cell and a new analog-to-digital converter which provide a way to detect a large number of levels and this with a low power consumption. In addition, the folding cells allow to construct multi-level memory cells.

Several techniques have been proposed to reduce or eliminate cell mismatch in analog-to-digital conversion to improve the linearity of the conversion. One example is the use of chopper amplifiers and filtering in the digital domain. Such a technique usually introduces considerable additional power and circuit complexity.

U.S. Pat. No. 5,835,048 and U.S. Pat. No. 6,014,098 describe a way to reduce cell mismatch in a plurality of cells containing a differential amplifier having first and second branches. The technique uses averaging impedances, preferably resistors, connected between the output terminals in the first branches of the differential amplifier, and the output terminals in the second branches of the differential amplifier, in successive pairs of cells. The impedances have relatively low values, particularly compared to the impedances of current sources connected to the branch output terminals.

It is another aim of the invention to propose a new circuit for reducing cell mismatch which provides for significant improvement compared to the prior art in terms of linearity improvement of the converter. As will be explained, those improvements are due to the fact that there exists a well defined relationship between the output currents of a folder constructed from a cascade of current folding cells according to the invention. Instead of only reducing the influence of offsets due to averaging, the circuit of the invention provides the possibility of fully eliminating some offset contributions, and this with only a small number of components. Since the circuit of the invention allows to fully eliminate offset contributions from some components, these components can be designed with smaller dimensions. This results in a smaller circuit and hence a reduced cost, and also yields a speed advantage as the parasitic capacitances associated with these components is reduced.

Testing of analog-to-digital converters is often time consuming and often requires special equipment, both of which cause the testing to be important in the overall cost of such converters. As will be explained, the folding cells of the invention can provide two digital outputs per cell or 2N digital signals for an N bit converter. This redundancy can be used advantageously to simplify the testing and significantly reduce the testing cost for a converter based on these folding cells.

Mixers are often used in systems for telecommunication and networks to superimpose and extract a signal from the carrier. Very often an analog-to-digital converter is required after the mixer. It is another aim of the invention to propose an improved mixer, based on the inventive folding cell, in which no signal conversion (e.g. current-to-voltage) is required eliminating conversion errors, and where several biases could be shared yielding a smaller circuit area, lower power, and hence a reduced circuit cost.

Several current comparators have been proposed in the past. All are subject to a trade-off between speed, maximum current range, and minimum current resolution. The minimum current resolution requires a certain minimum signal, for instance a voltage, to be generated in order for it to be detected. This signal can be reduced on the condition that larger devices are used to decrease the influence of random device fluctuations (mismatch). Larger parasitics are associated with larger devices, yielding slower circuits for the same minimum current resolution. The maximum current range is determined by the maximum current which can be absorbed by the current comparator.

It is another aim of the invention to provide a circuit which allows to decouple the maximum current range from the minimum current resolution allowing smaller devices for the current comparison and hence a faster circuit.

Prior art current sample-and-hold or track-and-hold circuits are traditionally classified into first generation (FIG. 2x) and second generation circuits (FIG. 2y). In the first generation circuits (FIG. 2x) the input current Iin is transformed into a voltage by means of a first transistor T1. This voltage is sampled on a storage capacitor CA by means of the switch SWX. Neglecting circuit non-idealities, opening the switch SWX will cause the voltage on the capacitor to remain at its value at the moment the switch was opened. A second transistor T2 receives the voltage on the capacitor CA and transforms it back to current. The biasing for the circuit is provided through the current sources IT1 and IT2. The disadvantage of this class of circuits is that mismatch between the two transistors will introduce an error causing the output current to be not exactly equal to the input current.

In circuits of the second generation (FIG. 2y) the same transistor T3 is used for both the current to voltage conversion and the subsequent conversion back into current. In the figure the bias is provided through the current source IT3, and the switches SX1 ... SX3 allow to couple the storage capacitor CB to the input during track mode and to isolate the gate of T1 linked to the storage capacitor during the hold mode. The use of only one transistor avoids an error between input and output current due to mismatch but no output current is available when the input current is being sampled or tracked. This is a disadvantage as not the full clock period can be used to treat input and output current. The clock period has to be divided into a part allocated to sample or track the input current and another non-overlapping part during which the current output is provided. If a meaningful output current has to be provided for the full clock period, at least two transistors need to be used in parallel, where they alternate as sampling and output transistor. So, when one transistor is sampling or tracking the input, the other one is providing the output current.

It is therefore another aim of the invention to provide a current sample-and-hold or current track-and-hold circuit which is not subject to errors introduced between input and output current due to mismatch, and which allows to sample or track the input current and provide an output current simultaneously during the full clock cycle. This sample and hold circuit principle should also allow to present well-matched input currents to several folding circuits in parallel.

Charge injection in the switches of a sample-and-hold or track-and-hold circuit has always been an issue. In some cases injected charge has been balanced using dummy switches driven with control signals of the opposite sign. In other cases the switches were placed inside a feedback loop to obtain an injected charge less dependent on the input signal.

Therefore a further object of the invention is a way to implement a switch which inherently minimizes the amount of injected charge.

Folding circuit cells which include voltage-to-current or current-to-voltage conversion circuits acting on the time-varying signal, or which include current mirrors or current sign reversal circuits in the path of the time-varying signal, limit the speed and/or the accuracy of the circuit in which they are used.

Because the currents through some of the various current paths provided for the different input signals are substantially zero when current paths are switched from one to another, folding cells which require comparatively large voltage transitions around at least some of the switching points are limited in speed.

Continuous folded output currents exhibiting at least two different slopes different from zero as a function of the input currents can be obtained without sign reversal or scaling operations in the folding cell if more than one time-varying current is applied to the current folding cell. Continuous means in this context that the folded current signal does not exhibit abrupt steps, it only changes slope abruptly. Abrupt steps can be created by switches, but such switches can introduce significant switching noise in a circuit and can cause significant speed limitations.

SUMMARY OF THE INVENTION

According to the invention, those problems are solved among other by a current folding circuit cell where:
currents at a plurality of current inputs are transferred to current outputs via different current paths,
the magnitude or sign of the current signals only determines which current path is taken by each current,
signal currents change from one current path to another without requiring substantially zero current in at least one of the current paths,
at least two input currents differ from each other and are time-varying,
In a preffered embodiment, this cell comprises:
at least two current input terminals;
a current summing circuit at every current input terminal where more than one input current arrives yielding a single input current at every current input terminal,
a circuit providing at least two alternate current paths for the input current associated with at least one of the input terminals, where the sign or magnitude of the input currents associated with these one or more input terminals determines the current path taken to conduct each of the input currents;
a current summing circuit at every current output where more than one current arrives yielding a single output current at every current output;

The current summing circuit can be made by using wires to connect together the output terminals providing these currents and further providing a wire to the input terminal for the current sum. In an embodiment, currents are added using a way to avoid a large capacitive load at the input of the folding cell. For instance, some currents can be added on one node, different from the node sensitive to the parasitics, and the result can be transferred to the sensitive node using a cascode transistor which does not represent a large capacitive load on this sensitive node.

In a preferred embodiment, the folding cell comprises:
two current input terminals and two current output terminals;
a current summing circuit at every current input terminal where more than one input current arrives yielding a single input current at every current input terminal, a first input current for the first current input terminal and a second input current for the second current input terminal, both input currents being time-varying and proportional to a signal to be folded;
a circuit providing two alternate current paths for the first input current, the sign of which determines the current path taken to conduct this first input current, and further providing two alternate current paths for the second input current, the sign of which determines the current path taken to conduct this second input current;
a current summing circuit to add the current from one of the current paths associated with the first current input to one of the current paths associated with the second current input, and including a means to provide the result of the addition to the first current output of the folding circuit cell;
a current sunning circuit to add the current from one of the current paths associated with the second current input to one of the current paths associated with the second current input, and including a means to provide the result of the addition to the second current output of the folding circuit cell;

In an embodiment, the first current input terminal a first input current is added to a first reference current provided by a first reference source, and at the second input a second input current is added to a second reference current provided by a second reference source. The reference currents can be generated as a sum of several reference currents.

In an embodiment, the folding cell includes at least one comparison means yielding a digital output. This digital output can for instance represent the sign of a current in the folding cell or whether a current in the folding cell is above or below a certain threshold, or whether one current is smaller or larger than another one in the current folding cell.

In an embodiment, for such folding cells with two current input terminals, the input current at the first input terminal can be made equal in magnitude and opposite in sign to the input current at the second input terminal. This provides an easy way to cascade these current folding circuit cells without any intermediate circuit to construct an analog-to-digital converter to produce a folded signal at the output with 2 to the power N segments where N is the number of stages in the cascade. Using this approach, if comparison means are included in the folding cells, a digital code with Gray-code properties is obtained with only one folding cell per bit in the cascade. The need for only one cell per bit yields a very small number of components resulting in a low power and low cost solution.

In an embodiment, these current folding circuit cells are used in an analog-to-digital converter. Preferably, these current folding circuit cells can be cascaded, wherein the output terminals of a preceding stage cell are connected to the inputs of a succeeding stage cell. Furthermore, the outputs of these folding cells can be combined by for instance adding them, before inputting them to a succeeding stage cell. This can be advantageous for instance to increase the operating speed of the analog-to-digital converter or to increase the size of the input signal of the succeeding cell.

In an embodiment, gain stages are inserted in-between consecutive stages of folding cells. This will provide an increase in conversion speed for the following stages for the same number of stages.

In an embodiment, these folding cells are used in combination with interpolating means, for instance in analog to digital converters to obtain a larger number of bits with the same number of folding cells.

In an embodiment, an analog-to-digital converter is constructed from a plurality of cascades of such current folding cells, where the inputs of the first cells of the different cascades have some relation with respect to one another. This relation can comprise a constant offset between the inputs of the different cascades, or an offset which is well defined between the zero transitions, but which varies with the input signals.

Due to the well-defined relationship between the output signals of these folders, they can be combined or mutually compared to provide signals which can be fed back to the circuitry providing the current inputs to these folders. Such feedback loops can be used to reduce or eliminate mismatch between components, to reduce or eliminate common mode components in input signals and/or to obtain negative dynamic resistance in some part of the range of input currents. This principle could be used also for voltage folding cells and for cascades of current or voltage folding cells, where one output or one intermediary output could be fed back to one input or to one intermediary input.

A sample-and-hold or track-and-hold circuit can be placed in front of such folding cells or cascade of folding cells, or in-between consecutive stages of folding cells to improve the conversion rate of the circuit.

Testing integrated circuits often forms an important factor in the overall cost of these circuits. The folding cell can be provided with one comparison means per current input terminal. In case there is a relationship between the currents at the different current input terminals, some degree of redundancy is created which can be beneficially used for testing. For example, the digital outputs of the comparison means in the folding cell can be mutually compared to detect anomalies in the operation of the current folding circuit cell.

Traditionally power and spatial constraints of the cell readout (multilevel sense amplifier) have limited the number of levels per cell in a memory to only a small number. The new current folding cell proposed here and the new analog-to-digital converter that can be constructed with it can provide a readout for a relatively large number of levels in a small circuit area, and this with a low power consumption. This makes this new cell and this new converter ideally suited for the readout of memories containing multilevel cells. The folding cells introduced here can also be used to construct multilevel memory cells themselves. The principle can also be used to construct a self-latching analog-to-digital converter.

The current folding cell introduced here can also be used in a mixer. By superimposing a time varying (like a square wave) signal onto the input signal and providing the result as an input to the current folding cell, a mixing function can be realized. This new mixer operates in current mode. Therefore the new current folding cells proposed here allow to implement a mixer-converter combination where no signal conversion (e.g. current-to-voltage) is required eliminating conversion errors, and where several biases could be shared yielding a smaller circuit area, lower power, and hence a reduced circuit cost.

In an embodiment, the capacitive loading at a node of a circuit which transfers the current or part thereof from one or more current inputs to one or more current outputs is minimized by means of a shield driven by a circuit following the ac component of this one node. Doing so can yield an increase in circuit speed.

In an embodiment, the capacitive loading at a node of a circuit which transfers the current or part thereof from one or more current inputs to one or more current outputs is compensated for by re-injecting a fraction or the totality of the capacitive current, or an approximation thereof, with the opposite sign into said node or another node of same current path. Doing so can yield an increase in circuit speed.

All current comparators are subject to a trade-off between speed, maximum current range, and minimum current resolution. It is another aspect of the invention that the maximum current range can be decoupled from the minimum current resolution; this provides a speed advantage as well. This decoupling can be achieved by first clipping the input current to limit its maximum range by means of a coarse comparison, and presenting the resulting signal of reduced range to a current comparator for fine comparison. The clipping should be carried out such that not only the signal of reduced range is made available by the clipping circuit, but also the remainder, i.e. the signal of a range too large to be accepted by the fine comparator. This signal of too large a range can then be added to the output current of the comparator carrying out the fine comparison. This way the same output current can be obtained as would be provided by a current comparator circuit with the same minimum current resolution but a larger input current range. The clipping and addition of the currents can be carried out without a current to voltage conversion and subsequent voltage to current conversion, and is therefore not subject to errors introduced by mismatch. If clipping and fine comparison are carried out as described above, the components in the fine comparator can be kept small with lower parasitics resulting in a faster circuit compared to a comparator with the same minimum current resolution and a larger input current range. The same principle can be used to construct folding cells with a larger input current range.

Prior art current sample-and-hold circuits or current track-and-hold circuits are constructed by injecting the current to be sampled or tracked into a component, for instance a transistor, which converts the current to a voltage which can be stored on a capacitor, and which transfers this current to a fixed potential, for instance ground, where it is lost for further use.

Therefore, an other aim of the invention is to provide a current sample-and-hold or track-and-hold circuit which can be constructed by injecting the current to be sampled or tracked into a component or circuit, for instance a transistor, which carries out the current to voltage conversion for storage but which transfers this input current to a terminal from which it can be recuperated for further use. This terminal can then serve to provide the output current of the sample-and-hold or track-and-hold circuit. Neglecting the transients required to charge or discharge the storage and parasitic capacitances, this output current is equal to the input current during the sample or track mode. During hold mode, this output current is equal to the value of the input current at the start of the hold mode. This provides the significant advantage that no errors are introduced due to mismatch, while a meaningful output current remains available during the sampling or tracking phase. Therefore both input and output current can be treated simultaneously over the full clock period, thus allowing more time and hence lower power for the same function, or a faster circuit for the same power. In addition, in case meaningful output currents are not required during the sampling or tracking phase of the clock cycle, the presence of an output terminal which reproduces the input current without being sensitive to mismatch and which is separate from the input terminal of the sample-and-hold or track-and-hold circuit allows to have more than one current output (i.e. two outputs) insensitive to mismatch for one current input, and also allows to cascade several current sample-and-hold and/or track-and-hold circuits during the sampling or tracking phase.

Parasitic charge injection by the switches in sample-and-hold and/or track-and-hold circuits is often an important source of performance degradation for these circuits, and significant effort has been made in the past to minimize this. Here we introduce a new switch which in one embodiment can be implemented by the current folding cells introduced in this invention and which minizes the charge injection.

In a preferred embodiment, the new current folding cell and the new analog-to-digital converter are used as level-detecting devices in large arrays of cells. They can provide multi-level detection at low power in a small area, and can act directly on a current signal. Current readout is ideally suited for large arrays of cells in general since the long readout busses which represent a large capacitive load do not need to be subject to a large voltage swing. This usually results in a speed and/or a power advantage. Examples of such large arrays of cells are imaging detectors like CMOS imagers, and semiconductor memories which can contain multilevel memory cells.

BRIEF DESCRIPTION OF THE DRAWINGS

The invention and its additional features, which may optionally be used to implement the invention to best advantage, will be apparent from and elucidated with reference to the embodiments described hereafter with reference to the accompanying drawings, wherein:

FIG. 19 shows the core of another embodiment of the current folding cell;

FIG. 20 shows the core of another embodiment of the current folding cell;

FIG. 21 shows the core of another embodiment of the current folding cell;

FIG. 22 shows the core of another embodiment of the current folding cell;

FIG. 23 shows a possible way of how the proper bias can be provided for the core of the current folding cell shown in FIG. 19;

DESCRIPTION OF THE PREFERRED EMBODIMENTS

Figure 1:
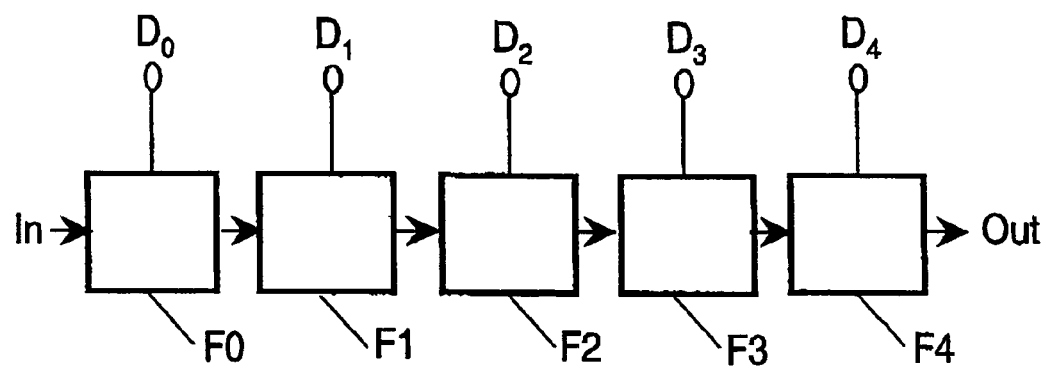
FIG. 1 shows, in block diagram form, how a prior art serial analog-to-digital converter is constructed from a cascade of folding circuit cells. In the figure the cascade comprises 5 folding circuit cells F0 . . . F4.
Figure 2A:
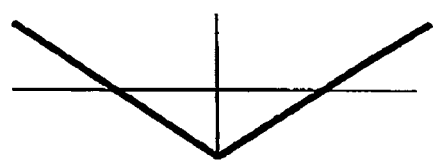
FIG. 2a to 2e refer to FIG. 1 and show the signal shape of the output of folding circuit cell F0 to F4, respectively, as a function of the input signal of the prior art converter shown in FIG. 1.
Figure 2B:
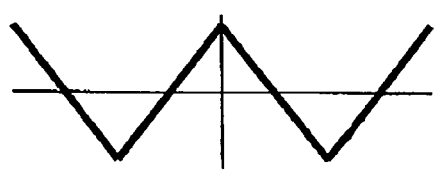
Figure 2C:
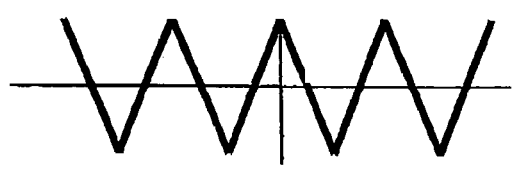
Figure 2D:
Figure 2E:
Figure 2X:
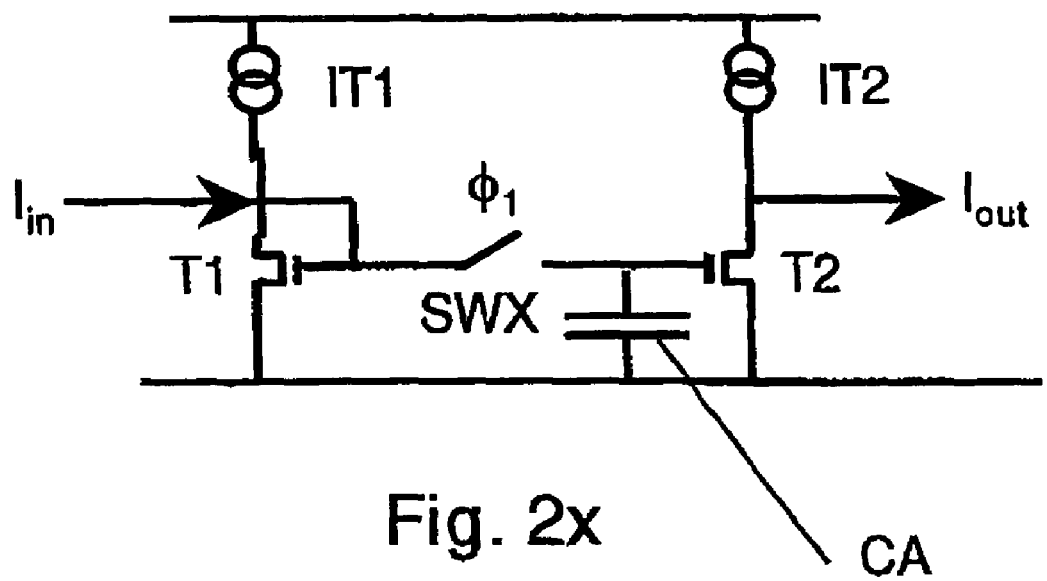
FIG. 2x shows a prior-art first generation current sample-and-hold or track-and-hold circuit; one transistor T1 is used to sample or track the input signal, and to convert it to a voltage which can be stored on a capacitor CA, the other transistor T2 provides the current output.
Figure 2Y:
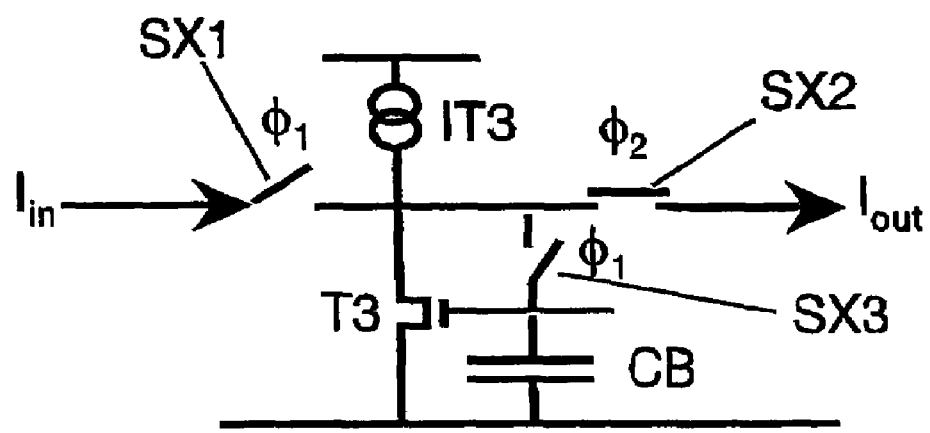
FIG. 2y shows a prior-art second generation current sample-and-hold or track-and-hold circuit; here the same transistor T3 is used to receive the input signal and to provide the output signal, but both actions cannot be performed simultaneously in time.
Figure 3:
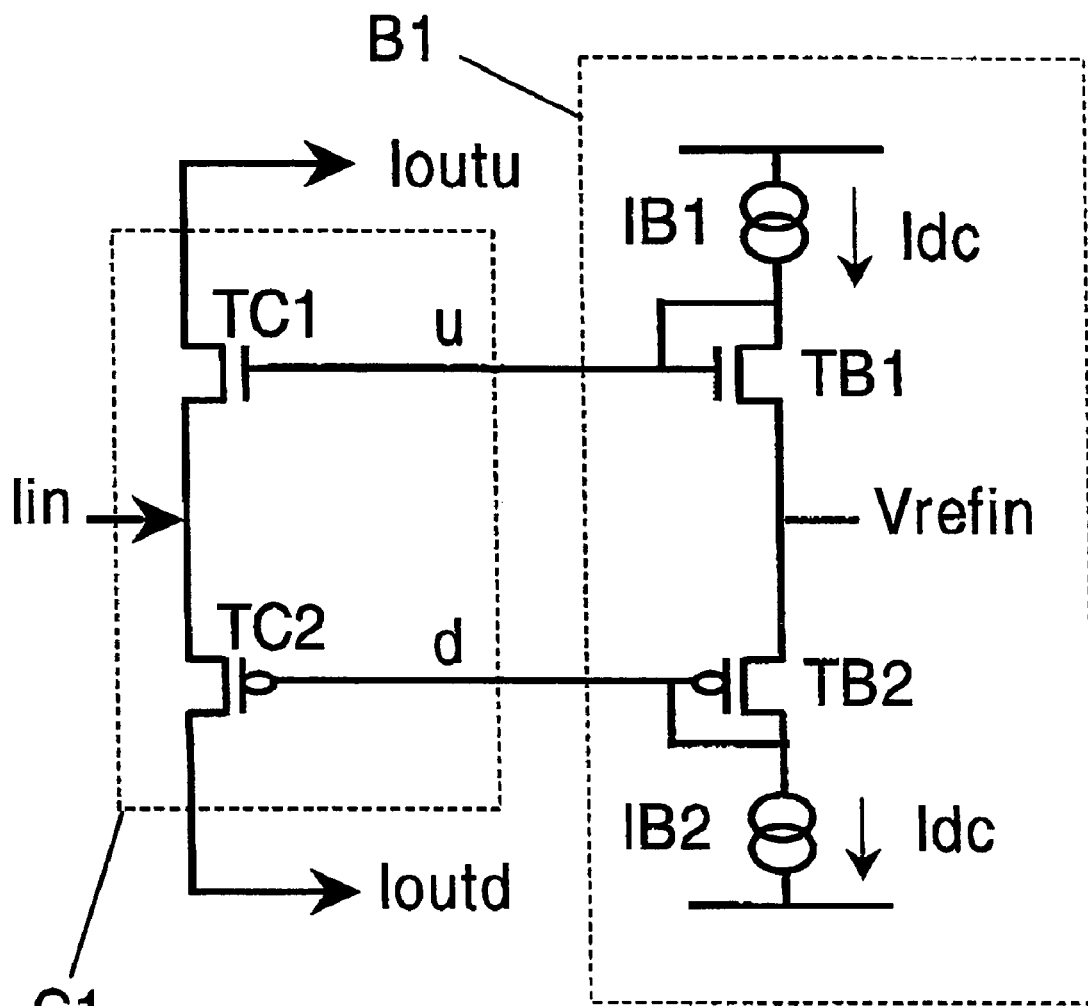
FIG. 3 shows an embodiment C1 of one half of the current folding cell and a possible schematic B1 to bias the circuit C1.
Figure 4:
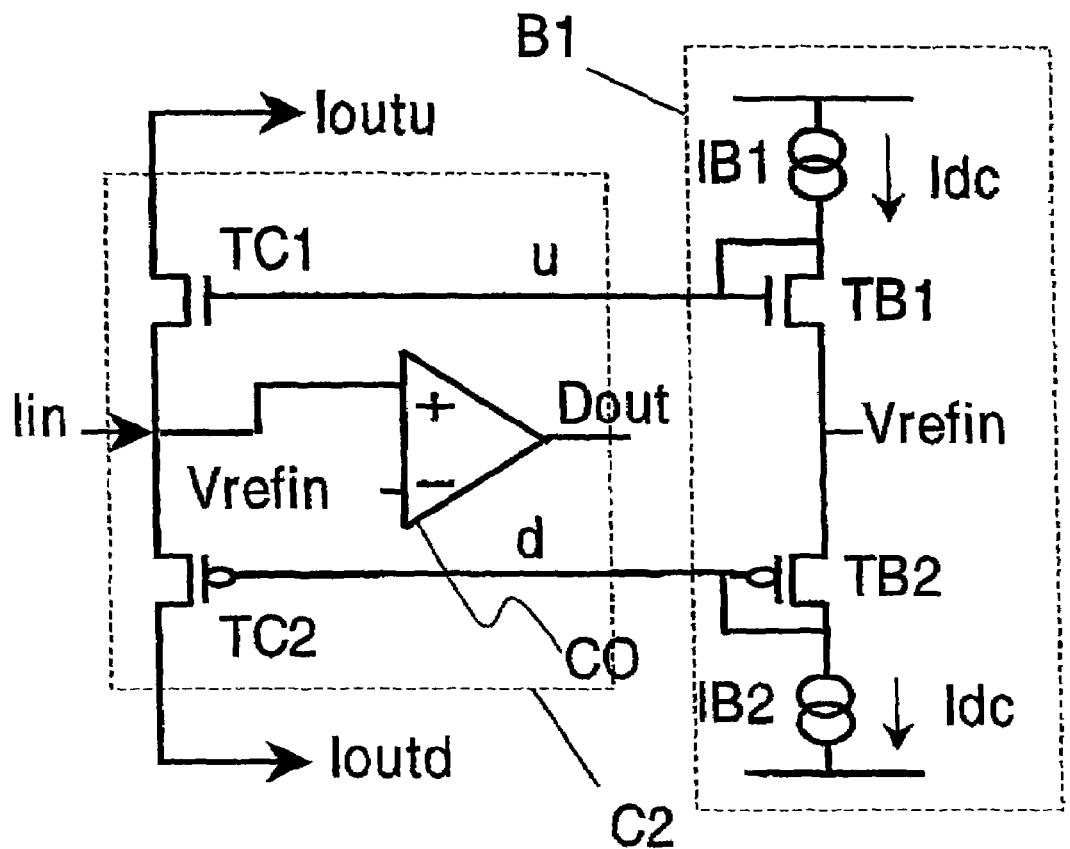
FIG. 4 shows an embodiment C2 of one half of a current folding cell including a comparison means to determine the sign of the sum of the currents at the input, and a possible schematic B1 to bias the circuit C2.
Figure 5:
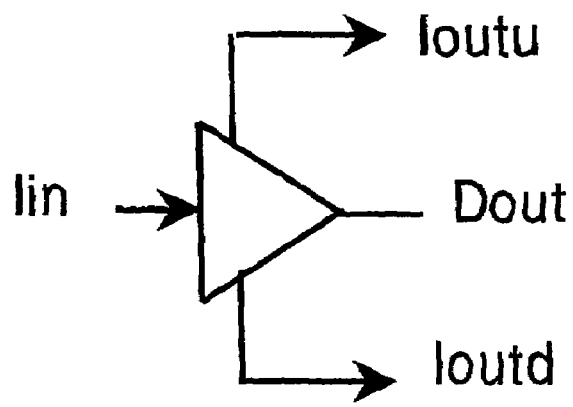
FIG. 5 shows a block diagram representation of the circuit C2 of FIG. 4.
Figure 6A:
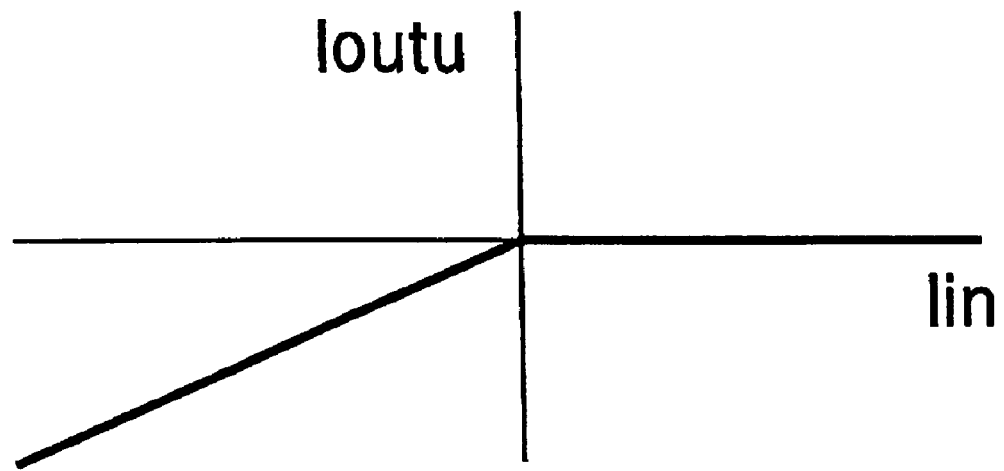
FIGS. 6a and 6b show the output currents $I_{out}u$ and $I_{out}d$ of the circuit C1 of FIG. 3, and of the circuit C2 of FIG. 4 as a function of the input current. The sign of the current is positive if it flows in the direction of the arrow.
Figure 6B:
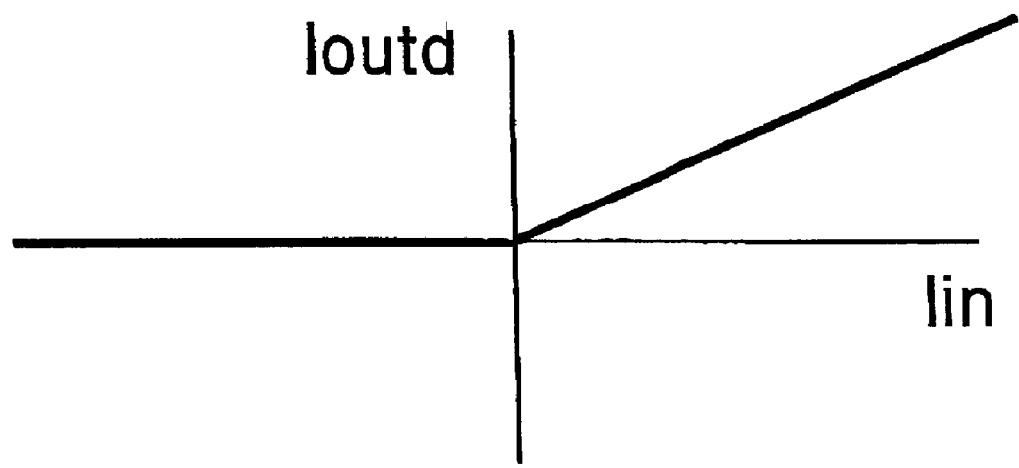

FIG. 3 shows a prior art circuit C1 which provides two alternate current paths for the input current, and a possible schematic B1 to bias the circuit C1. In the circuit B1 the transistors TB1 and TB2 are forced to conduct a current Idc generated for TB1 by current source IB1 and for TB2 by current source IB2. The sources of TB1 and TB2 are forced to a potential Vrefin delivered by a reference source. This setup generates voltages for nodes u and d such that for a zero input current $I_{in}$ the transistors TC1 and TC2 conduct a current approximately equal to Idc while the potential at the input of C1 is approximately equal to Vrefin. A positive current $I_{in}$ injected into the input of C1 will cause the voltage of the input to rise above $V_{refin}$. A negative current $I_{in}$ injected into the input will cause the input voltage to fall below $V_{refin}$. An input current significantly larger than Idc will be absorbed by only one of the two transistors TC1 and TC2 in the circuit C1, the sign of the input current determining by which of the two transistors it will be absorbed. The voltage swing of the input of the circuit C1 will be sufficiently large to be detected by a voltage comparison circuit. FIG. 4 shows the circuit C2 which comprises a circuit C1 and a voltage comparator CO providing a digital output Dout. Biasing is again provided by a circuit B1. FIG. 5 shows a block diagram view of the circuit C2. The sign of all currents is positive if the direction of the current flow is in the direction of the arrow. FIGS. 6a and 6b show the output currents $I_{out}u$ and $I_{out}d$ of the circuit C1, identical for the circuit C2, as a function of the input current, for a bias current Idc sufficiently small compared to the range of the input current to only have one transistor conduct at a given time. The figure confirms that only one of the two current branches conducts at a given time. For a larger Idc the corners in the $I_{out}u$ and $I_{out}d$ signals will be more rounded, current will flow through both transistors at the same time even for a zero input current, and a small non-zero input current will be divided over both current paths.

Figure 7:
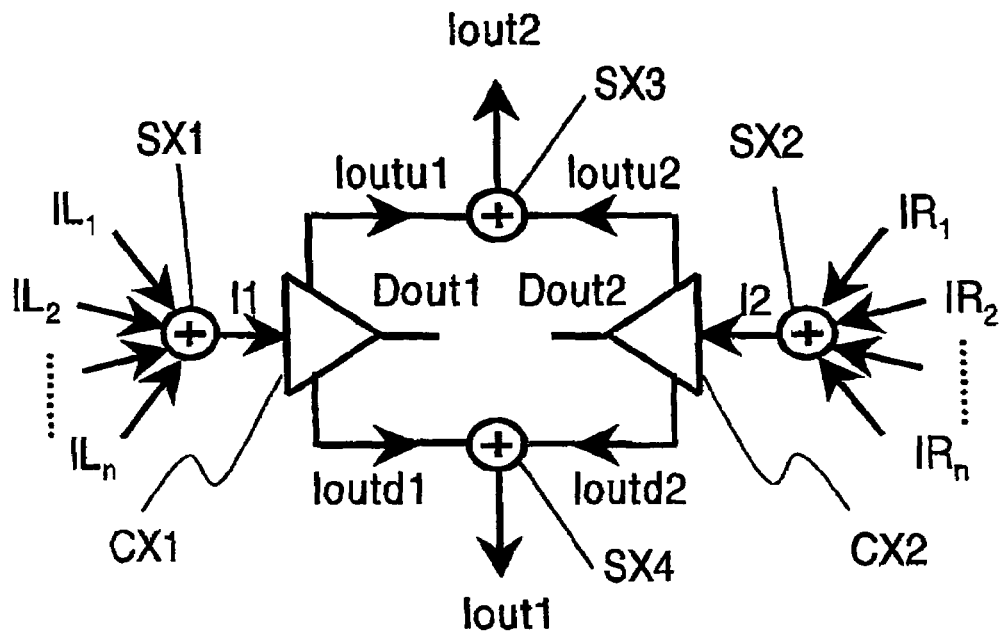
FIG. 7 shows an implementation example of the novel folding circuit cell comprising two circuits C2 from FIG. 5.

In the prior art (U.S. Pat. No. 4,179,687) the drain of one of the current absorbing transistors was connected to a current sink, and Idc was kept sufficiently small to have only one of the two transistors conduct current at the same time. Here we would like to combine two circuits C1 or C2 and both their current outputs in a special way to provide a circuit with two inputs and two outputs. FIG. 7 shows an implementation example of the novel folding circuit cell comprising two circuits CX1 and CX2 of the type C2 shown in FIG. 4, and a means SX1 to add several currents IL1 . . . ILn at the first current input, and a means SX2 to add several currents IR1 . . . IRn at the second current input, and means SX4 to add the first output of CX1 and CX2, and means SX3 to add the second output of CX1 and CX2. Adding currents is easy, and can be done in principle by connecting the wires that conduct the different currents IL1 . . . ILn and connecting them to the wire which has to conduct the current I1. The addition of the currents IR1 . . . IRn can be done in a similar way to yield the current I2.

In practice, currents might be added using a more complicated way to avoid a large capacitive load at the input. For instance, some currents can be added on one node, different from the node sensitive to the parasitics, and the result can be transferred to the sensitive node using a cascode transistor which does not represent a large capacitive load on this sensitive node.

Figure 8:
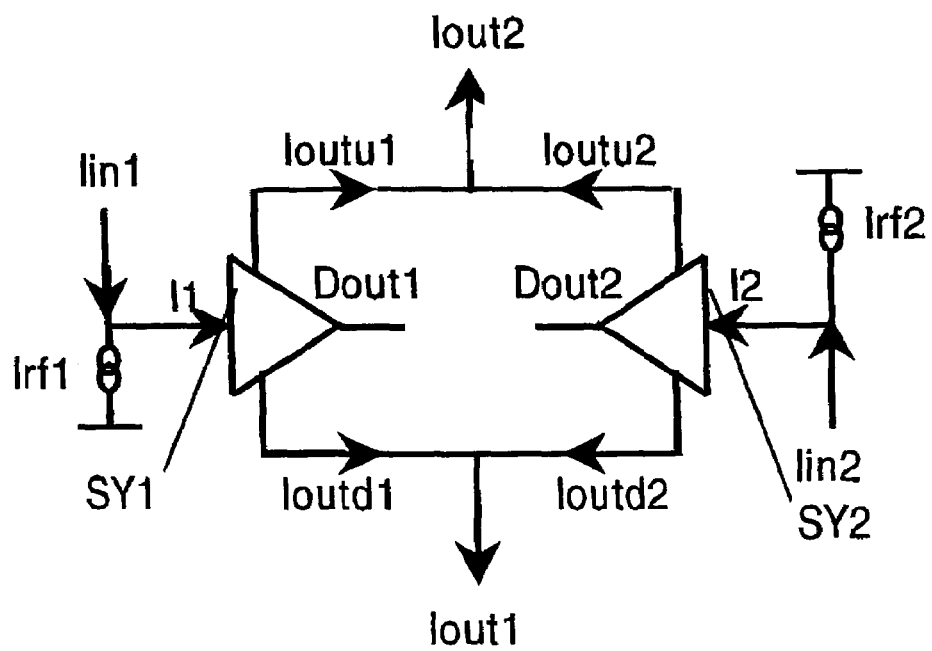
FIG. 8 shows an implementation example of the novel folding circuit cell comprising two circuits C2 from FIG. 4, where at each current input a signal current and a reference current are summed.
Figure 9:
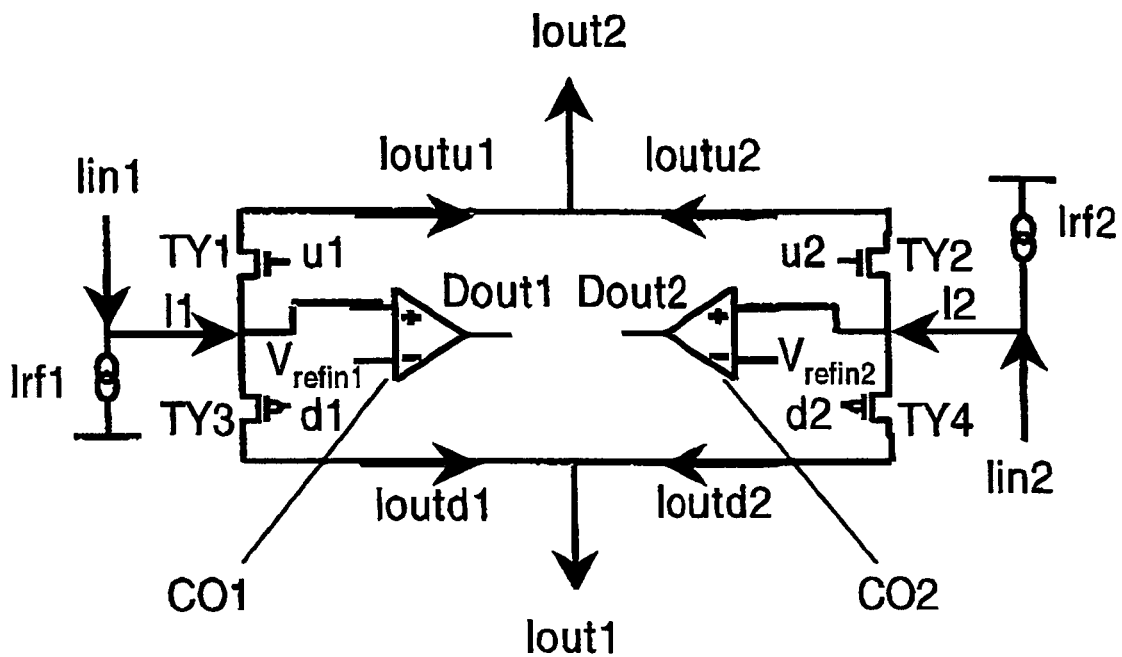
FIG. 9 shows the circuit of FIG. 8 in more detail.
Figure 10:
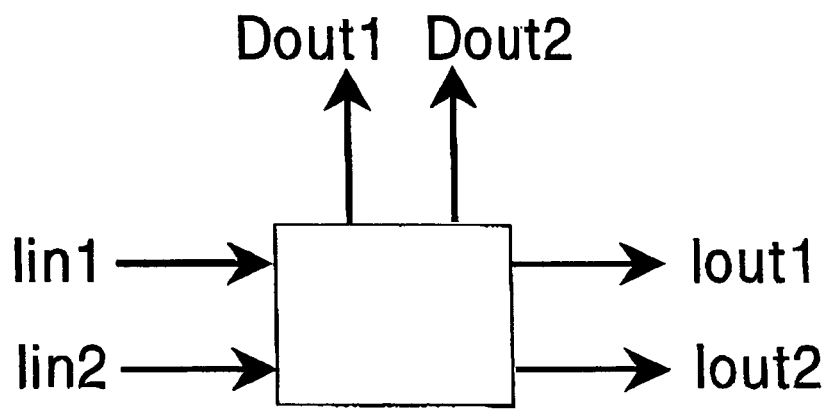
FIG. 10 shows a block diagram view of the novel folding circuit cell of FIG. 8.

FIG. 8 shows an embodiment for the folding circuit cell of FIG. 7, where the currents are added by simply connecting the wires, and where apart from the time-varying input currents Iin1 and Iin2 a reference current Iref is applied to each of both input terminals by means of the current sources Irf1 and Irf2. FIG. 9 shows the same circuit in more detail, i.e. with the four transistors TY1 . . . TY4 in the core of the current folding cell, and the comparators CO1 and CO2. FIG. 10 shows a block diagram form of this new current folding cell. Note that $V_{refin}1$ and $V_{refin}2$ can be different, which would cause the gate biases u1 and u2 to differ and the gate biases d1 and d2 to differ. As explained below this can be required for proper operation of the circuit when this cell is cascaded.

Figure 11:
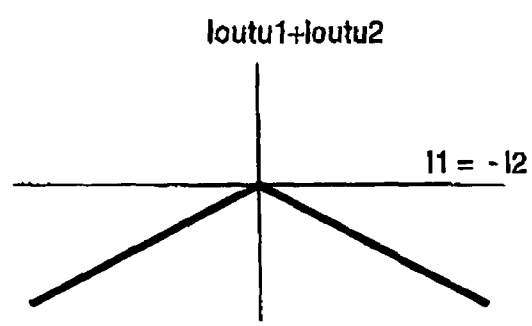
FIG. 11 shows, for the folding circuit cell of FIG. 8, the sum of the current outputs $I_{out}u1$ and $I_{out}u2$ as a function of the input current I1 in the folding circuit cell, and this for the case where I1 is equal to I2, but opposite in sign. The resulting current is the current output $I_{out}2$ of the folding circuit cell.
Figure 12:
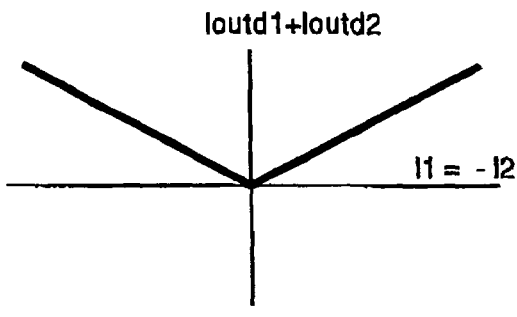
FIG. 12 shows, for the folding circuit cell of FIG. 8, the sum of the current outputs $I_{out}d1$ and $I_{out}d2$ as a function of the input current I1 in the folding circuit cell, and this for the case where I1 is equal to I2, but opposite in sign. The resulting current is the current output $I_{out}1$ of the folding circuit cell.
Figure 13:
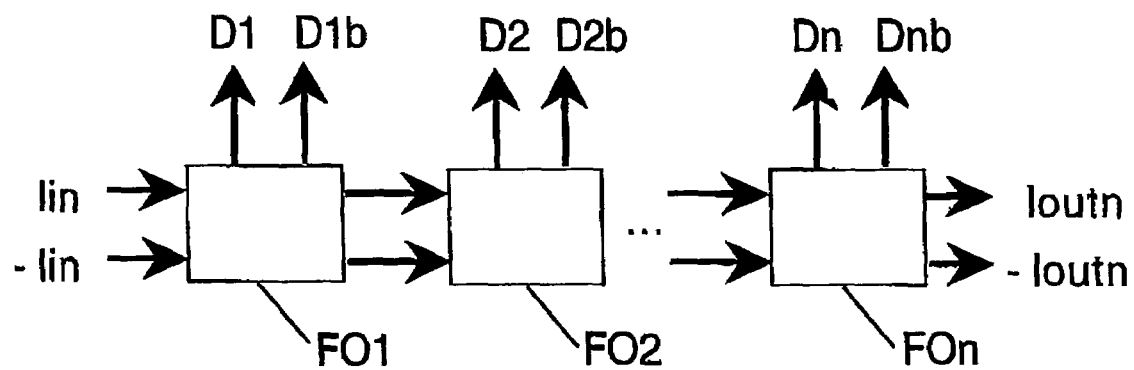
FIG. 13 shows, in block diagram form, how a novel serial analog-to-digital converter is constructed from a cascade of novel current folding circuit cells. In the figure, the cascade comprises n cells.
Figure 14:
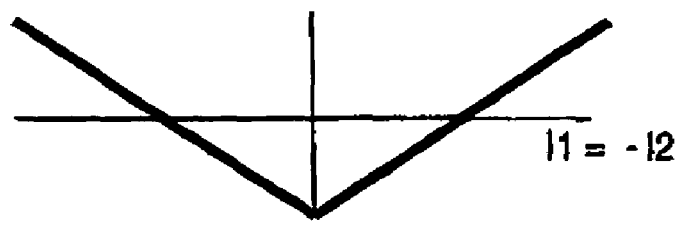
FIG. 14 shows the current I1 of the second folding circuit cell in the cascade of FIG. 12 as a function of the input current I1 in the first cell, for the case where I1 in the first cell is equal to I2 in the first cell, but opposite in sign.
Figure 15:
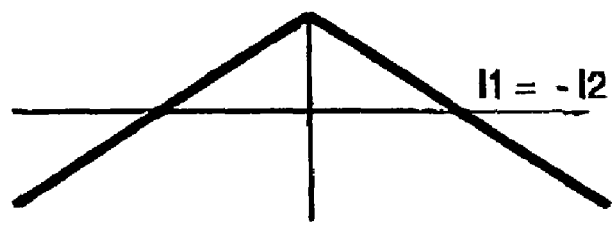
FIG. 15 shows the current I2 of the second folding circuit cell in the cascade of FIG. 12 as a function of the input current I1 in the first cell, for the case where I1 in the first cell is equal to I2 in the first cell, but opposite in sign.
Figure 16:
FIG. 16 shows the current I1 of the third folding circuit cell in the cascade of FIG. 12 as a function of the input current I1 in the first cell, for the case where I1 is equal to I2, but opposite in sign for the first two cells.
Figure 17:
FIG. 17 shows the current I2 of the third folding circuit cell in the cascade of FIG. 12 as a function of the input current I1 in the first cell, for the case where I1 is equal to I2, but opposite in sign for the first two cells.

FIG. 11 shows for the current folding cell of FIG. 8 the sum of the first output current $I_{out}u1$ of CX1 and of the first output current $I_{out}u2$ of CX2 as a function of I1 in the folding circuit cell, and this for the case where I1 is equal to I2, but opposite in sign. The resulting current is the output current $I_{out}2$ of the folding circuit cell. FIG. 12 shows for the folding circuit cell of FIG. 8, the sum of the second output current $I_{out}d1$ of CX1 and of the second current $I_{out}d2$ of CX2 as a function of I1 in the folding circuit cell, and this for the case where I1 is equal to I2, but opposite in sign. The resulting current is the output current $I_{out}1$ of the folding circuit cell. Comparison of FIG. 11 and FIG. 12 shows that for the case where I1 is equal to I2, $I_{out}1$ and $I_{out}2$ are equal in magnitude but opposite in sign. This can be used advantageously when a cascade of such folding cells is used, as shown in FIG. 13. In the figure it is shown how the cascade of current folding cells FO1 . . . FOn is formed by connecting the first output of a preceding stage to the first input of a succeeding cell in the cascade, and by connecting the second output of a preceding cell to the second input of a succeeding cell in the cascade, and this without any intermediate circuitry. In the figure the digital outputs D1 and D1b correspond to FO1, D2 and D2b to FO2, etc . . . In such a cascade of current folding cells it is easy to maintain the condition that I1 is equal to I2, but opposite in sign also for the next cell, and therefore for all cells. To satisfy this the reference currents shown in FIG. 8 need to be equal in magnitude and opposite in sign for the next cell in the cascade. If in addition the magnitude is chosen at half the input range, I1 and I2 of the next cell in the cascade are not only equal in magnitude and opposite in sign, but the zero transition, which corresponds to the point where that next cell will fold the input signal, is centered over the full range. This is illustrated by FIG. 14 and FIG. 15 showing I1 and I2 for the next cell in the cascade. The same can be done for the third cell in the cascade to obtain I1 and I2 in that cell shown in FIGS. 16 and 17. Note that the range of the time-varying signal is halved after every stage in the cascade.

This procedure can be repeated for more cells, and one obtains $2^N$ segments for N current folding circuit cells in the cascade. The comparator outputs of the current folding cells in the cascade will provide the bits determining the value of the input current, the first stage will provide the most significant bit, and the succeeding stages the succeeding less significant bits.

Figure 18:
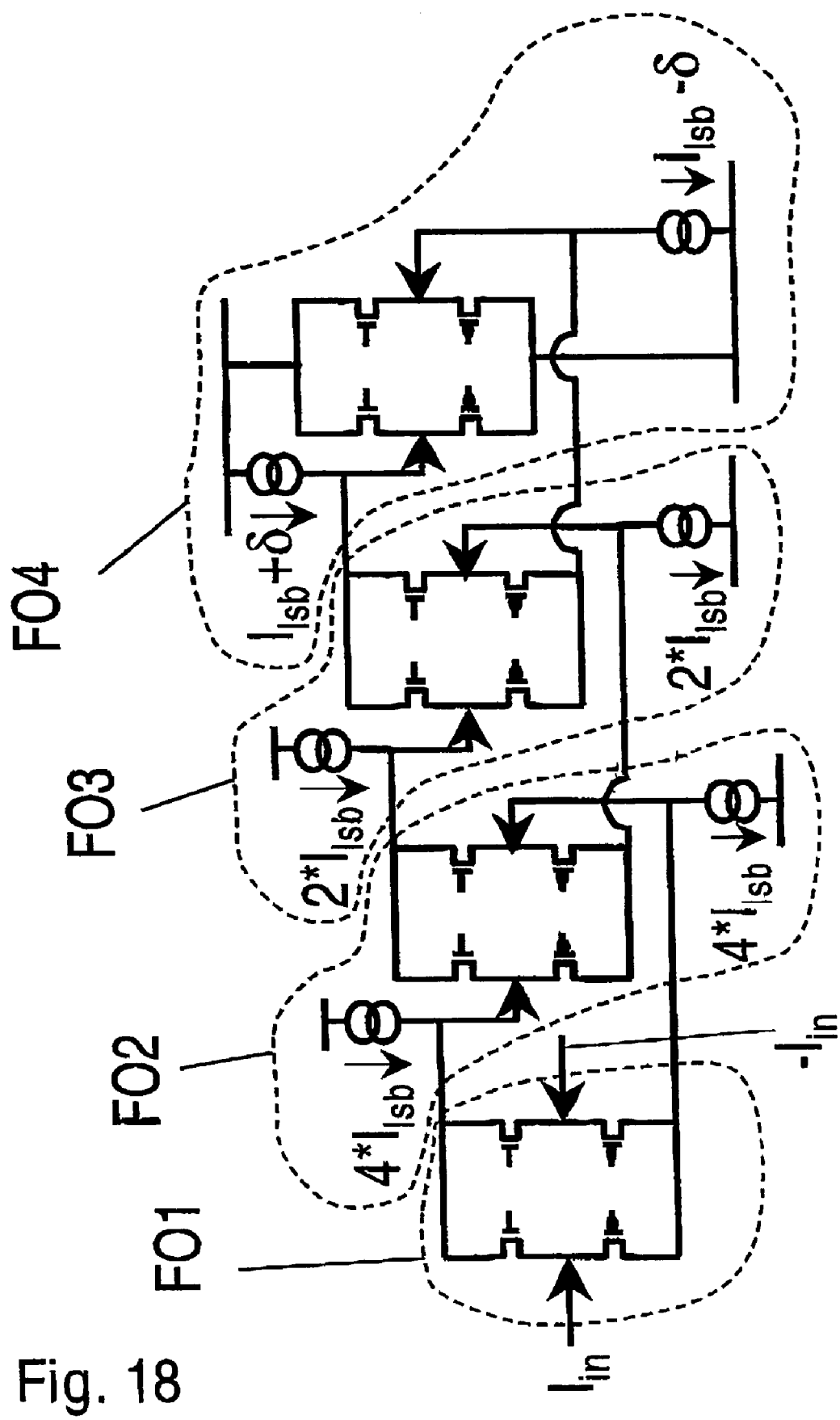
FIG. 18 shows in more detail how a cascade of current folding cells FO1 . . . FO4 of FIG. 8 can be constructed for use in an analog-to-digital converter.

FIG. 18 shows an embodiment of a cascade of four current folding circuit cells FO1 . . . FO4 in more detail. Such a cascade would be used to construct a four bit analog-to-digital converter. In this figure the comparators are omitted for simplicity. The range for the input current is $[-2^{3*}I_{lsb}, +2^{3*}I_{lsb}]$. First consider the case where δ in the figure is equal to zero. The first stage FO1 which receives $I_{in}$ and $-I_{in}$ at its inputs will determine the sign of the input currents $I_{in}$ and $-I_{in}$ and does not add any reference current to the input currents at the input. The sign of the two input currents corresponds to the most significant bit and its complement. The first stage FO1 provides its output currents (plotted in FIGS. 11 and 12) to the inputs of the next stage FO2 which adds $4*I_{lsb}$ with the correct sign to these currents and then determines the sign of the two sums. The sign of these current sums corresponds to the second most significant bit and its complement. The output currents of the second stage FO2 are provided to the next stage FO3, which adds $2*I_{lsb}$ with the correct sign to these input currents and then determines the sign of the two current sums. The sign of these two currents corresponds to the third most significant bit and its complement. The last stage FO4 finally receives the two output currents of the previous stage FO3 at its inputs and then adds Ilsb (consider δ to be zero first) with the correct sign to each of those currents and determines the sign of these currents to determine the least significant bit.

For the circuit to operate correctly, the reference voltages for the different stages cannot be equal as that would lead to simultaneous conduction of elements which are not supposed to conduct at the same time. For instance, for the maximum positive input current, the output node $I_{out}2$ will be pulled down by the current $-I_{in}$ at the right input of the first cell in the cascade. The left input node of this first stage will be pulled up by the current $I_{in}$. All this will result in a forward biasing of the NMOS transistor at the upper left of the first stage, while it was intended to be in cut-off for this particular input. This problem is solved by sufficiently increasing the reference voltage ($V_{refin}$ in FIG. 3 or 4) from stage to stage for the left input of the current folding cells, and decreasing the reference voltage from stage to stage for the right input of the current folding cells. This is an example where the reference voltages for the left and the right input of one stage have to be chosen to be different.

Provided this condition is satisfied, the circuit operates as described above: the input currents $I_{in}$ and $-I_{in}$ are trans- formed into folded signals with two segments after the first stage, four segments after the second stage, eight segments after the third stage, and sixteen segments after the fourth stage. If δ equals zero, the distance between subsequent folding points of the folded signal is 1 $I_{lsb}$, the first folding point occurring for $I_{in}$ equal to $-7I_{lsb}$ and the last one for $I_{in}$ equal to $+7I_{lsb}$. If comparators are included to detect which of the current paths was taken by $I_{in}$ and its complement, a digital Gray code is produced corresponding to the input current $I_{in}$.

It is beneficial to choose δ different from zero to provide two folding points for the output signals of the last stage at different locations within the $2*I_{lsb}$ input range for that stage. This provides additional information on where within this interval the value of the input signal is located, and can also serve to eliminate sensitivity to errors caused by metastability or slow switching of the folding cell. This is an example of the utility of a folding cell where I1 and I2 of FIG. 7 are not equal in magnitude and opposite in sign.

For a large number of stages in the cascade it might be that the power supply voltage is not sufficiently high to allow the necessary spacing in reference voltages for the consecutive stages without any intermediate circuitry. In that case a folded cascode stage can be inserted in between two particular stages in the cascade wherever necessary. FIG. 23 gives an example of such folded cascode stages for the case that the core of the current folding cell does not consist of four transistors, but of four two-terminal non-linear elements Dx1 . . . Dx4 like diodes. Usually one will choose to use a folded cascode stage both in between the first output of the previous stage and the first input of the succeeding stage, and in-between the second output of the previous stage and the second input of the succeeding stage. In principle one could only insert the folded cascode stage for one of the two signal paths in between two particular stages, and insert a folded cascode stage for the other signal path in between two other stages if necessary.

FIGS. 19 through 22 show other examples of embodiments of the core of the new current folding cell. Note that biasing means for these cores are not shown in the figures. All of the cores consist of four circuit elements, each of which provides a signal In case a reference current has to be added at the input of the next cell, it can be included in the biasing current of the cascodes. This way that current which normally has to flow anyway serves to increase the bandwidth of the cascade. This shows an example of the utility of choosing Il and Ir in FIG. 23 different from zero.

Figure 24:
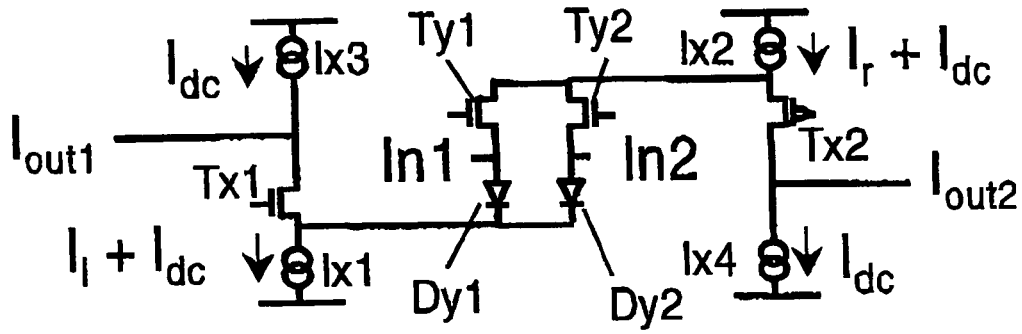
FIG. 24 shows a possible way of how the proper bias can be provided for the core of the current folding cell shown in FIG. 20.
Figure 25:
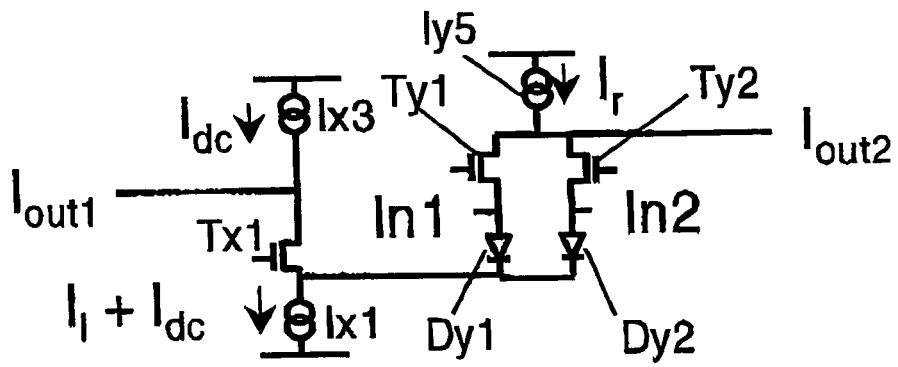
FIG. 25 shows an alternative way to apply the proper bias to the core of the current folding cell shown in FIG. 20.

The same cascode stages can also be used to provide the bias for the core cells of FIGS. 20 through 22. FIG. 24 illustrates this for the core of the current folding cell shown in FIG. 20. However, the gate bias of the two transistors in the core provides already one terminal to control the operating point of the core. Therefore only one cascode stage with well-defined gate and current bias is necessary to control the operating point of the current folding cell and its internal current for an input equal to zero. In this particular case the cascode stage formed by Tx1, Ix1 and Ix3 is sufficient, and the cascode stage formed by Tx2, Ix2 and Ix4 can be omitted. This is illustrated in FIG. 25.

Figure 26:
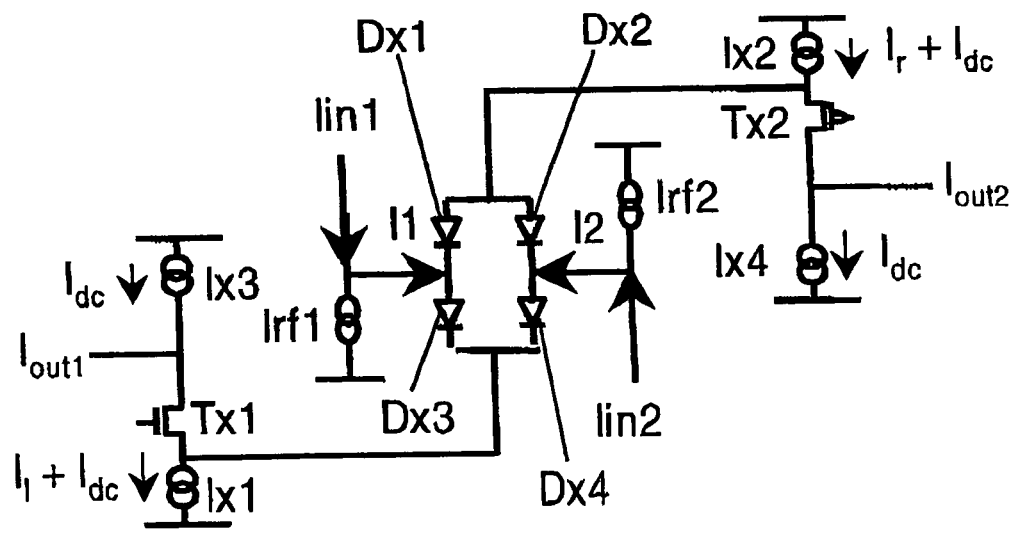
FIG. 26 shows an embodiment of the current folding cell based on the core shown in FIG. 19, where at each of the two inputs of the current folding cell the input current is added to a reference current, and where the means for proper biasing of the core is provided.

FIG. 26 details the complete current folding cell of FIG. 8 for the core of FIG. 19.

The cores of the current folding cell shown in FIGS. 19 through 22 are given as an example only. It should be obvious that one could choose combinations of three transistors and one two-terminal non-linear element as well. In general non-linearity is needed to change the current path for the input current for different values of this input current. This non-linearity can be provided by transistors which have more than two controlling terminals, or by two-terminal non-linear elements. The required non-linearity could also be provided by a full circuit which would replace one or more single component elements. This circuit would then provide a current path corresponding to the current path of each of the elements the circuit is replacing. Such a circuit could contain cascodes, or amplifiers, configured for instance in a feedback loop to increase the output impedance of those cascodes.

The cores in FIGS. 19 through 22 are examples with two current inputs. Cores for a larger number of inputs can be constructed in a similar way. As an example one could construct a four input core by linking the output terminals of two cores of FIG. 19 together each core providing two input terminals. There would be one output terminal connected to Dx1 and Dx2 of both cores, and another output terminal connected to Dx3 and Dx4 of both cores. The result is a core of a folding cell with four inputs and two outputs.

Figure 27:
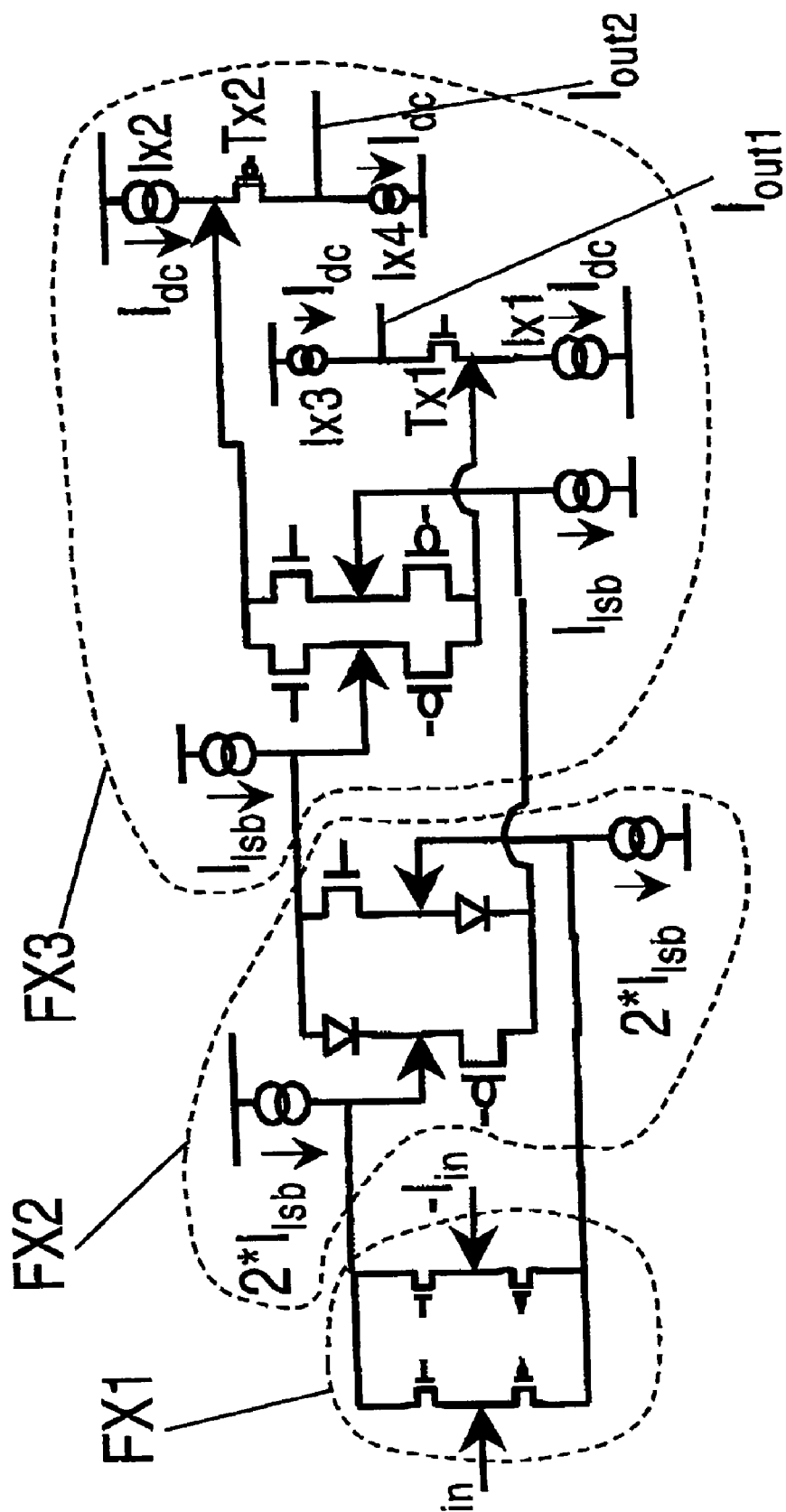
FIG. 27 illustrates how the means for proper biasing of the core of a previous current folding cell can be provided by the succeeding current folding cell in a cascade of current folding cells.

The cascodes are not necessary if the next cell allows to well define the potential of its input node. FIG. 27 shows a cascade of three folding cells FX1 . . . FX3. The bias of current absorbing transistors Ty1 . . . Ty4 in the folding cell FX3 can be provided using for instance one or more circuits of the type B1 in FIG. 3 and this allows to well define the potential at the inputs of FX3 to obtain the proper bias for the preceding folding cell FX2.

Figure 28:
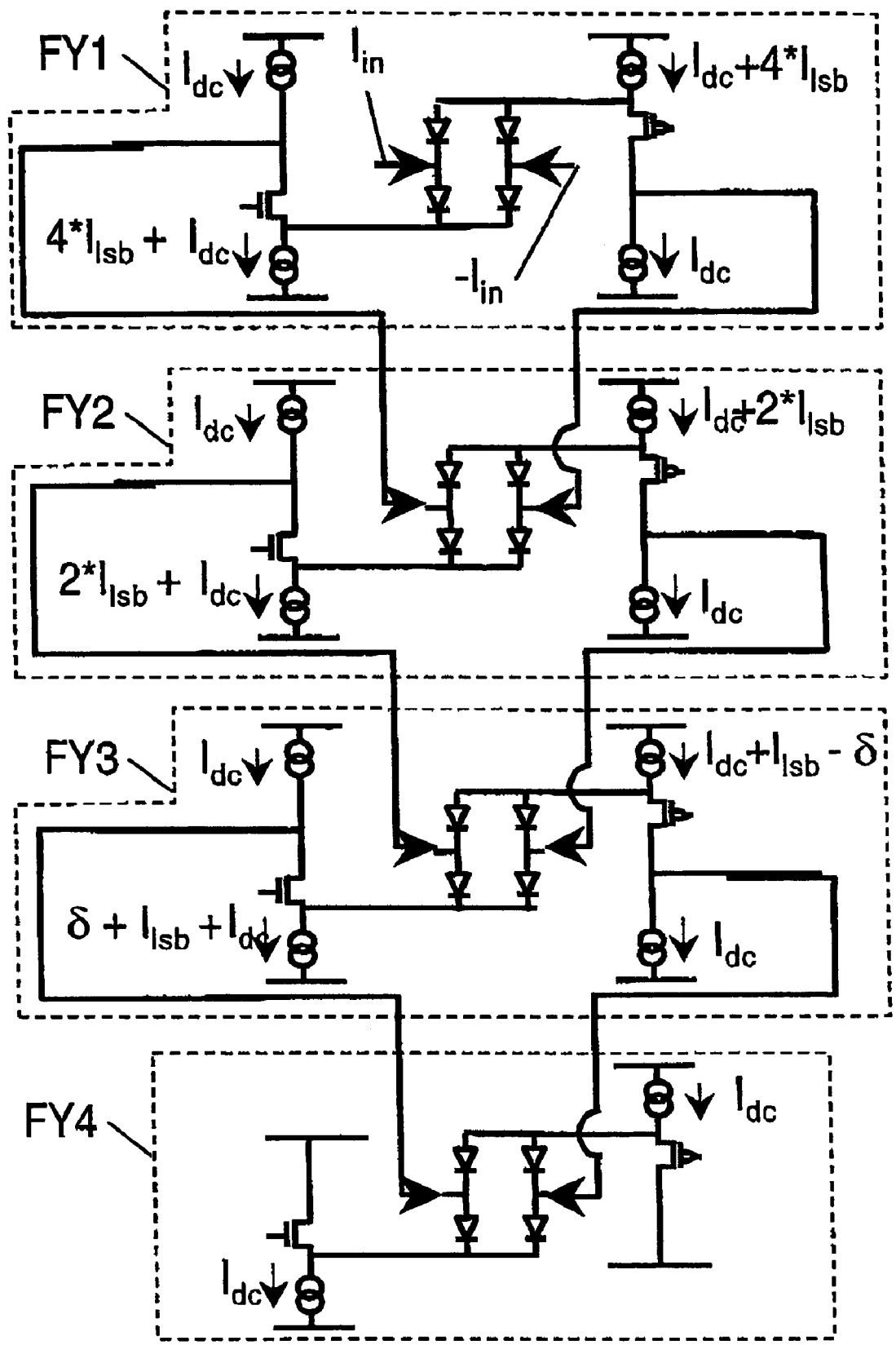
FIG. 28 shows in more detail how a cascade of current folding cells containing the core of FIG. 19 can be constructed for use in an analog-to-digital converter.

FIG. 28 shows an embodiment of how folding cells FY1 . . . FY4 containing the core of FIG. 19 can be cascaded to construct an analog-to-digital converter. Also here the comparators for determining which current path is taken by the input currents are omitted for simplicity. In the example, the reference currents needed at the input of each stage are provided using the cascodes which bias the previous stage by setting the Il and Ir in FIG. 23 equal to the reference required by the next stage. This way, the current folding cell of FIG. 26 reduces to the circuit of FIG. 23 in this cascade.

Figure 29:
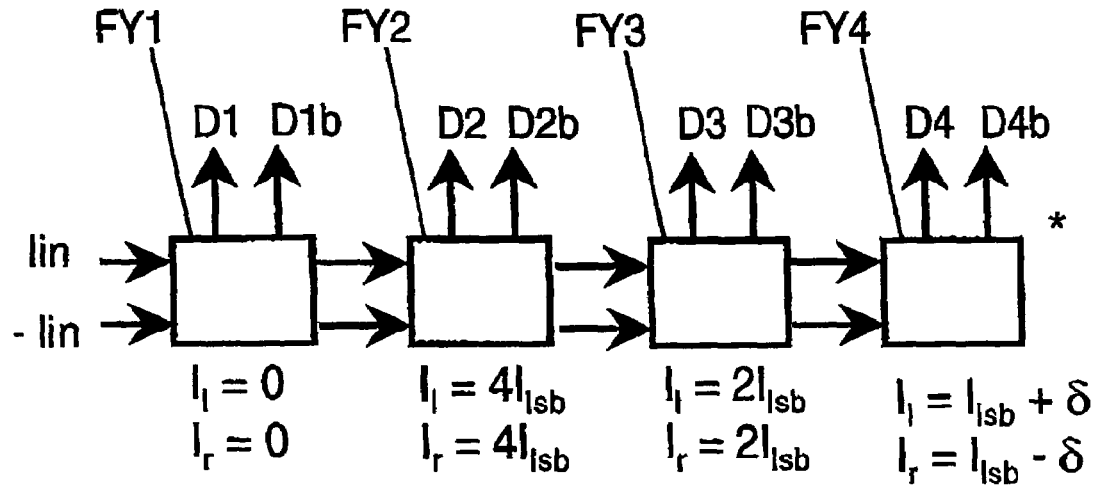
FIG. 29 gives a block diagram representation of the circuit in FIG. 28.

The operation is analogous to the example with transistors only. The folded cascode stages allow to use the same reference for the inputs of all stages. One can also change the input current of the last stage with a δ to obtain a similar advantage as explained for the previous case. The output currents of the last stage are fed straight into the supplies, but could be fed into another type of current sink. FIG. 29 shows a block diagram representation of the circuit of FIG. 28. Note that the magnitude of the reference currents belonging to a certain stage are annotated next to that stage, although the folded cascodes biasing the previous stage are providing this current. The asterisk on the last cell denotes that here the currents are fed straight into a current sink or power supply.

Figure 30:
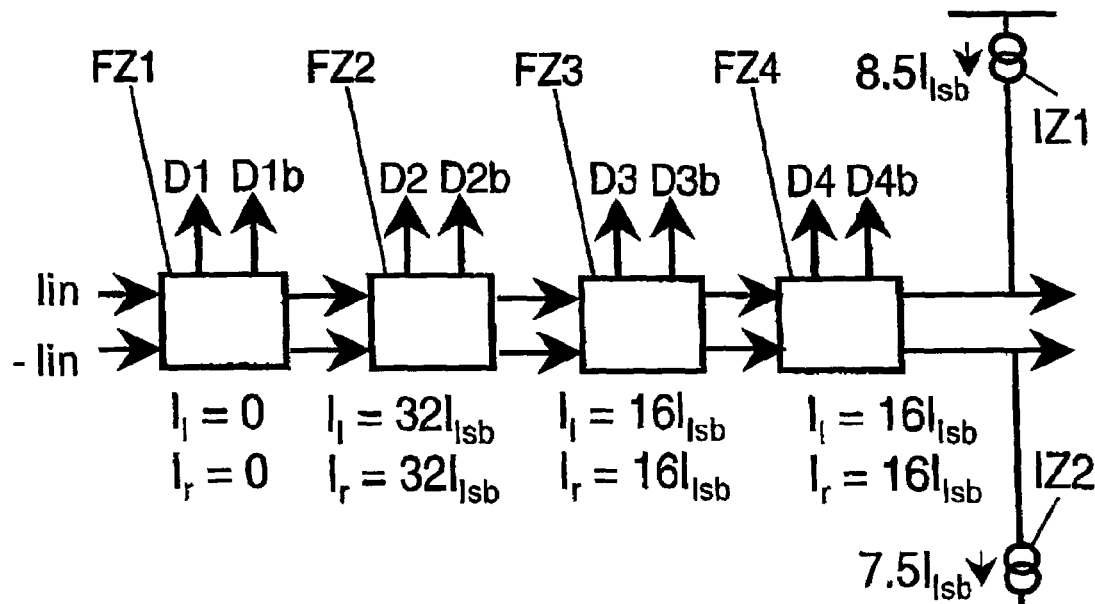
FIG. 30 gives a block diagram representation of another cascade of folding circuit cells.
Figure 31:
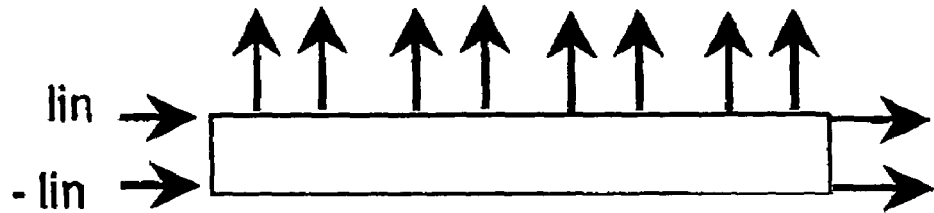
FIG. 31 gives a block diagram representation of the cascade of folding circuit cells of FIG. 30.
Figure 32:
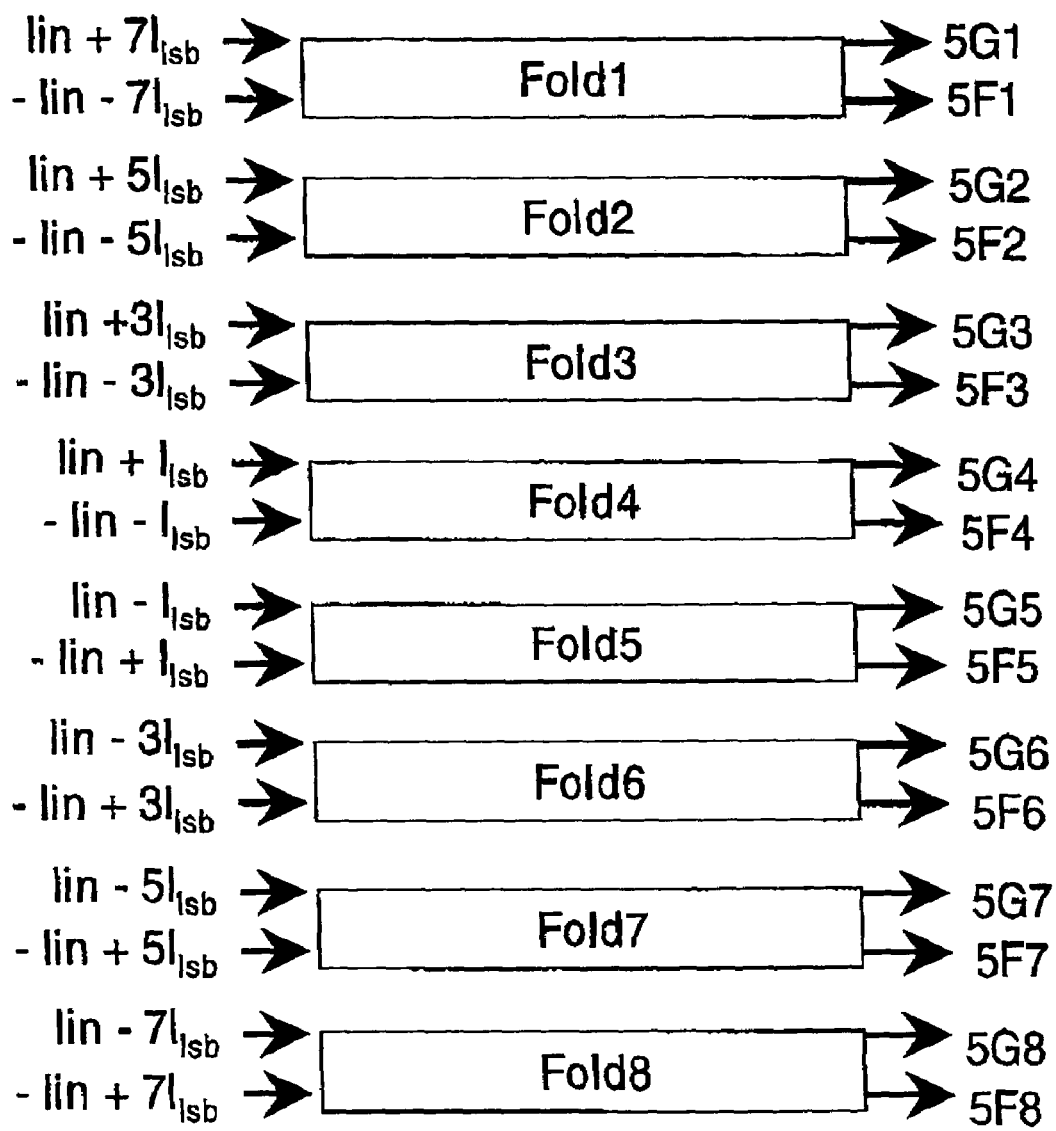
FIG. 32 illustrates how several cascades of folding circuit cells can be put in parallel for the construction of an analog-to-digital converter.
Figure 33:
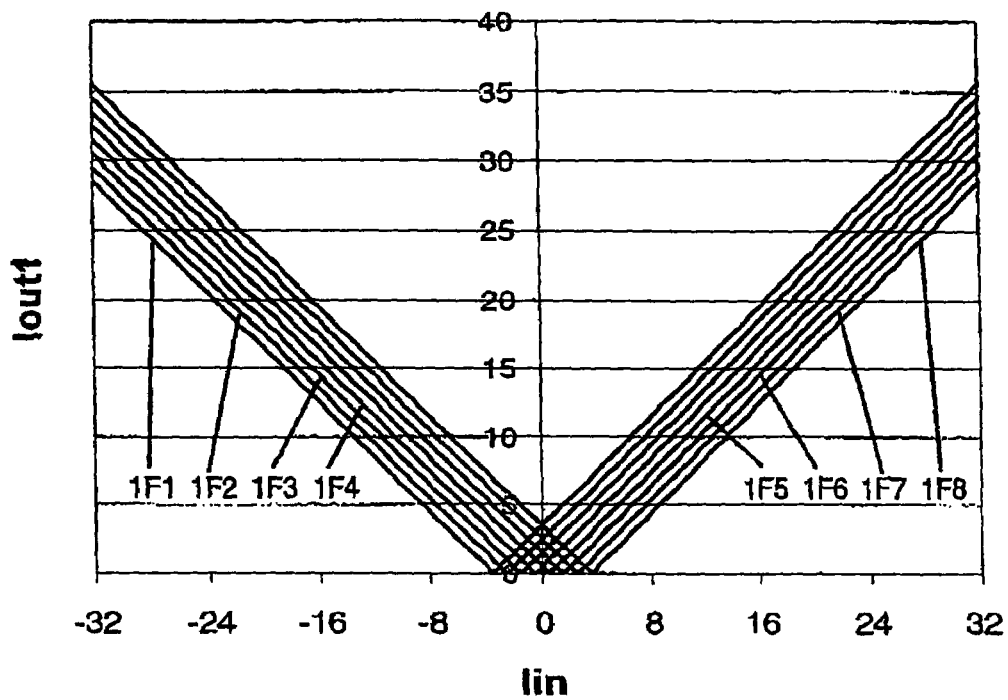
FIG. 33 shows the magnitude of the output currents after the first stage in the cascades of FIG. 32.
Figure 34:
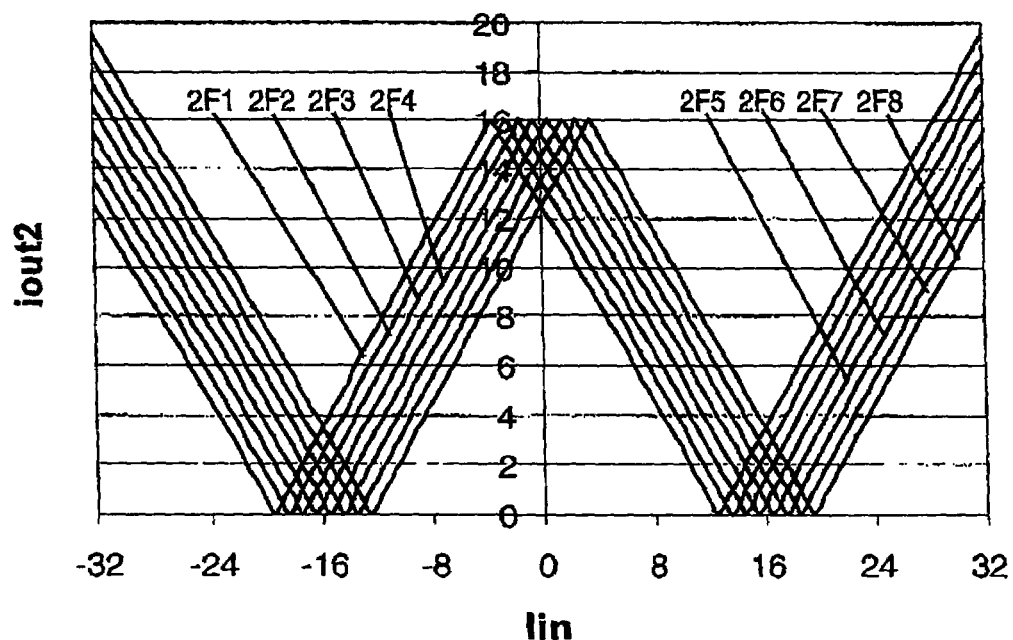
FIG. 34 shows the magnitude of the output currents after the second stage in the cascades of FIG. 32.
Figure 35:
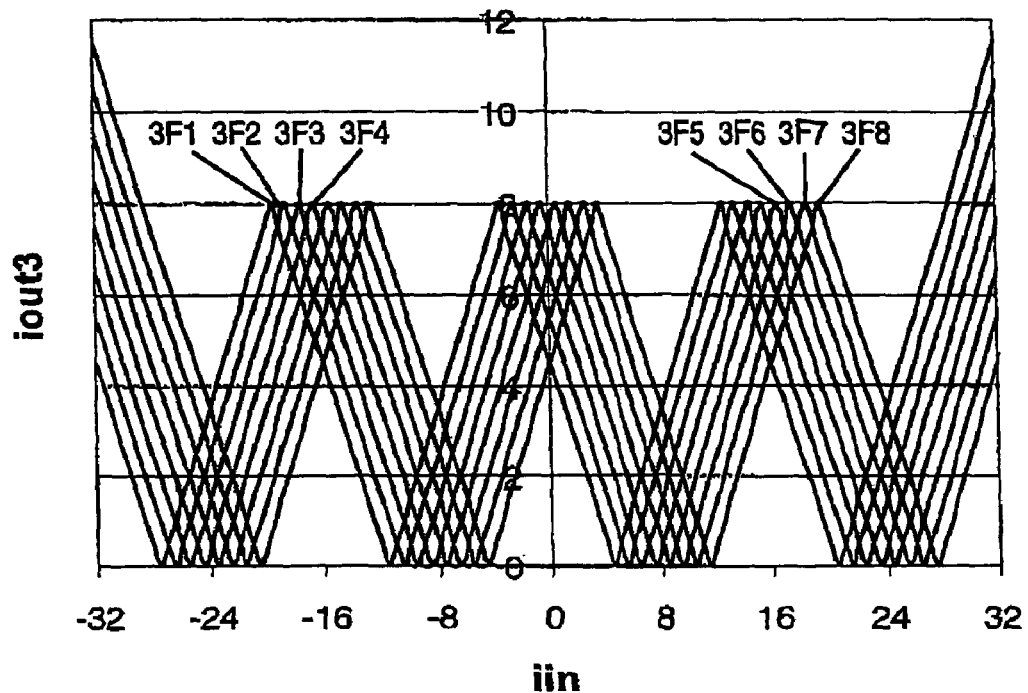
FIG. 35 shows the magnitude of the output currents after the third stage in the cascades of FIG. 32.
Figure 36:
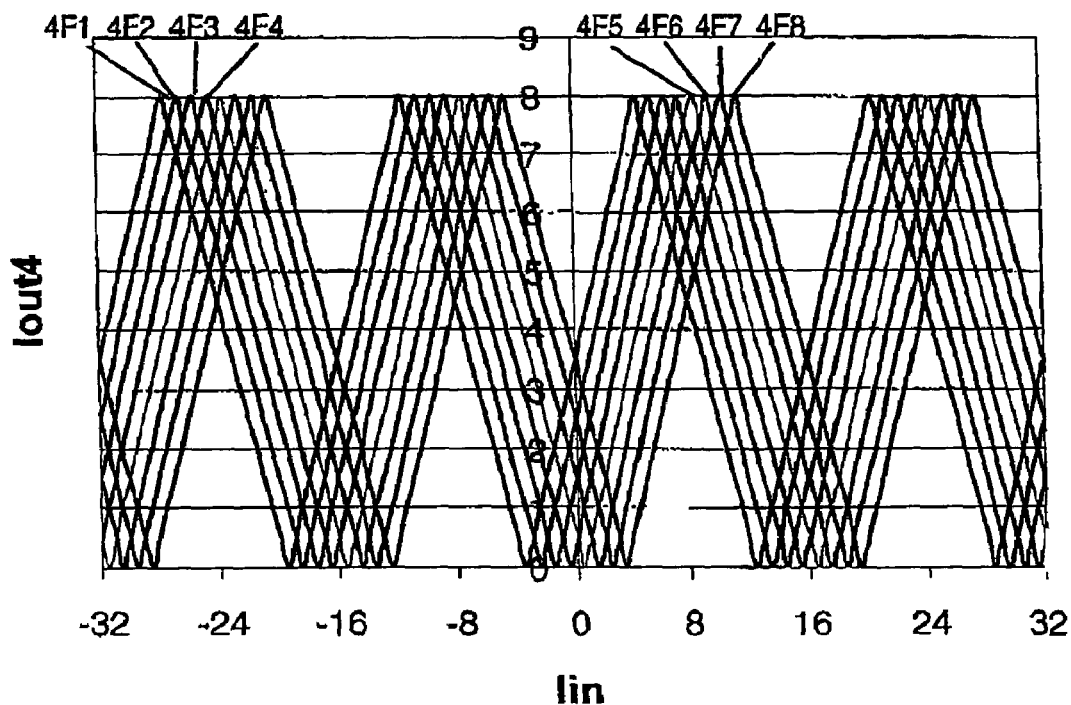
FIG. 36 shows the magnitude of the output currents after the fourth stage in the cascades of FIG. 32.
Figure 37:
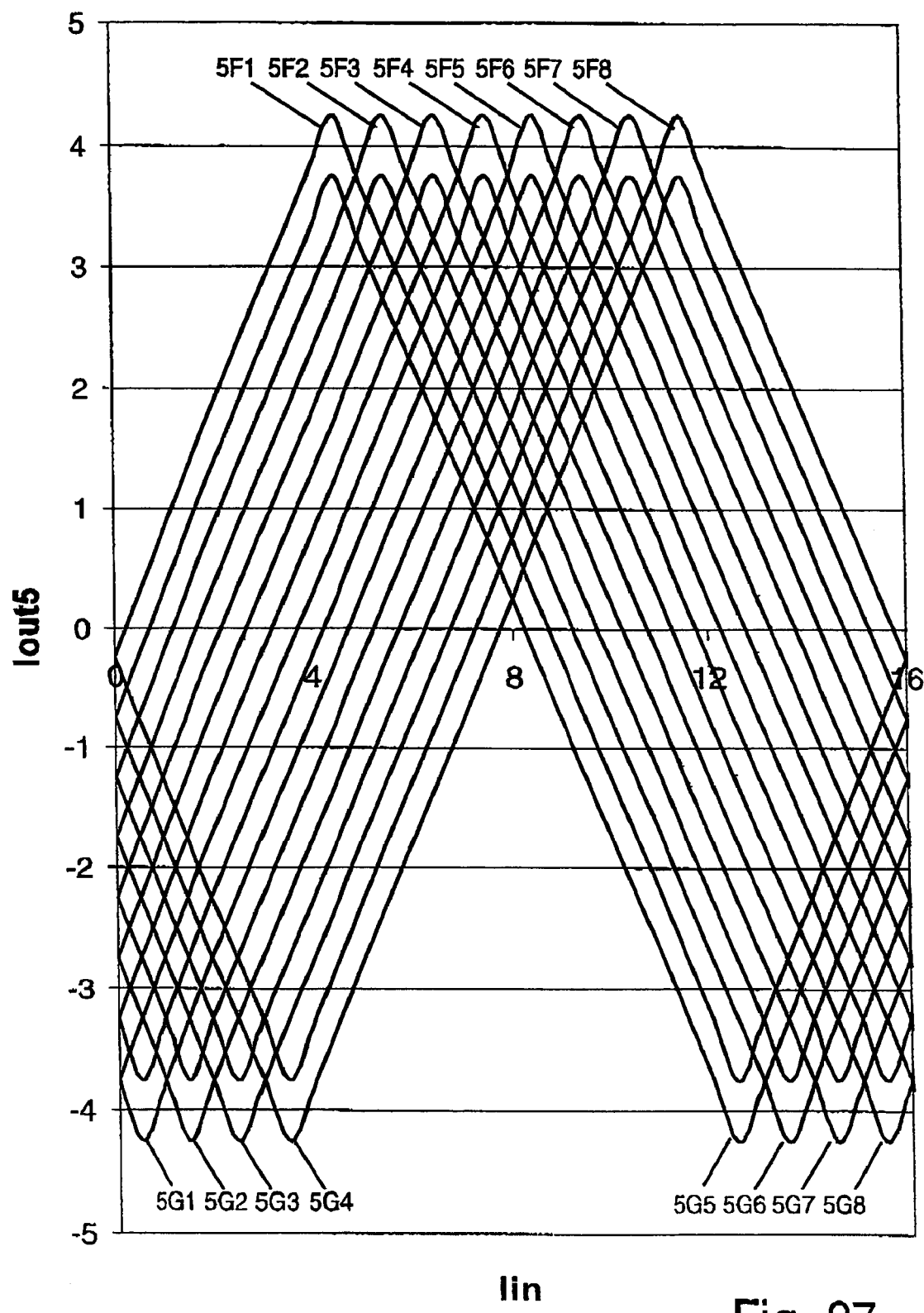
FIG. 37 shows the current outputs after addition of the currents delivered by the current sources after the fourth stage in FIG. 32.

FIG. 30 shows a similar block diagram of a cascade of folding cells FZ1 . . . FZ4, but here the bias currents are different. In addition, currents are added at the outputs of the last stage by means of the current sources IZ1 and IZ2. The reason for this is explained below. FIG. 31 gives a block diagram representation of the circuit of FIG. 30. This block diagram is used to illustrate in FIG. 32 how an analog-to-digital converter can be constructed using several circuits Fold1 . . . Fold8 of the type shown in FIG. 30 in parallel. In the figure, the block diagram of FIG. 31 is used with omission of the arrows indicating the digital outputs in FIG. 30. FIG. 32 indicates that an offset is added to the input currents of the various cascades: the offsets equal 7*Ilsb, 5*Ilsb, . . . ,−5*Ilsb, −7*Ilsb for Fold1 through Fold8. FIGS. 33, 34, 35 and 36 show the magnitude of the currents at the outputs of the first (1F1 . . . 1F8 for Fold1 . . . Fold8), second (2F1 . . . 2F8 for Fold1 . . . Fold8), third (3F1 . . . 3F8 for Fold1 . . . Fold8), and fourth stage (4F1 . . . 4F8 for Fold1 . . . Fold8), in the cascades, respectively. The scale of the currents is normalized to 2 Ilsb (i.e. one unit is 2 Ilsb). The outputs of the last stage can be centered around zero by adding a current or they can also be offset slightly with respect to zero. The latter was done here by the current sources IZ1 and IZ2 added to the outputs of the fourth stage in the cascade of FIG. 30, while the former could have been done using $8*I_{lsb}$ instead of the $8.5*I_{lsb}$ and $7.5*I_{lsb}$ shown in FIG. 30. After this current addition, the resulting output currents (5F1 . . . 5F8 and 5G1 . . . 5G8) can be fed into another folding stage (with comparators) which injects its output currents into current sinks (i.e. as for instance in the example of FIGS. 28 and 29). Alternatively, the outputs (5F1 . . . 5F8 and 5G1 . . . 5G8) can be presented to current comparators. FIG. 37 shows the magnitude of these currents 5F1 . . . 5F8 and 5G1 . . . 5G8, normalized to 2 Ilsb.

In such configuration using a plurality of cascades as in FIG. 30, the least significant bits can be determined by establishing the cascade of which the output currents of the last stage were nearest to the zero crossing. The comparison signals of the last stage serve this purpose. The very significant advantage of this with respect to a configuration with only a single cascade, is that those output currents of the last stages only need to be accurate near the zero crossing, because that is what determines the least significant bits, and can be inaccurate further away from the zero crossing of the last stage. One can therefore allow the current folding of the previous stages to be less accurate around their zero transition point. This means in practice that one can increase the zero-input current of those stages significantly, and therefore considerably increase the bandwidth of those stages. This will cause errors in the currents around the zero transitions of the previous stages because current is not conducted by one current path only. Only when one comes near to the zero transition of the outputs of the last stage of that cascade, do the currents need to be accurate. One has to therefore only guarantee that at that moment no significant current leaks away in the previous stages through current paths which are not supposed to conduct current at that moment. The concept that current folding cells are only accurate when needed and relatively inaccurate otherwise and that this may yield a speed advantage is novel and is therefore an object of the invention.

The more significant bits in such a configuration with a plurality of cascades of folding cells can be determined in several ways. One can select the most significant bits determined by the cascade of which the last stage is nearest to the zero crossing. The significant advantage here is that for those more significant bits it is known that one is far from the zero transition, and one can therefore afford the comparison signals from those previous stages to be less accurate around the zero transition point. They only need to be accurate when they are used to determine the bit code. At the same time the information which of the cascades was the one with its last stage nearest to the zero crossing provides the information to determine the least significant bits.

Figure 38:
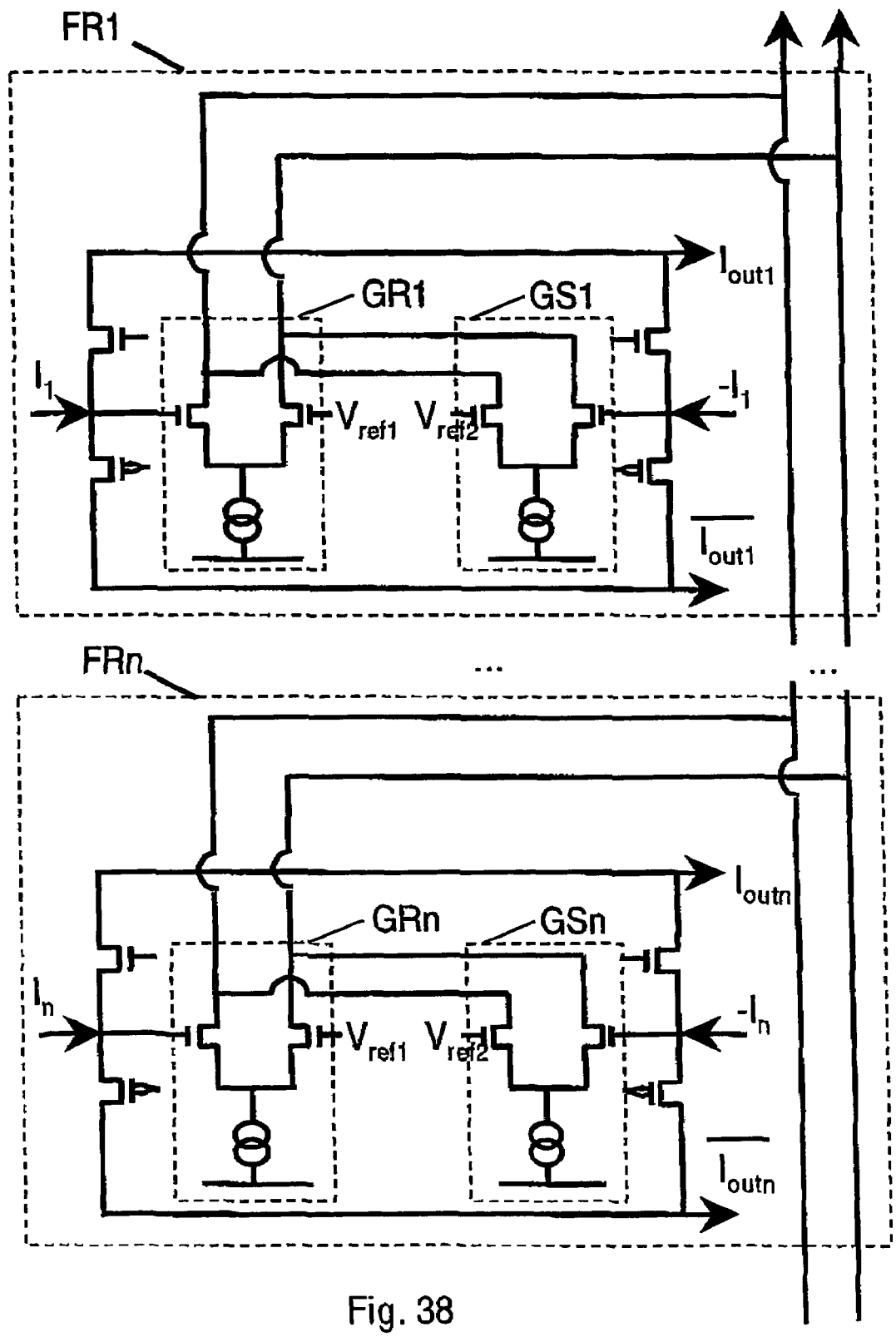
FIG. 38 illustrates how averaging for the most significant bits can be implemented in case a plurality of parallel folding cells or cascades of folding cells are used in the analog-to-digital converter.

Another way to determine the most significant bits is by averaging the bit determining signals corresponding to those bits of a certain number n of different cascades. This can easily be implemented by using a series of transconductors which each correspond to a certain bit or its complement of a certain folder. This is illustrated in FIG. 38 where the outputs of the transconductors GR1 . . . GRn and GS1 . . . GSn (GR1 . . . GRn corresponding to the first input of the folding cells FR1 . . . FRn, and GS1 . . . GSn corresponding to the second input of the folding cells FR1 . . . FRn). The transconductors in the figure are depicted as differential pairs with one input connected to one input of the current folding cell and the other input connected to a reference voltage (Vref1 for GR1 . . . GRn, and Vref2 for GS1 . . . GSn). Other more complicated transconductors could be envisaged as well. In the figure, only the current folding cells FR1 and FRn corresponding to a particular bit in the first folder and last ($n^{th}$) folder respectively are shown in more detail. The corresponding cells of the remaining folders and the connections of the transconductors they contain are identical. The currents of the transconductors all correspond to one particular bit or its complement. They can be summed to determine the value of that bit. This can be done as illustrated in the figure by connecting their outputs together to obtain a positive and a negative output line. The current in these two lines has to be compared by means of an amplifier and a comparator or by some other way to determine the value of the bit. The use of these transconductors allows to implement some gain and some averaging to reduce the influence of offsets, while only having one comparator per bit.

One can also average in the digital domain, so one can decide to first carry out the comparison on the signals from the transconductors for instance, or compare directly the voltages at the inputs of the current folding cells. This would correspond to a majority voting scheme.

One can combine the averaging and the selecting technique, by selecting the average of the MSBs corresponding to a certain number of folders of which the current outputs of the last stage are nearer to the zero crossing than the others.

Figure 39:
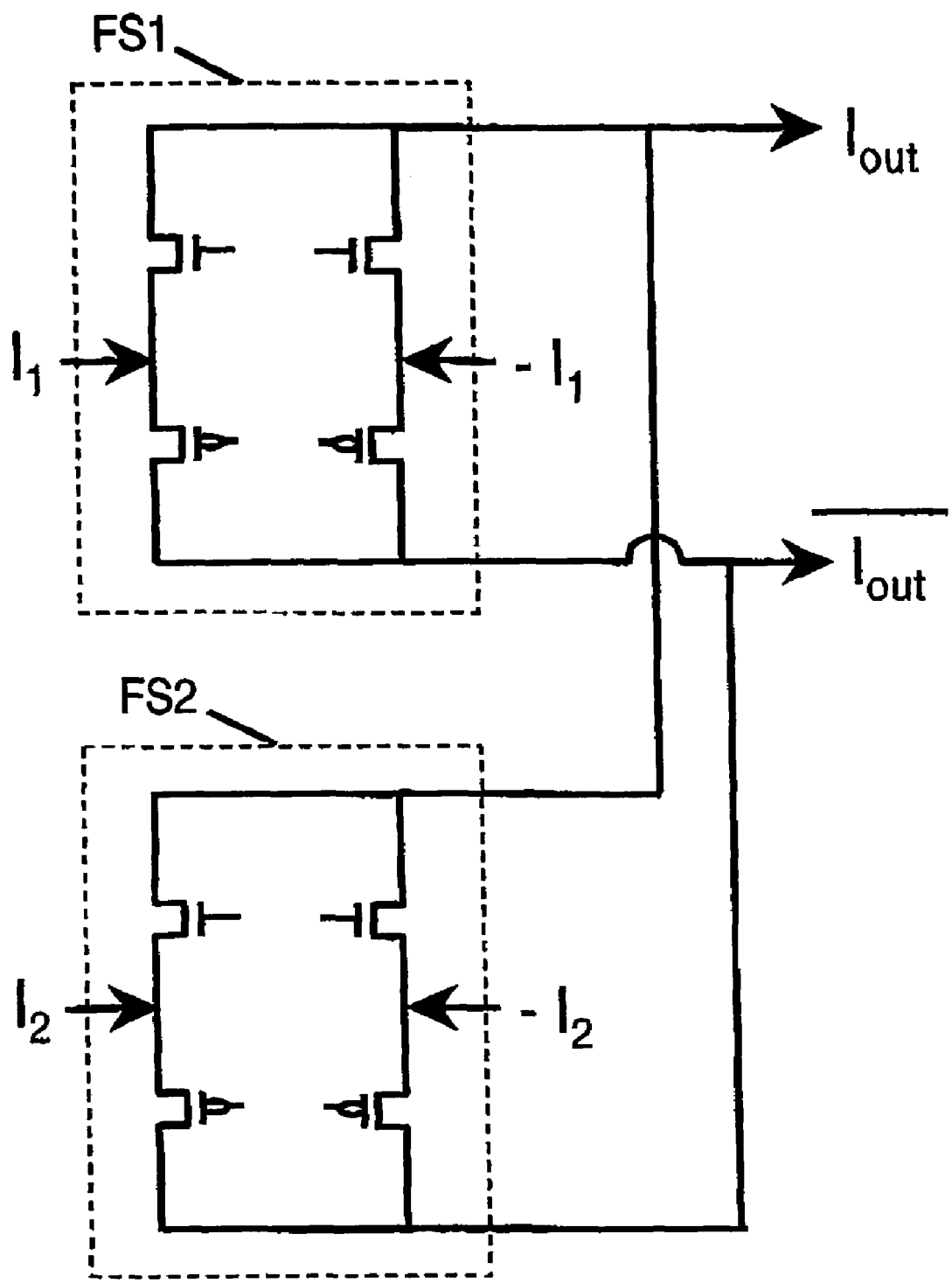
FIG. 39 illustrates one example of how current outputs of an embodiment of the novel current folding cell can be combined.

A further object of the invention is that, since the analog outputs of the current folding cell carry current, it is easy to combine those outputs. Usually this can be done by just connecting the output wires together as illustrated in FIG. 39 for two folding cells FS1 and FS2. One advantage for a configuration with several folders in parallel is that if current outputs are combined from cells in the different folders, the current presented to the next stage is larger and that hence the attainable speed for that next stage is increased.

A further advantage of the new folding cell proposed here is that often a well defined relationship exists between the outputs of the folding cell or cascade of folding cells or between the outputs of several folding cells or cascade of folding cells in parallel. One example is the cascade of folding cells in FIG. 13 in case I1 equals −I2 for all cells in the cascade. In that case the sum of the input currents and the sum of the output currents of each stage are zero. Such a relationship between the output currents can be advantageously used.

Figure 40:
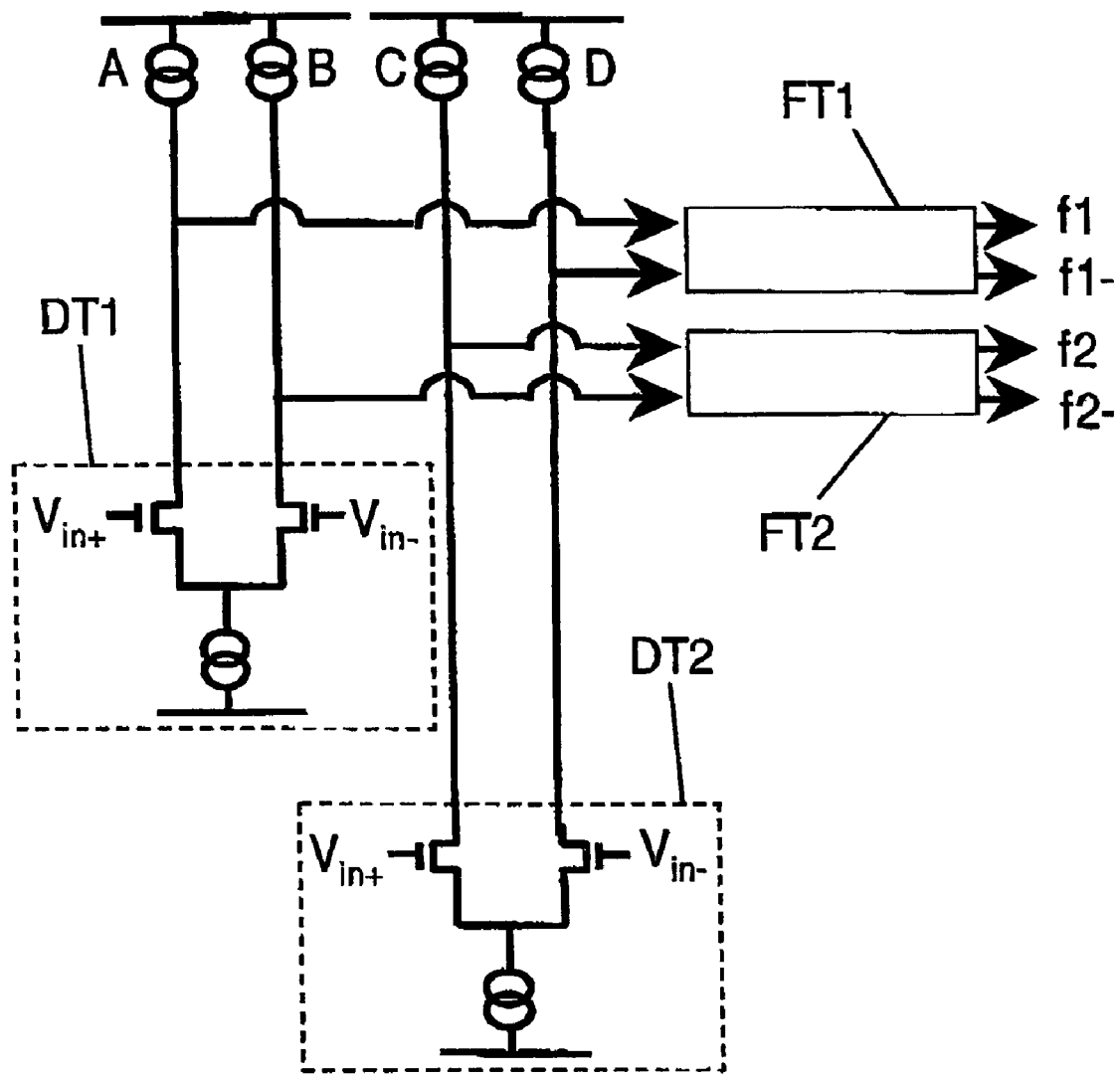
FIG. 40 shows an example with two folding circuits fed by two differential pairs to explain how offset between the two differential pairs can be detected.

One example in case a plurality of folders is used is that the folder outputs can be combined and mutually compared. The result of the comparison can be fed back to the inputs of the folders to reduce or eliminate offset between folders. An example of how information can be obtained regarding offset between folders from the folder outputs is shown in FIG. 40, where a configuration with two folders FT1 and FT2 in parallel is used. The folders are fed by two differential pairs DT1 and DT2 which have the same input signal. This signal is related to the signal to be converted. The first output of the first differential pair DT1 is linked to the first input of the first folder FT1, the second output of this first differential pair DT1 is linked to the second input of the second folder FT2. The first output of the second differential pair DT2 is presented to the first input of the second folder FT2, and the second output of the second differential pair DT2 is presented to the second input of the first folder FT1. In the example some offset was introduced for the first differential pair by means of a difference in the current sources A and B, A being linked to the first output of the first differential pair DT1, B being linked to the second output of the first differential pair DT1. A deliberate offset with the same magnitude but opposite sign was introduced in a similar way for the second differential pair DT2, by means of a difference in the current sources C and D, C being linked to the first output of the second differential pair DT2, and D being linked to the second output of the second differential pair DT2. The thus introduced deliberate offset comes in addition to the random offset which might be different for the two differential pairs. Below it is explained how a difference in random offset can be derived from the folder outputs in FIG. 40.

Figure 41:
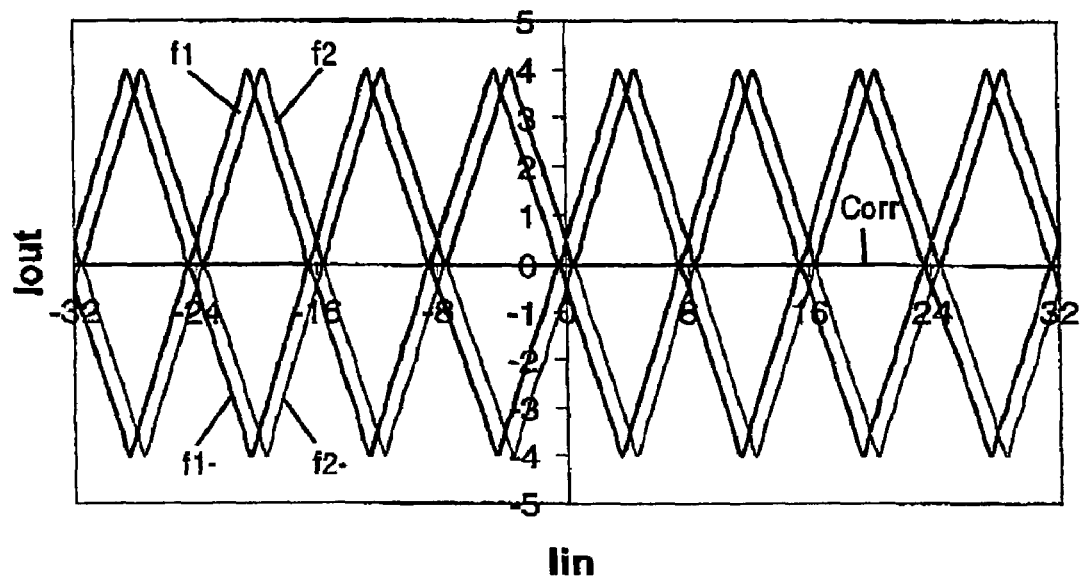
FIG. 41 shows the output currents f1, f1–, f2 and f2– of the two folding circuits of FIG. 40 as a function of the input current, in case no offset is present apart from the one deliberately introduced. The figure also shows a corrective signal "Corr" derived from these output currents which is proportional to the random offset between the two differential pairs shown in FIG. 40.

In the example, the two folders FT1 and FT2 each carry out five folding operations on the input signals. The output currents f1, f1−, f2 and f2− of the two folders after the fifth fold are plotted as a function of the input current delivered by one of the two differential pairs in FIG. 41 for the case where no random offset is present in the two differential pairs. The outputs of the two folders are mutually shifted due to the deliberately inserted offset, but have the same shape. Note that each of the two folders has an output where the output current has a positive sign, and one where the output current has a negative sign (f1 and f1− for FT1 and f2 and f2− for FT2). In principle the sum of the two current outputs of each folder should be zero, so if one defines the signal Corr as the sum of the two output currents of the first folder minus the sum of the two output currents of the second folder, one would expect Corr to be equal to zero if no random offset is present. FIG. 41 confirms that Corr is equal to zero for the full current input range.

Figure 42:
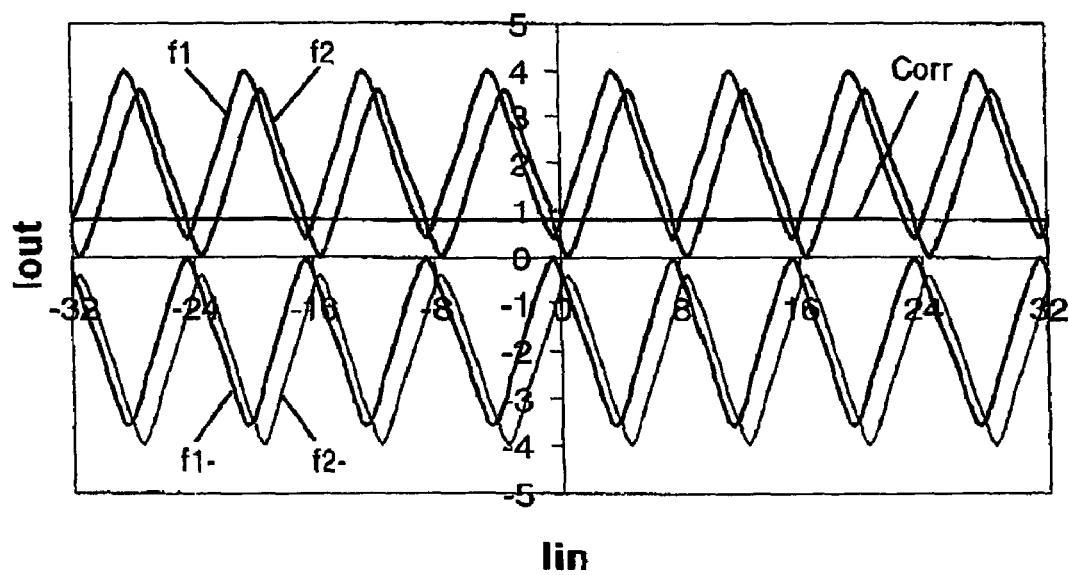
FIG. 42 shows the output currents f1, f1–, f2 and f2– of the two folding circuits of FIG. 40 and the corrective signal "Corr" derived from these output currents, as a function of the input current, in case some random offset is present apart from the one deliberately introduced between the differential pairs shown in FIG. 40.

FIG. 42 plots the output currents of the two folders and the signal Corr for the case where the first differential pair has an offset equal to the offset of the second differential pair but opposite in sign. Now the output currents of the two folders are not only mutually shifted but also have a different signal shape. The signal Corr is plotted as well and it can be observed to be different from zero now, but constant over the full current input range. In fact, the signal Corr is proportional to the difference in offset between the two differential pairs. Since it is constant over the full input range it can easily be used in a feedback loop to cancel this difference.

Figure 43:
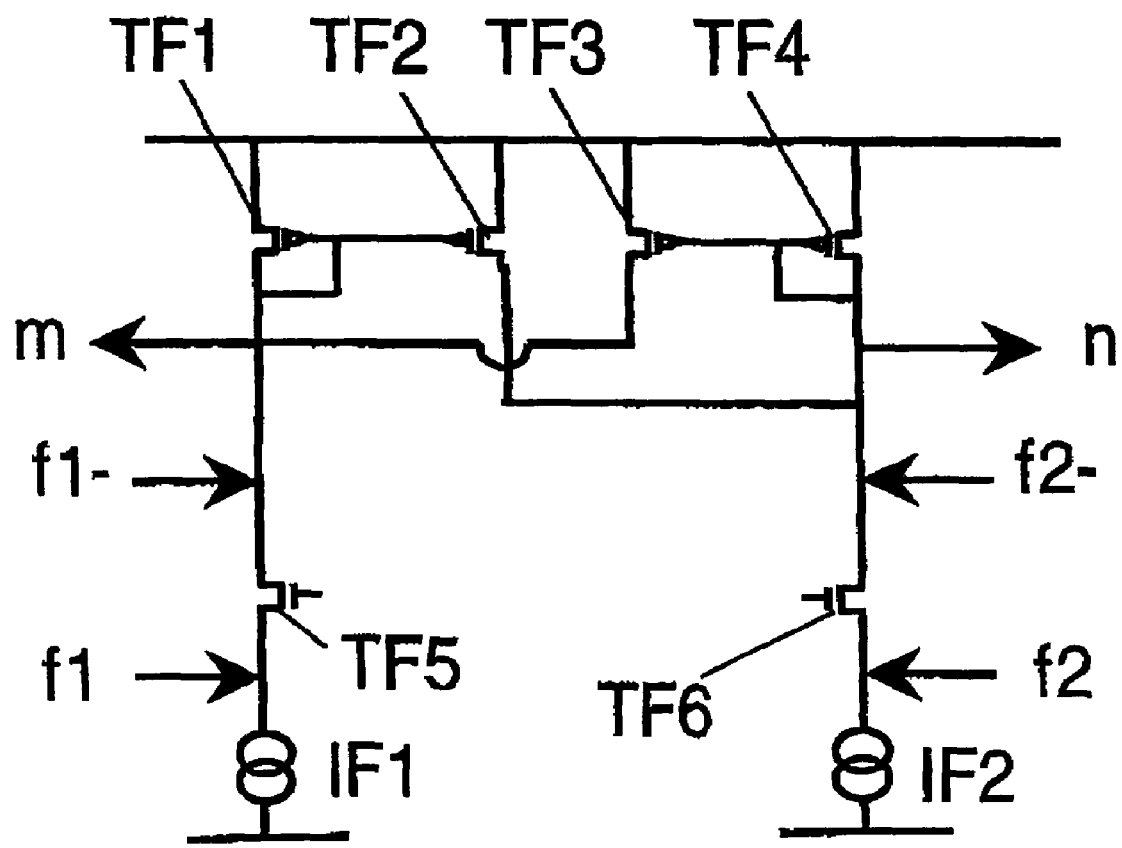
FIG. 43 shows how the corrective signal Corr can be derived from the folder output currents of the circuit shown in FIG. 40. The potential difference between m and n is a measure of the corrective signal Corr.

FIG. 43 shows an example of how to determine the Corr signal. The two output currents f1 and f1− of folder FT1 are injected into one branch of a differential circuit and summed. In the figure this branch is biased by the current source IF1 delivering its current into the source of a NMOS cascode transistor TF5. f1 is injected into the source of TF5 as well. The drain of the cascode transistor TF5 is connected to the node m, which also receives f1−. Therefore f1 and f1− are summed on the node m. Similarly f2 and f2− are presented to the source and drain terminals of a second NMOS cascode transistor TF6 biased by a current source IF2, and similarly f2 and f2− are summed on the node n connected to the drain of TF6. The nodes n and m are also linked to two current mirrors, the first one formed by the PMOS transistors TF1 and TF2 and the second one formed by the PMOS transistors TF3 and TF4. The output current to input current ratio of the current mirrors in this example is equal to 1. The node m is the gate of the first current mirror, and is also linked to the drain of the output transistor TF3 of the second current mirror. The node n is the gate of the second current mirror, and is also linked to the drain of the output transistor TF2 of the first current mirror. This current mirror arrangement causes causes a voltage difference to be developed between the nodes m and n proportional to the difference of the currents injected into the first and second branch of the differential circuit. If the current sources IF1 and IF2 deliver the same magnitude of current, this difference between the currents injected in the first and second branch of the circuit is equal to the signal Corr. Therefore the potential difference between the nodes m and n is a measure of the signal Corr.

Figure 44:
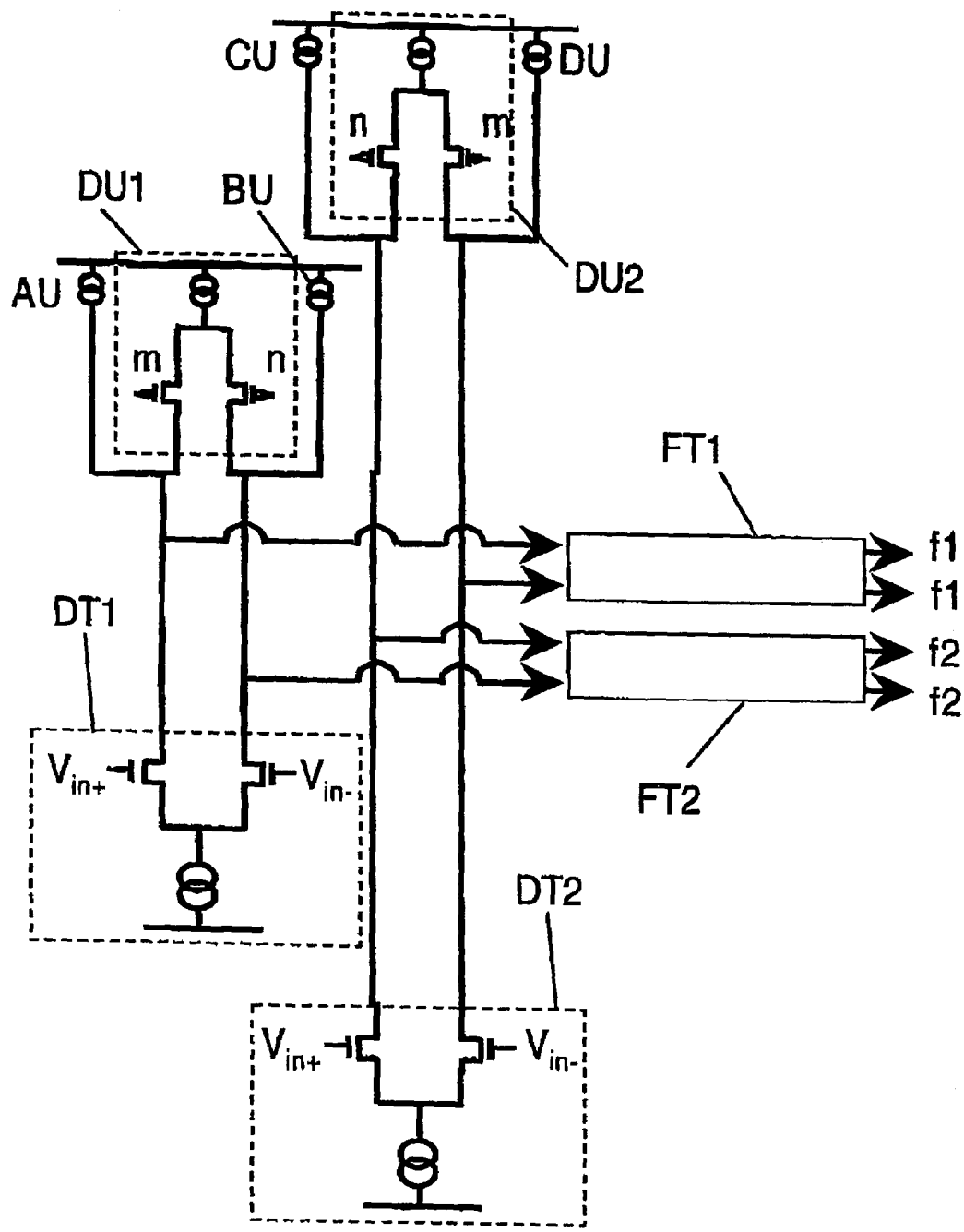
FIG. 44 shows how the feedback to correct the offset between the two differential pairs shown in FIG. 40 can be applied in practice, using the signals m and n shown in FIG. 43.

FIG. 44 illustrates how this potential difference between the nodes m and n can be used in a feedback loop to correct for the offset difference between the two differential pairs DT1 and DT2. The current sources A, B, C and D of FIG. 40 have been replaced by the current sources AU, BU, CU, and DU and the differential pairs DU1 and DU2 such that when the differential pairs DU1 and DU2 are in balance, the same current is delivered to each of the inputs of the folders FT1 and FT2 as in FIG. 40. The differential pairs DU1 and DU2 are controlled by the nodes m and n. Therefore a differential current proportional to the voltage difference between the nodes m and n (for a small difference) is added to the outputs of the first differential pair DT1. A differential current equal in magnitude and opposite in sign is added to the outputs of the second differential pair DT2. For a sufficiently large gain and a sufficient phase margin for the feedback loop, this circuit effectively eliminates the difference in offset between the differential pairs, and causes the circuit to behave as if the two differential pairs each had an offset equal to the average of the real offset of the two differential pairs. So this circuit performs an averaging function for the effective total offset. However, the offset between the differential pairs is fully eliminated.

The deliberate offset introduced at the input between the two folders is not affected by the feedback circuit because this offset is differential, i.e. it affects the difference between the folder outputs f1 and f1− (or f2 and f2−) and not their sum. Note that in some cases offset deliberately introduced can affect the sum of the folder output currents f1 and f1−. An example of this is the previously mentioned offset δ prior to the last comparison in the folder.

Here an example was given to eliminate offset between differential pairs. Offset between other (more linear) transconductors feeding different folders can be eliminated in a similar way.

Figure 45:
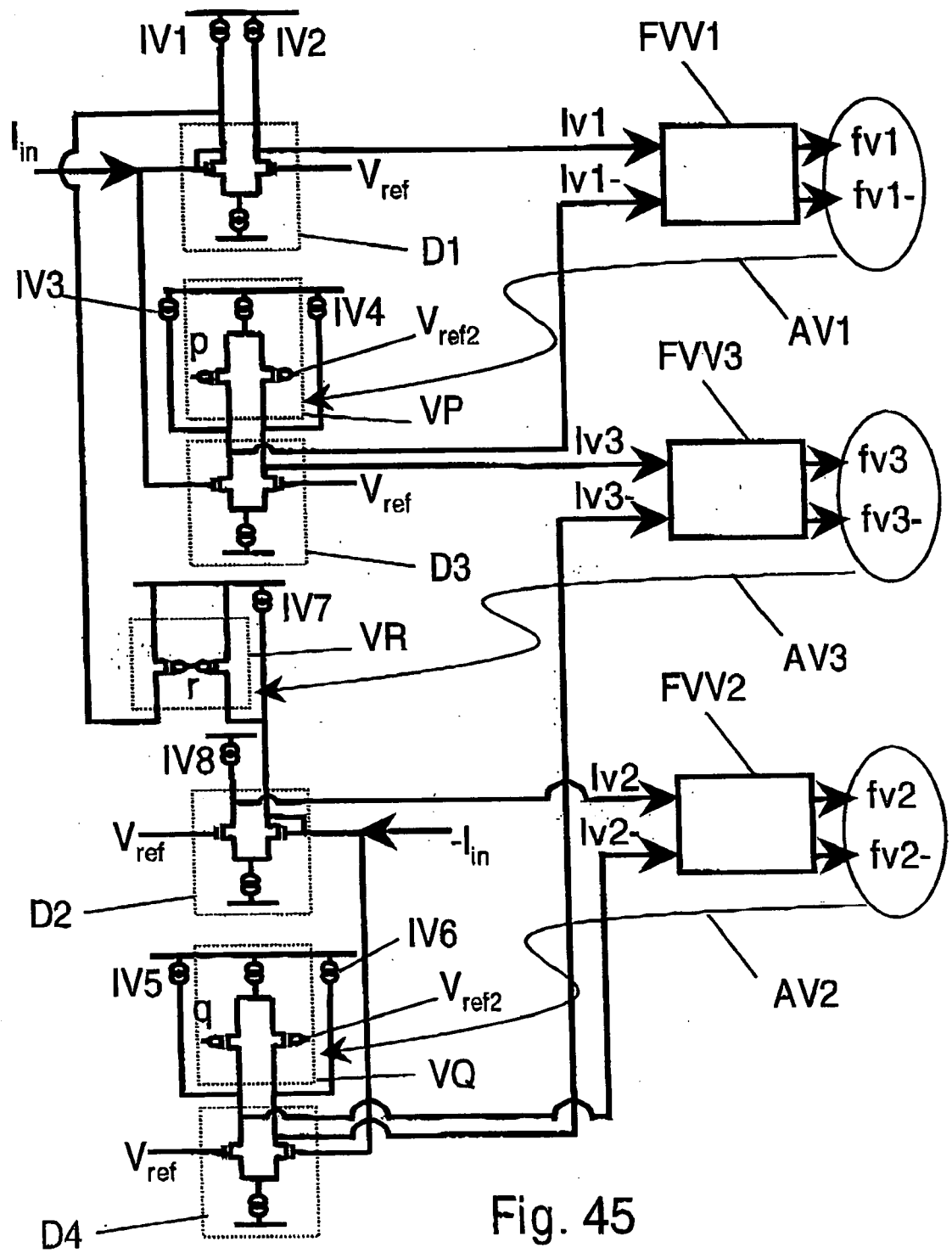
FIG. 45 shows another example of how feedback can be used to cancel offset between differential pairs in an analog-to-digital converter.

Another example to eliminate the effect of offset between different differential pairs or transconductors feeding different folders is described by means of the example hereafter. The example is given for four differential pairs D1 to D4 and three folders FVV1 to FVV3 and is shown in FIG. 45. The circuit relies on the well-determined relationship between the two output currents of each folder, in this particular example that their sum is zero.

Each differential pair is biased by its tail current and by a combination of current sources IV1 . . . IV8 and feedback circuits VR, VP and VQ applying current to the drains of its two transistors. IV1 is linked to the first transistor and IV2 to the second transistor of D1, IV3 and IV4 to the first and second transistor of D2, etc . . . The first feedback circuit VR delivers an equal current to the first transistor of D1 and the second transistor of D2. The second and third feedback circuits VP and VQ are differential pairs, and deliver apart from the tail current a current equal in magnitude and opposite in sign to the first and second transistors of D3 and D4, respectively.

The first transistor of D1 and the second transistor of D2 are diode-connected (drain connected to the gate) and receive the input current Iin with positive and negative sign, respectively. Note that in practice some buffering can be applied in between the drain and the gate of the input current absorbing transistors to minimize the capacitive load seen by the input signal. The gate of the other transistors of D1 and D2 are connected to a reference Vref. The input current (or the positive and the negative component of the differential input signal) will cause a voltage to develop on the gate and drain of the receiving transistors dependent on the input signal. This voltage can also be applied to other differential pairs; in the example with four differential pairs, the third differential pair D3 receives the same voltages on the gates of its two transistors as the first differential pair D1, and the fourth differential pair D4 the same voltages on the gates of its two transistors as the second differential pair D2. Three folders FVV1 . . . FVV3 are linked to the outputs of these four differential pairs in the following way: Folder FVV1 receives as input currents the available output current of the first differential pair D1 (corresponding to the transistor which is not diode-connected) and the first output of the third differential pair D3. This first output of the third differential pair D3 is the one which is supposed to carry a current equal in magnitude but opposite in sign to the one carried by the available output of the first differential pair D1. In the same way, the second folder FVV2 receives as input currents the available output of the second differential pair D2 and the output of the fourth differential pair D4 whose current has the opposite polarity to the one of the available output of the second differential pair D2. The third folder FVV3 receives as input currents the second output current of the third and fourth differential pair D3 and D4.

If the currents supplied by the current sources to the differential pairs are sufficiently well controlled, the current applied to the first input of the first folder is substantially equal to the input current applied to the diode-connected transistor of the first differential pair, or to this current plus a well-defined deliberately introduced constant offset, determined by the current source linked to the available output of the first differential pair. Since the sum of the input currents—and hence the sum of the output currents—of the first folder has to equal zero, this condition can be imposed using a feedback loop acting on the feedback circuit VP linked to the outputs of the third differential pair D3. In the figure, this feedback is schematically indicated by the ellipse around the two outputs of folder FO1 and the arrow AV1 pointing to the current sources feeding the differential pair D3. If the sum of the current outputs of the first folder FVV1 is different from the predetermined value, a corrective signal is applied to the current sources of the third differential pair D3, until the sum substantially equals the required value. This substantially eliminates the offset between the first and the third differential pair D1 and D3. Similarly, a feedback loop using VQ can be used to eliminate the offset between the second and the fourth differential pair D2 and D4. This feedback loop is schematically indicated in FIG. 46 by AV2 as the first feedback loop.

The sum of the input currents—and hence the output currents—of the third folder should also equal a certain predetermined value. Also here this can be used for a feedback loop, in particular to provide a common mode cancellation signal for the two current inputs. The sum of the output currents of the third folder will apply a corrective signal via the feedback circuit VR to the diode-connected transistors in the first and second differential pairs D1 and D2. This corrective signal will make the sum of the output currents of the third folder constant and this will effectively cancel the common mode between the two input currents Iin and −Iin. This feedback is schematically indicated in the figure by the arrow AV3. Please note that the feedback in this case is in common for the two current branches to which it is applied. The first two feedback loops applied a differential feedback between two branches.

Figure 46:
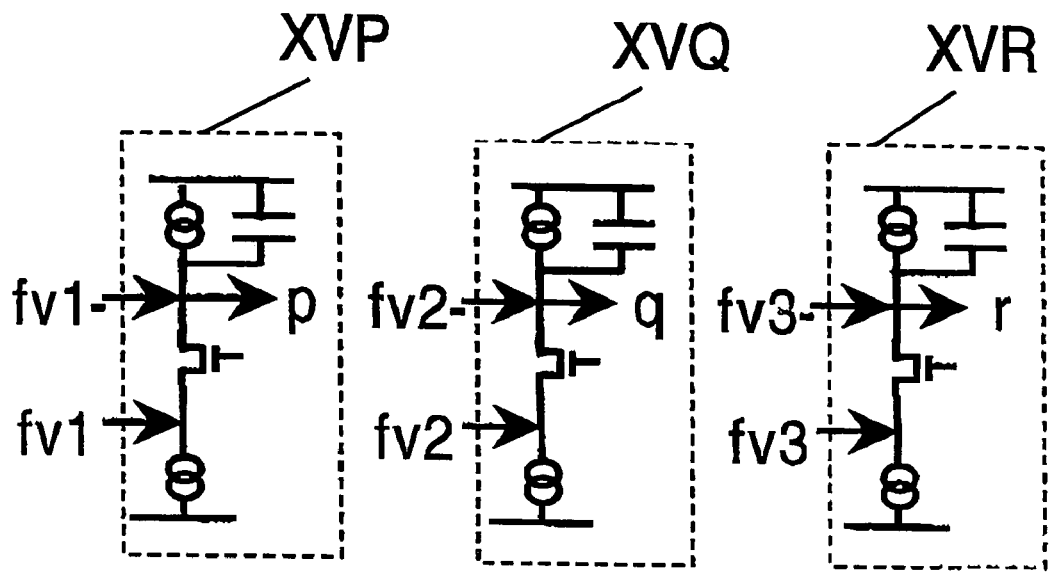
FIG. 46 further details a possible way to implement the feedback schematically depicted in FIG. 45.
Figure 47:
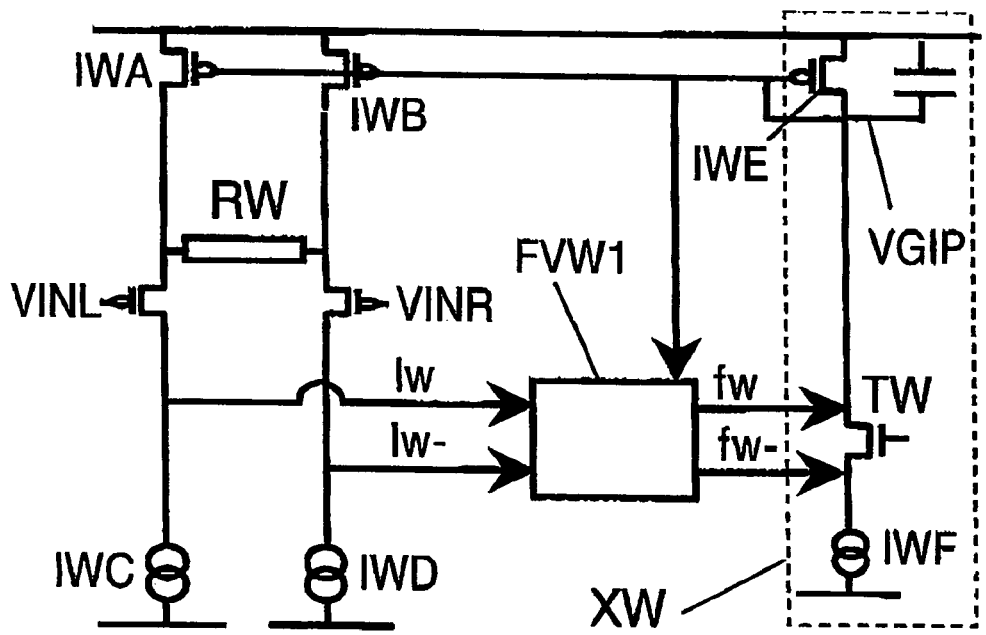
FIG. 47 describes how feedback can be applied to provide accurate biasing to the folder and in its input circuit for all PMOS current sources without relying on a current mirror which would be subject to mismatch.

FIG. 47 gives an example of how the three feedback loops schematically shown in FIG. 46 can be implemented in practice. The sum of the output currents of each folder is formed using a cascode circuit. XVP makes the sum of the ouputs fv1 and fv1– of the first folder FVV1 on the node p, XVQ sums the output currents fv2 and fv2– of the second folder FVV2 on the node q, XVR sums the output currents fv3 and fv3– of the third folder FVV3. If the sum of f1 and f1– is different from zero, the node p will be charged or discharged, and since this node p controls the output of VP containing a PMOS differential pair adjusting the offset of the differential pair D3, the offset will be corrected. $V_{ref}2$ controlling the other input terminal of this PMOS differential pair is a fixed reference in this example. The node q is charged or discharged in a similar way if the sum of f2 and f2– is different from zero, and this will correct for random offset in the differential pair D4 via the feedback circuit VQ. Finally, if the sum of f3 and f3– is different from zero, the node r will be charged or discharged. This will cause a corrective signal to be applied to the two current inputs of the circuit to eliminate common mode between the two current inputs $I_{in}$ and $-I_{in}$, should they not have been substantially equal and opposite in sign.

In conclusion, the fact that the sum of the input currents and hence the sum of the output currents of one folder is equal to a predetermined value, to zero in this example, allows to apply feedback to effectively eliminate the offset between differential pairs and the common mode in the input signal. Since therefore the size of the transistors in the differential pairs can be reduced to a minimum (their offset will be cancelled anyway), the parasitic capacitance associated with these transistors can be severely reduced resulting in a substantial speed advantage. Note that standard methods known to people skilled in the field have to be applied to guarantee stability for this feedback configuration.

These were examples with a small number of parallel folders and differential pairs. This principle of reducing or eliminating random offset based on the relation between the outputs of the folders can be more generally applied for the configuration with a larger number of parallel folders, and can also be used to reduce offset between folders generated by circuits other than differential pairs, for example current mirrors or transconductors. This principle can also be applied in a cascade configuration. For instance, in the example of FIG. 46, differential pairs could be added with their inputs connected to the inputs of the last stage of the folders FVV1 . . . FVV3, so they would sense the input voltage to the last stage of these folders. Several differential pairs could be added per folder, and one could present their outputs to current folders again, and then correct their offset based on the fact that they received the same input and on the relation between folder outputs.

This principle of relying on the relation between the multiple outputs of folders can also be used for only one folder. FIG. 47 shows an example for a folder FVW1 receiving current at its inputs Iw and Iw– by a transconductor circuit consisting of a resistor RW and the two input transistors TWA and TWB, biased by the PMOS transistors IWA and IWB, and the current sources IWC and IWD. The outputs fw and fw– are added by means of the cascode circuit XW consisting of the current source IWF, the cascode transistor TW. The resulting sum will charge or discharge the node VGIP, which controls the PMOS transistors TWA and TWB and also all the current sources influencing fw and fw– within the folder FVW1. This way the current delivered by the PMOS current sources and by the NMOS current sources will be balanced exactly without the use of a very accurate (and very expensive area-wise) current mirror.

This principle of reducing or eliminating random offset is based on the relation between the multiple outputs of one or more folders. It offers the possibility of eliminating offset at the folder inputs using a simple feedback scheme. Prior art techniques either only offered an offset reduction due to averaging for instance, or introduced considerable circuit complexity using for instance chopper amplifiers and digital filtering. Therefore this technique to reduce or eliminate random offset constitutes an improvement over the prior art and is therefore an object of the invention.

In some applications, several signals which have some well-defined relationships have to be converted at the same time. In that case, feedback loops which act on several converters at the same time can be envisaged to correct or reduce deviations from this well-defined relationship. These feedback loops would detect deviations in folder outputs or combinations of folder outputs from the expected value and apply a corrective signal to the converter inputs.

A further object of the invention is that a track-and-hold or a sample-and-hold circuit can be placed in front of the folding circuits introduced here to allow larger input bandwidths.

A further object of the invention is that a track-and-hold or a sample-and-hold circuit can be inserted in-between stages in the cascade of folding cells to construct a pipelined analog-to-digital converter. This would allow the conversion speed to be increased, as the current needs to traverse a smaller number of stages during each clock cycle. In fact, the folders constructed from the new current folding cell described here automatically generate a residue between the value represented by the bits determined in the folder and the input value. Therefore these folders are particularly suited for switched current applications also when the input signal is oversampled.

One issue with a pipelined converter constructed as described above is that the residue needs to be sufficiently accurate to determine the least significant bits. This means that the biasing current Idc in the folding cells corresponding to the most significant bits needs to be kept sufficiently small to avoid signal deterioration for the least significant bits due to leakage in the folding cells corresponding to the most significant bits. This limits the speed improvement of a pipelined converter constructed as described above.

One way to circumvent this problem is to use a higher biasing current Idc (see FIG. 3) to bias the folding cells $FO_1 \ldots FO_{K-1}$ of the most significant bits 1 . . . K–1, followed by a folding cell $FO_K$ with a small Idc for bit K (K should be less or equal than the total number of bits n in FIG. 13). These folding cells $FO_1 \ldots FO_K$ provide the bits 1 . . . K some time after the input is applied. Bit K indicates the sign of the residue at the output of $FO_K$. Using the bits 1 . . . K a small differential current offset OFD can be applied to the input of the first folding cell (in addition to the input already present) using a 1 bit digital-to-analog converter (OFD is applied to the first input and –OFD to the second input of the first folding cell). This offset of which the sign is determined by the bits 1 . . . K but of which the magnitude can be kept constant independent of the input signal, allows to bring the total signal (input Iin+offset OFD) closer to the folding point corresponding to $FO_K$ and further away from the folding points corresponding to cells $FO_1 \ldots FO_{K-1}$. The leakage introduced by these cells $FO_1 \ldots FO_{K-1}$ will therefore decrease and this will improve the signal quality of the residue provided at the output of $FO_K$. The higher Idc in the first cells $FO_1 \ldots FO_{K-1}$ greatly improves their speed. $FO_K$ is still slow very near its folding point. If due to that bit K is detected incorrectly at first, and OFD is applied in the wrong direction, the input signal is in such a case so close to the folding point of $FO_K$ (and sufficiently far away from the folding points corresponding to cells $FO_1 \ldots FO_{K-1}$) that applying the small differential offset OFD should not affect the signal quality of the residue. In this example, the digital outputs of $FO_1 \ldots FO_K$ should be re-evaluated in a second phase, for instance together with the least significant bits to guarantee correct bit information. In conclusion, providing feedback by applying a small differential offset OFD to the folder input based on the most significant bits allows to operate folding cells at higher speed while maintaining the required accuracy. This is new and is a further object of the invention. This principle can be used for a pipelined converter to provide a sufficiently accurate residue for determining the least significant bits, or just to increase the speed of the overall converter. In the latter case Idc in the last folding cell $FO_K$ can be increased, since it is the last cell, and the residue it provides is not used.

Figure 48:
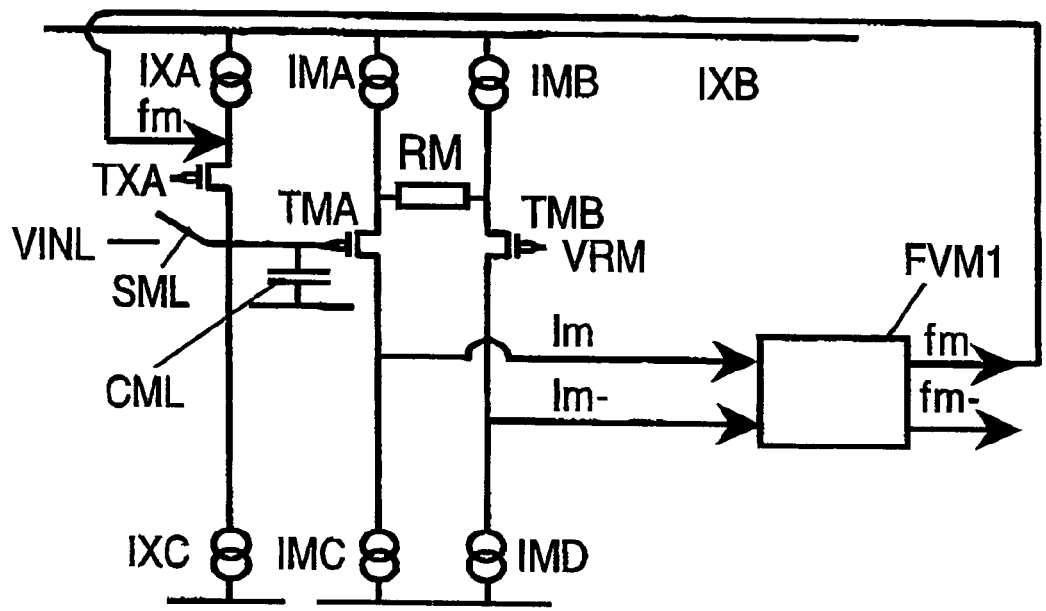
FIG. 48 illustrates how the current of the a current folder can be fed back to the inputs of a transconductor driving the current folder to obtain a multilevel memory or a self-latching analog-to-digital converter.
Figure 49:
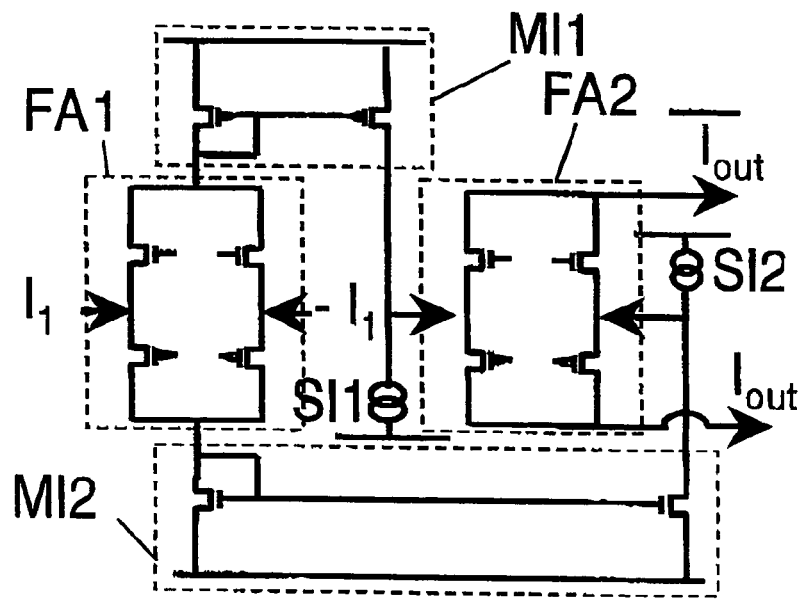
FIG. 49 shows one example of how gain can be applied in between consecutive stages of a cascade of current folding cells.

The folding circuits described here transform input signals in folded signals with positive and negative slopes. This change of sign of slopes can be used advantageously to obtain negative dynamic resistances, useful in the construction of memories and oscillators. Note that this principle can also be applied to other folding circuits than the ones proposed here. An example of this is shown in FIG. 48, where the current inputs Im and Im− of a current folder FVM1 are driven by a transconductor formed by 2 transistors TMA and TMB and a resistor RM connecting the sources of TMA and TMB. Current sources IMA and IMB provide current to the sources of TMA and TMB. The gates of TMA and TMB form the inputs of the transconductor. The gate of TMB in this example is connected to a reference voltage VRM. The drains of the TMA and TMB are linked to Im and Im−, respectively. Current sources IMC and IMD provide the desired offset current for Im and Im−. The first input voltage VINL can be connected to the gate of TMA by means of the switch SML. A capacitance CML to ground is associated with the gate of TMA. The first current output of the folder fm is fed back to the gate of TMA by means of a cascode circuit consisting of transistor TXA, a current source IXA providing the bias for TXA in combination with the gate voltage of TXA. fm is linked to the source of TXA. The drain of TXA is linked to gate of TMA, and a current source IXC provides an appropriate offset current for the current delivered by IXA. First the switch SML is closed and VINL is applied to the gate of TMA. The transconductor applies current to the folder which provides feedback to the input through fm and the cascode circuit, but VINL is imposed by a low impedance source which absorbs the feedback signal. However, when the switch is closed, the feedback is allowed to act and the circuit will settle to the situation where no net current is delivered to the gate of TMA. Since the folder FVM1 provides 2 to the power N line segments with alternating slopes there are 2 to the power N−1 stable states possible. So this circuit is a multilevel memory, and in fact if the folder is allowed to stabilize before the input is taken away, the multilevel memory will settle to the stable state associated with the input voltage interval VINL is belonging to (the full input range will consist of 2 to the power N−1 such intervals each corresponding to two line segments), and can then through comparators in the folder immediately provide the digital output corresponding to this state. Therefore this circuit is then a self-latching analog-to-digital converter. It allows to make the folder settle to a value not too close to any of the folding points providing large signals for the inputs of the comparators. This can be a considerable advantage: it eases the requirements on the comparators, and allows to obtain clean signals quickly which can be used to control other parts of the circuit. The use of feedback from the output of a folder containing several serial folding stages in an analog-to-digital converter back to the input of the folder is new and is therefore another object of the invention.

In another embodiment of the same principle the folder FVM1 would be allowed to settle prior to the application of the feedback provided by fm. Switches would direct the output of the cascode circuit in FIG. 48 to a current sink first, so this output would be isolated at first from the gate of TMA. Some time would be allowed to pass after the application of VINL to the gate of TMA, and after opening of the sampling switch SML. This time would allow the folder FVM1 to settle prior to the application of the feedback provided by fm. Only after this time the previously mentioned switches would link the output of the cascode circuit to the gate of TMA to close the feedback loop. This way VINL can be sampled quickly onto the capacitor CML, allowing for a much higher input bandwidth, while the folder itself is given some time to settle before the feedback is applied.

Several variants to this principle can be found, in the example the feedback applied to the transconductor was single-ended. A differential scheme is possible as well, assuming appropriate common mode feedback is provided. One can also insert amplifiers in the feedback loop for more gain in the feedback loop. The previous examples concerned a memory with stable states. To obtain stable states the circuit has to be designed to have sufficient phase margin using techniques known to people skilled in the art, otherwise oscillation will occur. In some cases an oscillator is needed, which then can be obtained using the same principle by decreasing the phase margin.

The folders introduced here allow to obtain a large number of folds (2 to the power N for N stages) in the output signal. If a time-varying signal spanning a large fraction of the input range is applied to a folder introduced in this invention and assuming the bandwidth of the folder is sufficiently high, the frequency content of the output signal can be severely increased. These folders can therefore be used in frequency multipliers.

A gain stage can be inserted in between some of the stages in the cascade of current folding cells to increase the conversion speed. This is illustrated in FIG. 48 where current mirrors MI1 and MI2 are used to amplify the current: the first output of a first folding cell FA1 is presented to the diode-connected transistor of a first current mirror MI1, and the second output of the first folding cell FA1 to the diode-connected transistor of a second current mirror MI2. MI1 and MI2 amplify these output currents and present the result to the inputs of a second folding cell FA2. A first current source SI1 and a second current source SI2 provide the desired current offset to the first and second input of the folding cell FA2, respectively. The advantage of such schemes is that the currents in the stages subsequent to the gain stage are increased yielding a higher bandwidth for those stages. The disadvantage—as is the case for the current mirrors—is that mismatch in the gain stage is introduced. This mismatch has to be sufficiently small to match the resolution specification of the converter, and this might lead to the requirement for large devices, which would slow down the gain stage. An alternative solution is to use corrective feedback as described above to either cancel or reduce the introduced mismatch.

A further object of the invention is that the current outputs of the current folding cell can be used to directly determine the value of bits less significant than the one determined in the current folding cell itself. This is illustrated by an example in FIG. 48. In the example, the output current of one of the outputs of the folding cell FOI1 (which can be the last folding cell in a cascade of folding cells) is presented to a resistor RI1 linked by its other terminal to the supply. The voltage developed across this resistor is compared to several—in this example four—reference voltages Vrf1 . . . Vrf4, by means of comparators COI1 . . . COI4. One possible way to generate the reference voltages used for this purpose is illustrated in the figure. A reference current $I_{ref}$ is injected into a series string of four resistors Rf1 . . . Rf4. Iref is injected into the first terminal of Rf4, the remaining terminal of Rf1 is linked to the supply also connected to RI1. The voltages developed at the terminals of the resistors are the reference voltages Vrf1 . . . Vrf4 for the voltage comparators. If the value of the resistors Rf1 . . . Rf4 in the series string and are chosen to be the resistance of RI1, the comparators will detect whether the output current of the folding cell is smaller or larger than $I_{ref}$, $2*I_{ref}$, $3*I_{ref}$ and $4*I_{ref}$, respectively.

Figure 50:
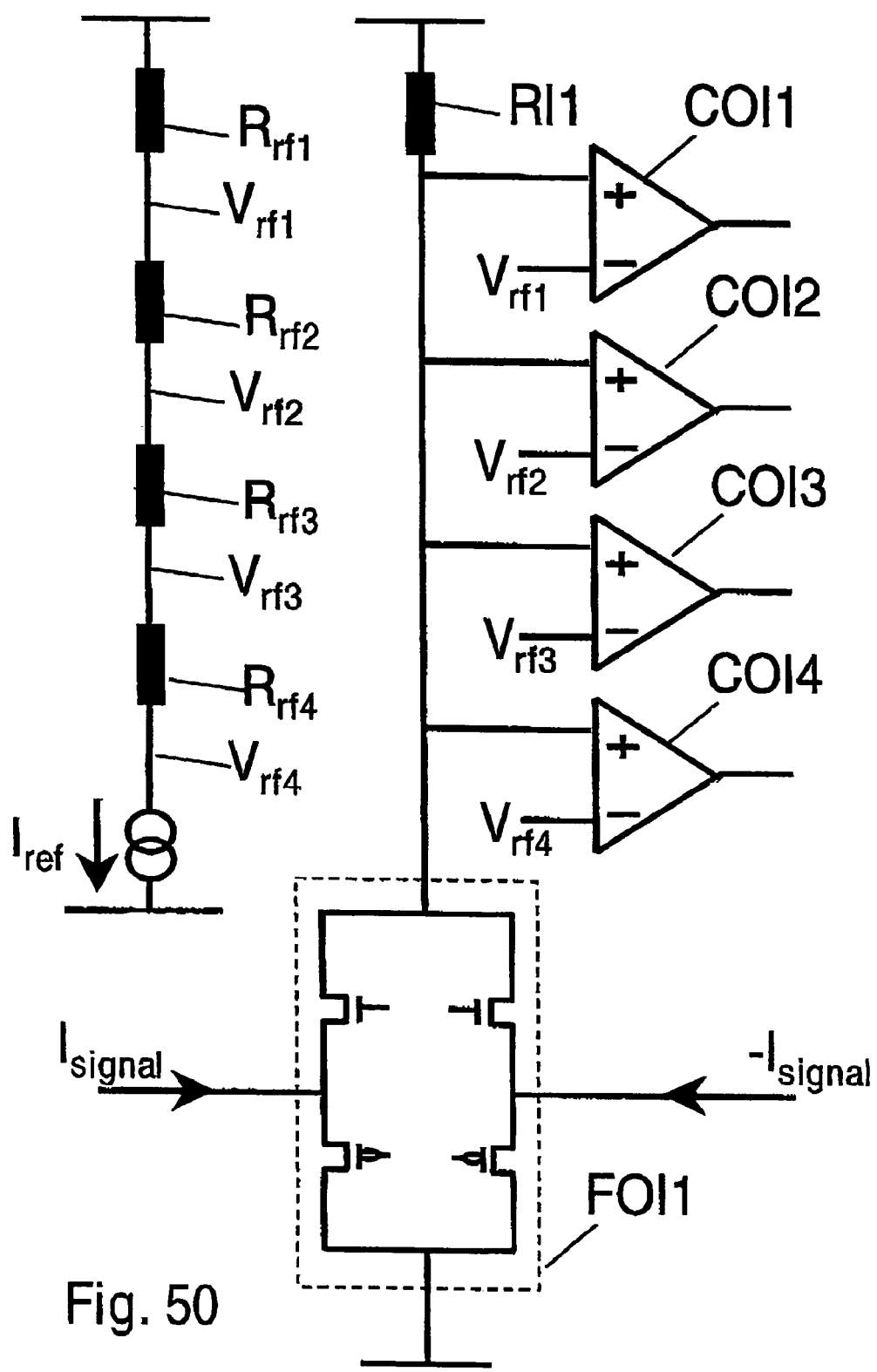
FIG. 50 gives an example of how one of the output currents of the novel current folding cell can be used for determination of the least significant bits by means of a flash converter.
Figure 51:
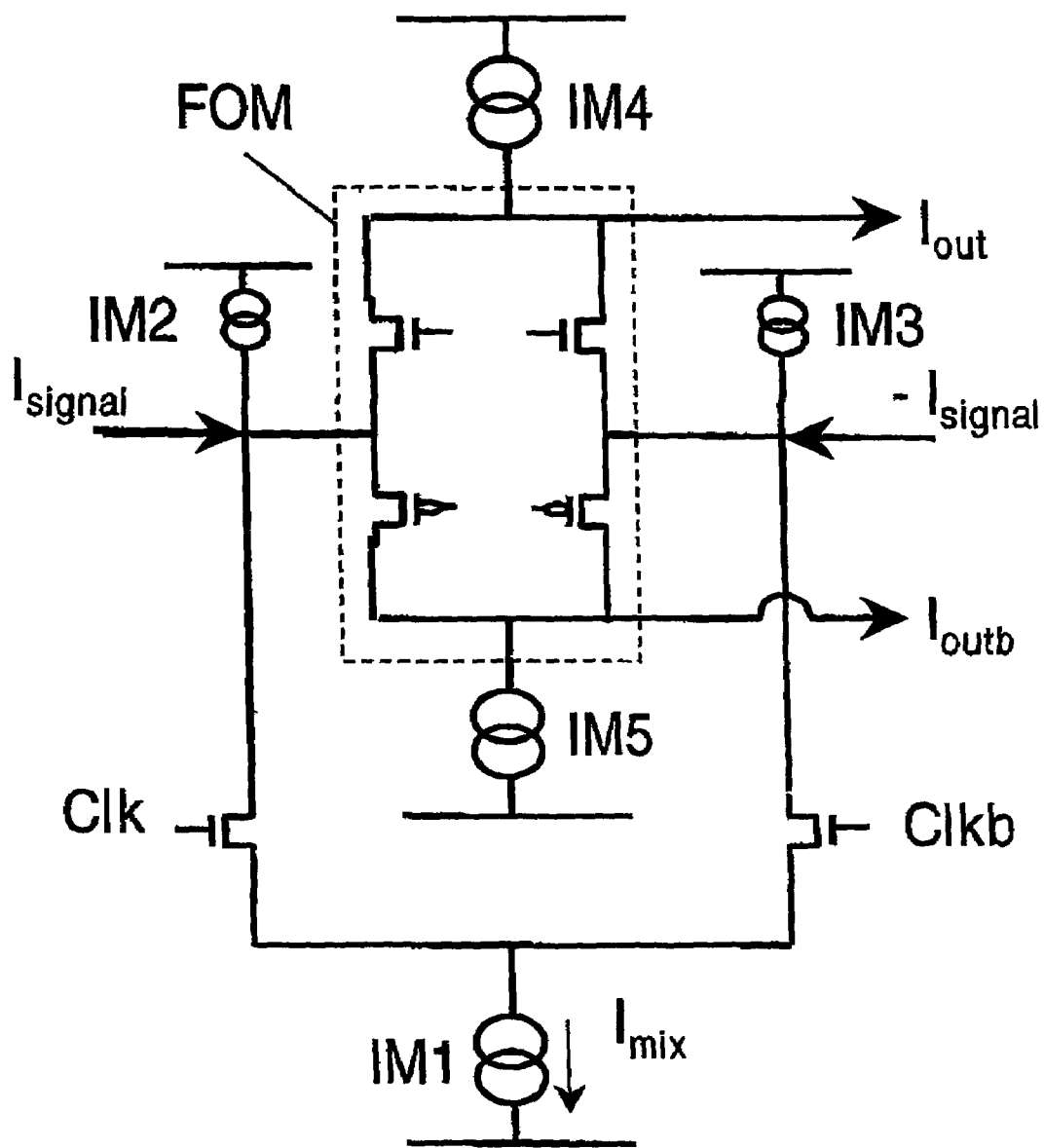
FIG. 51 illustrates one example of how a current mode mixer based on the novel current folding cell.

So far, current folding cells and their use for analog-to-digital converters have been discussed. However, these current folding cells can also be advantageously used for mixers. An example of this is shown in FIG. 50, where in addition to a signal current $I_{signal}$ at the first input and a signal current $-I_{signal}$ at the second input of a current folding cell FOM a current $I_{mix}$ is applied which alternates between the two inputs. $I_{mix}$ is provided by a differential pair biased by a first current source IM1 delivering $I_{mix}$, and controlled by Clk and Clkb effectively switching $I_{mix}$ between the first and the second input of the folding cell FOM. Clkb is opposite in phase to Clk. Appropriate offset currents are provided these inputs by means of the current sources IM2 and IM3, respectively. If $I_{mix}$ is larger than twice the range of the signal current, and IM2 and IM3 each deliver a current Imix/2, the signals Clk and Clkb will determine which of the two input signal currents is transferred to the first and the second output of the folding cell. The advantage of this cell is that there only is a transfer of the signal current from one of the two outputs to the other and back as the clock alternates. There is no signal transformation as for instance a current-to-voltage conversion and back, which would be dependent on component non-idealities and mismatch. In addition, such a mixer circuit could be linked directly to an analog-to-digital converter as previously described so that the full chain could fully operate on current minimizing the signal distortion.

Figure 52:
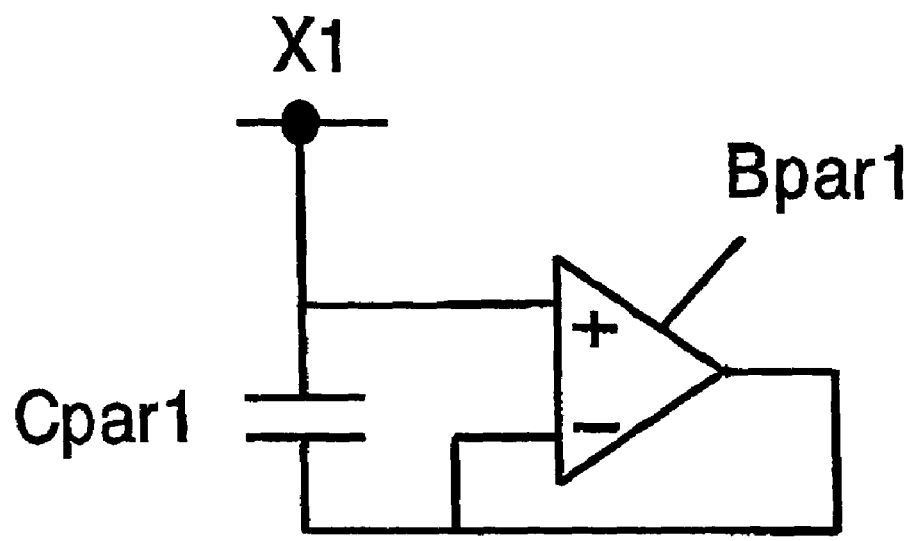
FIG. 52 shows a prior art schematic used to limit the influence of the parasitic capacitance $C_{par}$ on the node X1.

The novel current folding cell introduced here allows the implementation of an analog-to-digital converter with a very limited number of components. This allows the introduction of some additional circuit to compensate for or severely reduce the influence of parasitic capacitances in the current path of the time-varying signals. FIG. 52 shows a prior art circuit to reduce the influence of a parasitic capacitance $C_{par1}$ linked to the node X1. The output of the buffer Bpar1 in the circuit, which is connected to the other electrode of the parasitic capacitance $C_{par1}$, ideally follows the potential of the node X1, effectively reducing the capacitive current through $C_{par1}$ to zero. In practice, the buffer is not infinitely fast, nor does it have an infinitely high loop gain, both resulting in its output only approximately following the input. This will result in a beneficial reduction of the capacitive current in $C_{par1}$, but not in a full cancellation.

Figure 53:
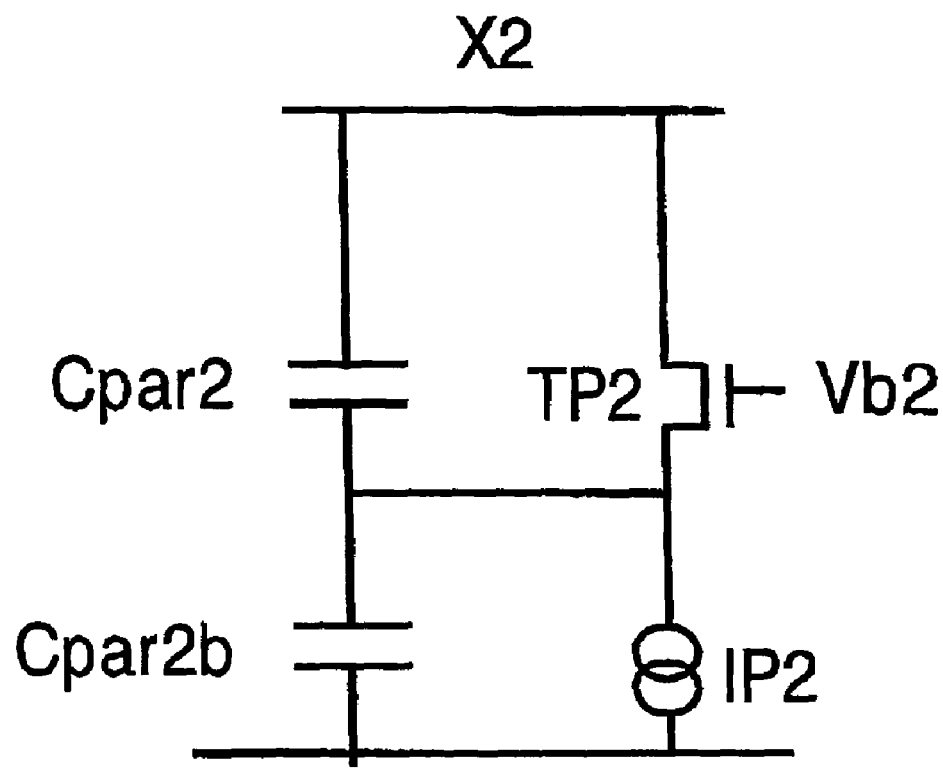
FIG. 53 shows an embodiment of another arrangement to limit the influence of the parasitic capacitance $C_{par2}$ on the node X2.

FIG. 53 shows an alternate circuit which has the same purpose. Here the capacitive current through a parasitic capacitance $C_{par2}$ between the node X2 and the source of a cascode transistor TP2 is fed back to the node X2 by means of this cascode transistor TP2 with its drain connected to X2. The bias for TP2 is provided by a current source IP2 and a gate bias Vb2. Some parasitic capacitance Cpar2b to ground might be present at the source of TP2. The cascode transistor TP2 will try to maintain a constant voltage on its source, and will therefore try to transfer any current it receives on its source to its drain. Note that here the capacitive current through $C_{par2}$ is not reduced. It is only directly fed back to the node X2, which therefore will see a reduction of its capacitive load due to the cancellation of the capacitive current through $C_{par2}$ by the drain current of the cascode transistor TP2. Also here there are practical limitations, which will result in only a beneficial reduction and not a full cancellation of the capacitive load on X2 represented by the parasitic capacitance $C_{par2}$.

Figure 54:
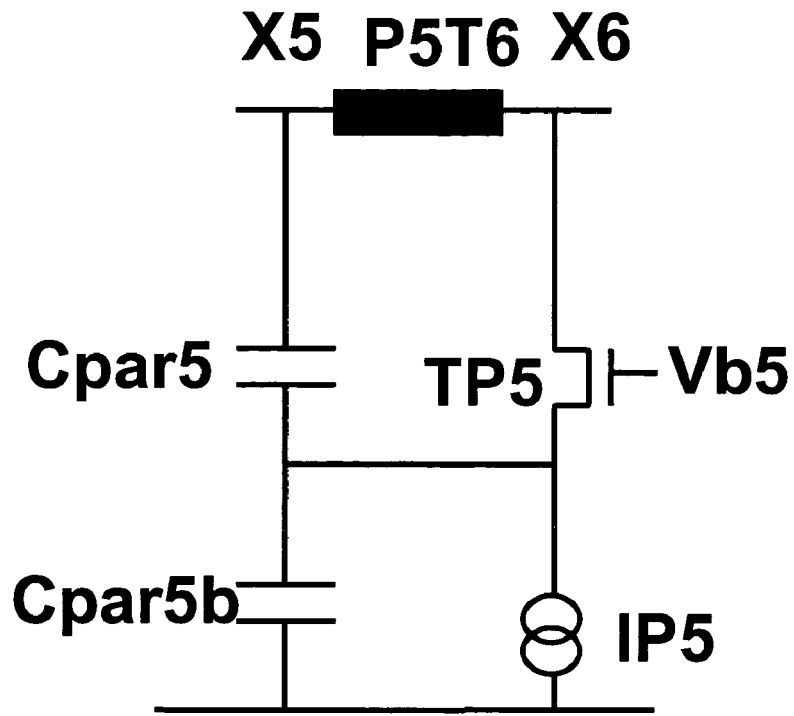
FIG. 54 shows an embodiment of a novel arrangement for a current processing circuit to limit the influence of parasitic capacitance.

The circuits previously shown cancelled the capacitive current of a node at the node itself. In a current processing circuit this is not always necessary nor convenient. It can be sufficient to re-inject the capacitive current into a different node along the same current path. Note that this is not only applicable to current folding cells but more generally to current processing circuits. FIG. 54 shows an example of this. In the figure, there is some current conducting element P5T6 in the current path between the node X5 and the node X6. The capacitive current through a parasitic capacitance $C_{par5}$ on node X5 is re-injected into X6 through the cascode transistor TP5 with its drain connected to X6. This transistor is biased by a current source IP5 and a gate bias Vb5. Some additional parasitic capacitance Cpar5b can be associated with the source node of the cascode transistor. This circuit can be used if the potential of the other electrode of $C_{par5}$ is allowed to move.

Figure 55:
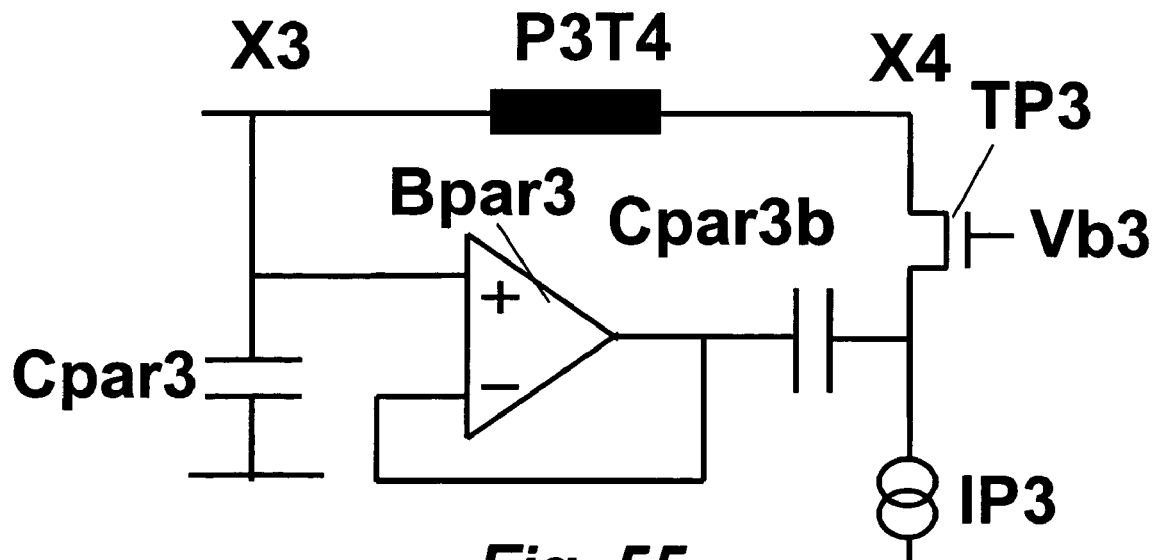
FIG. 55 shows another embodiment of such arrangement for a current processing circuit to limit the influence of parasitic capacitance.

FIG. 55 illustrates a circuit using a buffer, allowing the circuit to be used even if the potential of the other electrode of the parasitic capacitance has to be kept at a well-determined potential. In the figure, there is some current conducting element P3T4 between the node X3 and the node X4 in the current path containing the nodes X3 and X4. The node X3 in a current path is loaded by a parasitic capacitance $C_{par3}$ between X3 and a node at this previously mentioned well-determined potential. The output of the buffer Bpar3 follows the potential of X3. A capacitor $C_{par3b}$ is provided between the buffer output and the source of a cascode transistor TP3, connected with its drain to a node X6, and biased by a current source IP3 and a gate bias Vb3. The capacitive current through the capacitor $C_{par3b}$ ideally equal to $C_{par3}$ is re-injected back into the node X4, but with the opposite sign, effectively cancelling the capacitive current through $C_{par3}$ for the current continuing from node X4 further along the current path. In practice, the capacitive current is not perfectly cancelled due to the non-idealities in the buffer and in the matching off between $C_{par3}$ and $C_{par3b}$.

Note that the unity gain buffer can be replaced by a non-inverting amplifier with a gain different from 1 if then the value of $C_{par3b}$ is adjusted to match the cancelling current to the original capacitive current. The capacitive current can also be measured by a charge amplifier and re-injected with the opposite sign into the node loaded by the parasitic capacitance or a node along the same current path, provided the other electrode of the parasitic capacitance is allowed to move.

Figure 56:
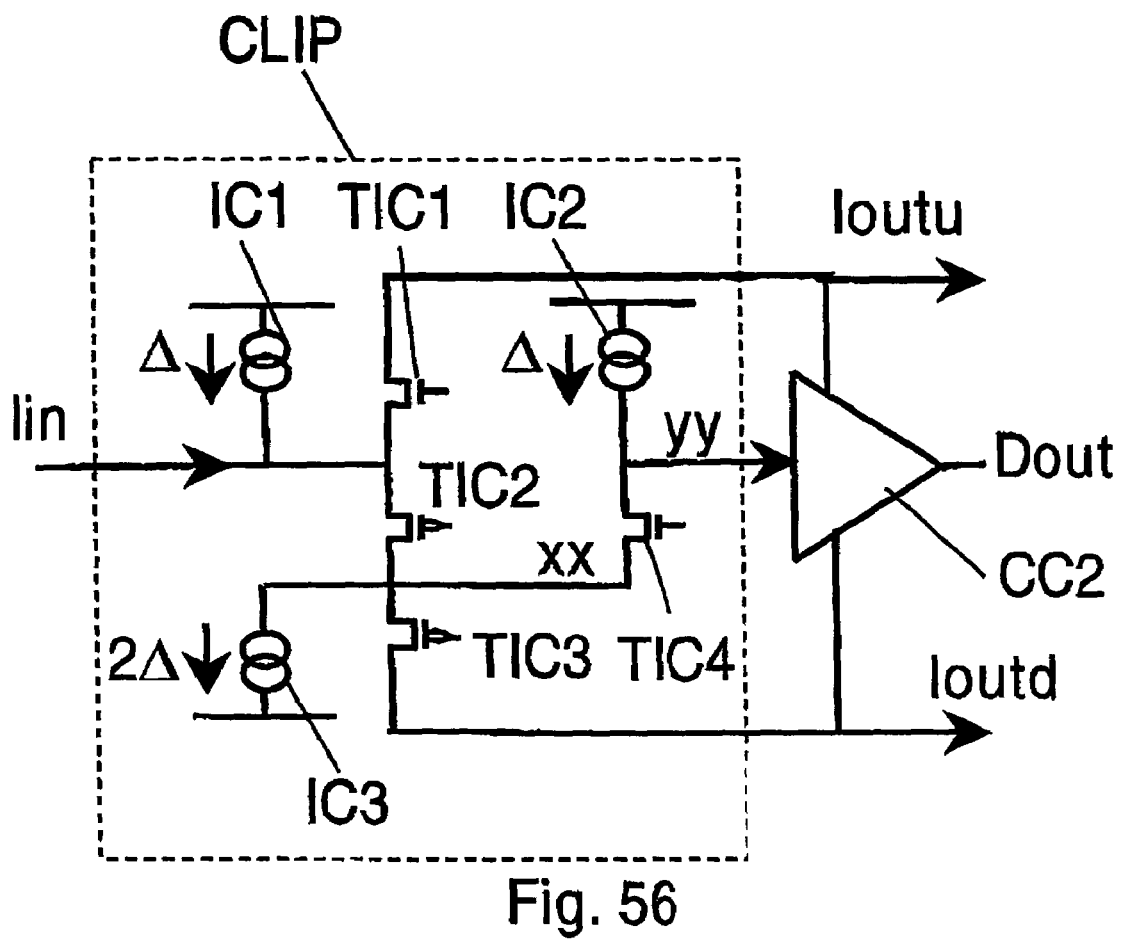
FIG. 56 shows an embodiment of a new way to increase the maximum input current range of a current comparator while maintaining its current resolution without severely deteriorating its speed.

All current comparators are subject to a trade-off in speed, maximum current range and minimum current resolution. It is another aspect of the invention described here that the maximum current range can be decoupled from the minimum current resolution, and that this provides a speed advantage as well. This decoupling can be achieved by first clipping the input current to limit its maximum range by means of a coarse comparison, and presenting the resulting signal of reduced range to a current comparator for fine comparison. An embodiment of this is shown in FIG. 56. The clipping of the current is carried out by a circuit CLIP as follows: first an offset current $\Delta$ is added to the input current by means of a current source IC1. The resulting current is presented to a cell of the type C1 as shown in FIG. 4 or 5 (FIG. 56 shows the transistors TIC1 and TIC2 explicitly, the biasing of the gates of these current absorbing transistors can be done in a way similar to what is shown in FIG. 3). If Iin+$\Delta$ has one sign (negative according to our convention where the current is positive in the direction of the arrows), the NMOS transistor TIC1 linked to the current input will absorb this Iin+$\Delta$ signal, and directly transfer it to the Ioutu terminal. If not, if Iin+$\Delta$ is positive, it will be transferred to the node xx by TIC2, where a current 2$\Delta$ is subtracted (by adding it with the opposite sign) from it by means of the current source IC3, resulting in a signal Iin−$\Delta$. The node xx is the input of yet another cell of the type C1 shown in FIG. 3, formed by the transistors TIC3 and TIC4. If this signal Iin−$\Delta$ is positive, it will be directly transferred to the Ioutd terminal by the PMOS transistor TIC3. If the signal Iin−$\Delta$ at xx is negative it will be transferred to the input yy of the current comparator CC2 (here as an example shown in the particular embodiment of FIGS. 4 and 5). At the comparator input yy a current $\Delta$ is added to Iin−$\Delta$, resulting in Iin again. However, Iin will only reach the comparator input if it is in between −$\Delta$ and +$\Delta$, so the comparator input signal is a clipped version of Iin. If the input current to the comparator is positive it will be transferred to Ioutd and if it is negative it will be transferred to Ioutu. In fact, due to the transfer of the clipped signals to the Ioutu and Ioutd terminals, the circuit in FIG. 56 always transfers Iin to the Ioutu terminal if Iin is negative and to Ioutd terminal if Iin is positive, even if the Iin signal is outside of the −$\Delta$ to +$\Delta$ range. Therefore the circuit in FIG. 56 provides the same signals at the Ioutu and Ioutd terminals as if the input signal was applied directly to a cell C2 of FIG. 4 or 5, but the difference is here that the fine comparison is carried out on a signal of reduced range. This allows to use smaller components in the comparator carrying out this fine comparison, and hence a higher speed for the same power consumption or a lower power consumption for the same performance due to the smaller parasitic capacitances. The clipping and addition of the currents are carried out in this embodiment without a current-to-voltage conversion and subsequent voltage-to-current conversion, and is therefore not subject to errors introduced by mismatch. The clipping can be applied in general to all current comparators and current folding cells.

Figure 57:
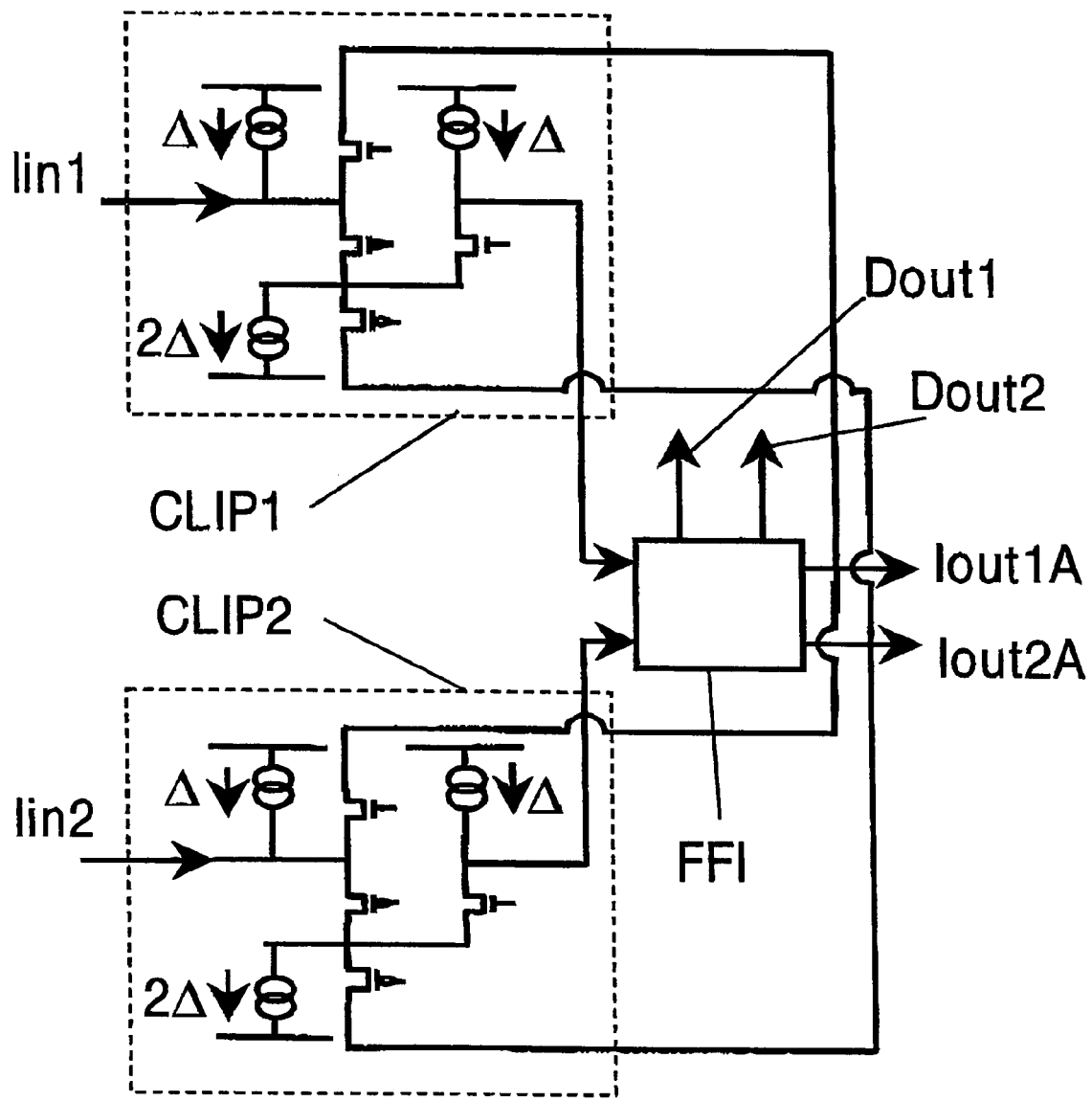
FIG. 57 shows an embodiment of how the maximum input current range of the new current folding cell can be increased while maintaining its current resolution without severely deteriorating its speed.

FIG. 57 shows an embodiment of how the same principle can be applied to construct a new current folding cell with a large maximum input current range while maintaining the same minimum current resolution without severely deteriorating its speed-power performance. Here a clipping circuit CLIP1 as detailed in FIG. 56 is provided for the first input, and a second clipping circuit CLIP2 is provided for the second input of the folding cell. If the input currents exceed the magnitude defined by the offset $\Delta$ in CLIP1 and CLIP2 the current is transferred directly to the current outputs. If the input currents fall within the range defined by $\Delta$ the currents are presented to the folding cell FFI of the type shown in FIG. 10. This cell FFI can then be allowed to have only a limited current input range. In fact the full circuit of FIG. 57 is an example of a more complex embodiment of the folding cell introduced in this invention.

Figure 58:
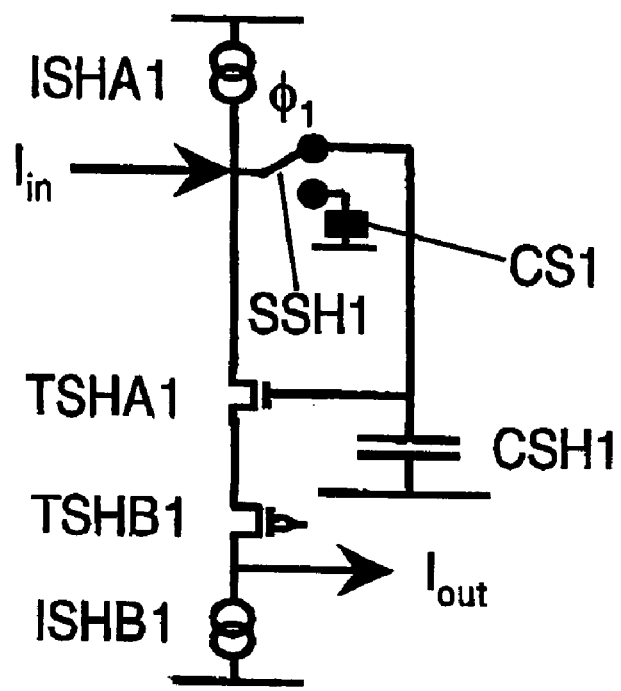
FIG. 58 shows an embodiment of a new current sample-and-hold or track-and-hold circuit which does not introduce a difference between input and output current due to mismatch and which allows to track or sample the input current while providing a meaningful output current.

In prior art current sample-and-hold or track-and-hold circuits the current to be sampled or tracked is injected into a device or circuit, for instance a transistor, which converts the current in a voltage which can be stored on a capacitor, and which transfers this input current to a fixed potential or a terminal where this current is lost for further use. Another aspect of the invention is that the device or circuit into which the input current is injected to convert it to a voltage for storage can transfer this current to a terminal where it can be further used. An embodiment of this is shown in FIG. 58: during tracking or sampling of the input current Iin the switch SSH1 connects the input terminal to the gate of the NMOS transistor TSHA1 of which the voltage gets adjusted for this NMOS transistor TSHA1 to absorb the input current Iin in addition to a bias current provided by a current source ISHA1. The source of the NMOS transistor TSHA1 is linked to the source of a PMOS transistor TSHB1, so that the input current is transferred to this PMOS transistor TSHB1 and made available at the drain of this PMOS transistor TSHB1. At this drain another current source ISHB1 provides a biasing current sufficiently large for the PMOS transistor TSHB1 to remain in saturation for the full input current range. So, while the input current is being sampled or tracked it continues to be available at the drain of TSHB1 for further use. In hold mode, the switch SSH1 is switched to link the input current terminal to a current sink and to isolate the gate of the NMOS transistor TSHA1. Assuming ideal conditions, due to the capacitance CSH1 associated with the gate of this NMOS transistor TSHA1, the gate of this NMOS transistor TSHA1 will be kept at the potential associated with the input current at the instant the switch SSH1 was switched. The current at the drain of the PMOS is the held or stored current, equal to the value of the input current when the switch was opened plus the value of the biasing current provided by ISHA1. In hold mode when the switch is open, the time varying input current is absorbed by a current sink CS1.

Figure 59:
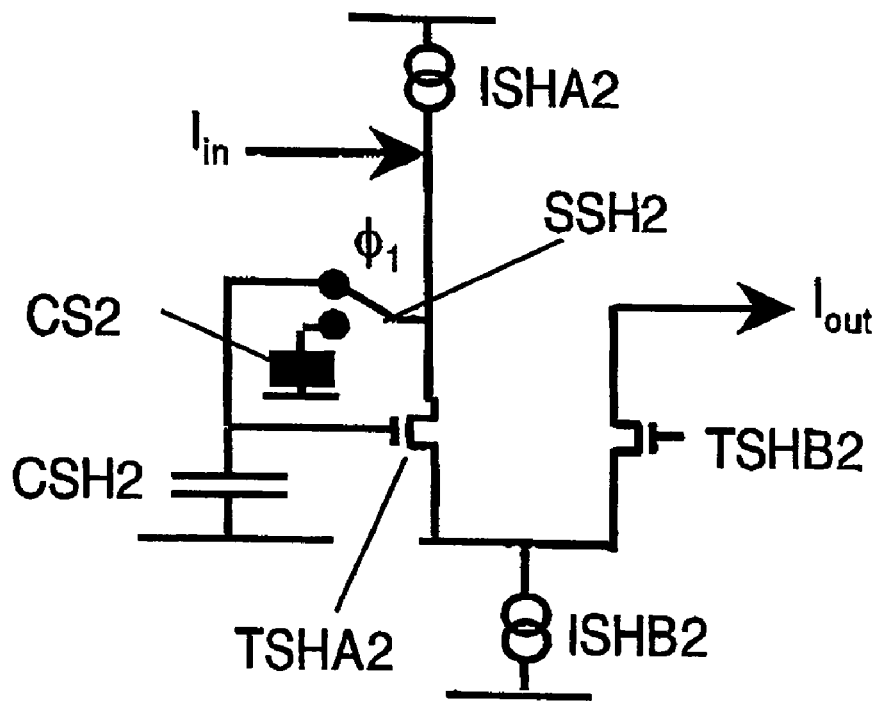
FIG. 59 shows another embodiment of the new current sample-and-hold or track-and-hold circuit with the same features.

FIG. 59 shows another embodiment of the same principle. During track mode the input current Iin is injected into one NMOS transistor TSHA2 of a differential pair of NMOS transistors TSHA2 and TSHB2. In addition to the input current, bias current is provided at the sources of the two transistors TSHA2 and TSHB2 of the differential pair by the current source ISHB2, and at the drain of TSHA2 by the current source ISHA2. During track or sample mode a switch SSH2 connects the input current terminal to the gate of the transistor TSHA2. A capacitance CSH2 is associated with the gate of this transistor TSHA2. During track or sample mode the potential of the gate of TSHA2 is adjusted so that the sum of the input current and the bias current provided by ISHA2 is absorbed by TSHA2. TSHA2 transfers this current to TSHB2 so that the sum of the input current Iin and the bias currents provided by ISHA2 and ISHB2 is available at the drain of the second NMOS transistor TSHB2. To change from track mode to hold mode, the switch SSH2 is switched to link the input current terminal to a current sink and to isolate the gate of TSHA2. Under ideal conditions the storage capacitor CSH2 associated with the gate of this transistor TSHA2 keeps the potential of the gate of the transistor TSHA2 at the value of the instant when the switch SSH2 was opened. During hold mode the current at the drain of this second NMOS transistor TSHB2 is equal to sum of the value of the input current Iin when the switch SSH2 was opened and of the bias currents provided by ISHA2 and ISHB2.

Using such a current sample-and-hold or track-and-hold circuit for providing input currents to the above described cascade of folding cells allows to provide meaningful current to the folders while the input is being sampled. If the analog-to-digital converter comprises a plurality of cascades of folding cells in parallel, this sample-and-hold or track-and-hold circuit can provide well-matched currents to the parallel folding cell cascades. This is further explained below.

Figure 60:
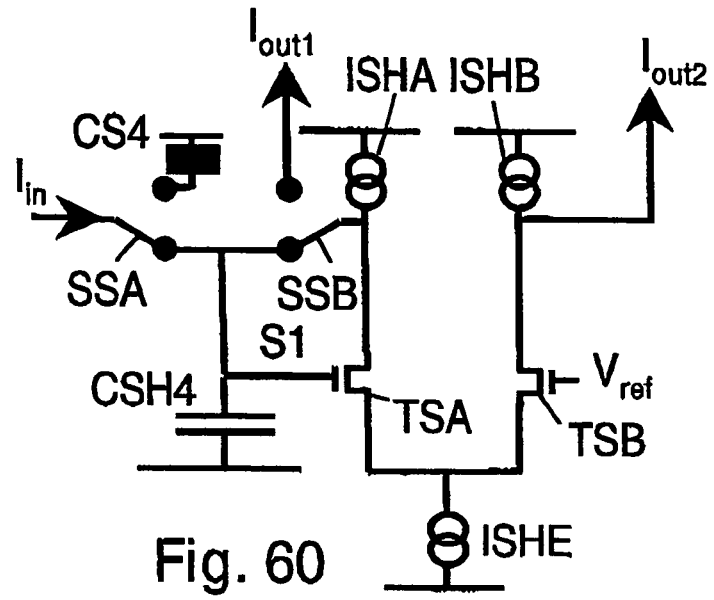
FIG. 60 shows an embodiment of the new current sample-and-hold or track-and-hold circuit which does not introduce a difference between input and output current due to mismatch and which provides more than one output current for a single input current.

FIG. 60 shows an embodiment of a sample-and-hold circuit where having a meaningful output during the sampling or tracking phase of the clock cycle was not desired, but where two output currents Iout1 and Iout2 are provided during the hold phase of the clock cycle for only one current input Iin. During the sample or track phase the input current is injected into a differential pair formed by two transistors TSA and TSB. The differential pair formed by TSA and TSB is biased by three current sources, ISHA, ISHB and ISHE, providing current to the drain of TSA, the drain of TSB, and the sources of TSA and TSB, respectively. A switch SSA connects the input terminal to the gate of the transistor TSA and a switch SSB connects the drain of TSA to the gate of TSA. A storage capacitor CSH4 is associated with the gate of the transistor TSA to form the storage node S1. A reference voltage Vref is connected to the gate of TSB. During the track or sample phase the voltage on the storage node S1 will be adjusted for the transistor TSA to absorb the sum of the input current Iin and the bias current ISHA. TSA will transfer this current sum to TSB, which will absorb in addition the current provided by ISHE. At the drain of TSB, the second output current is available as the sum of Iin and the current provided by the three current sources ISHA, ISHB and ISHE. During the transition from the track or sample phase to the hold phase, SSA will be switched to present Iin to a current sink CS4, and SSB will be switched to present the sum of the currents from ISHA and the drain of TSA to the first current output. This way the storage node S1 will be isolated, and under ideal conditions the storage capacitor CSH4 will keep the potential of the storage node S1 at the value of the moment of the transition from track or sample mode to hold mode. Since the current in the differential pair formed by TSA and TSB is controlled by the storage node S1 and Vref, the current in the differential pair will correspond to the current at the instant the transition between track or sample mode and hold mode was made. This implies that the drain of TSA will sink the sum of the input current at the transition instant and the current provided by ISHA, and that hence the value of the output current Iout1 is equal to Iin at moment of the transition from the track or sample mode to hold mode, but opposite in sign (the circuit to which Iout1 is presented will have to deliver the current sunk by the combination of TSA and ISHA). Neither of these two current outputs Iout1 and Iout2 is sensitive to mismatch of components controlled by a time-varying signal. The current sources feeding the two outputs and the differential pair are sensitive to mismatch but are not controlled by a time-varying signal. Therefore they can be designed to be relatively large for better matching without having to incur a speed penalty. Note that during the sampling or tracking phase Iout2 tracks the current input. It is therefore possible to cascade several sample-and-hold or track-and-hold circuits shown in FIG. 60, and generate a plurality of output currents from one current input.

Figure 61:
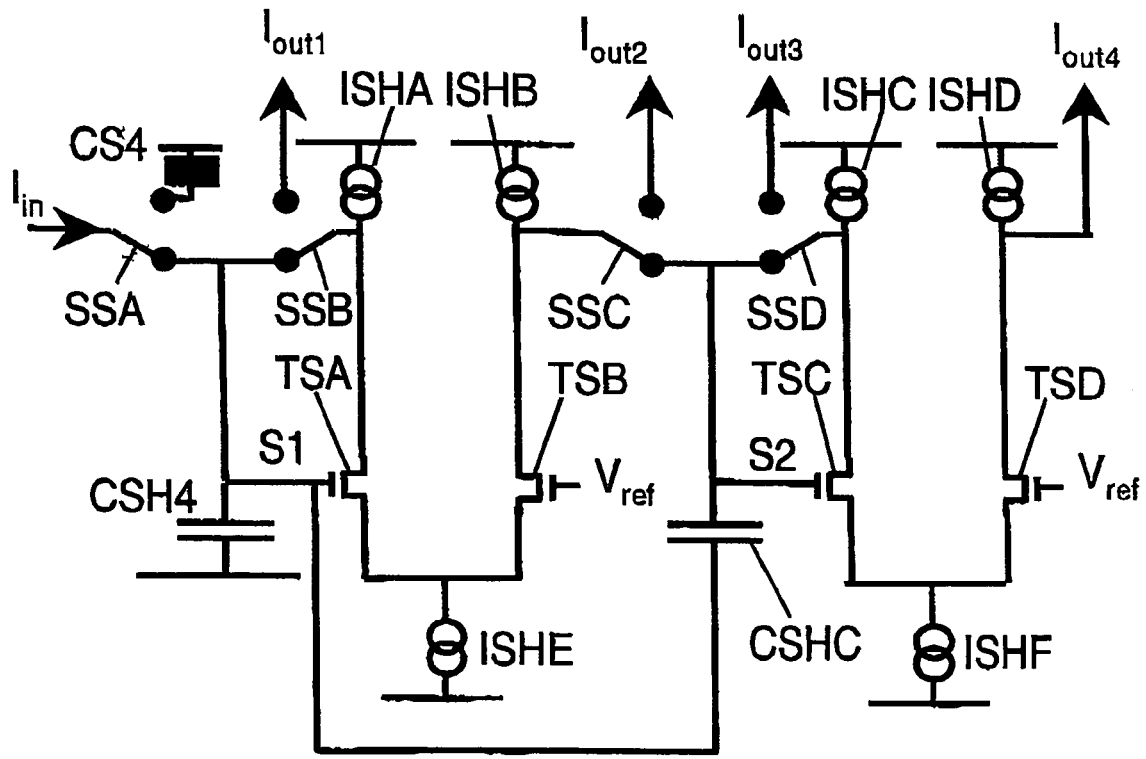
FIG. 61 shows an embodiment of a cascade of new current sample-and-hold or track-and-hold circuits. The cascade provides a plurality of output currents for one input current. The figure also illustrates capacitive coupling between storage nodes as a means to improve the speed/power performance of the overall circuit.

This is further illustrated in FIG. 61 where in addition to the first differential pair formed by TSA and TSB, biased by ISHA, ISHB and ISHE, a second differential pair is shown, formed by TSC and TSD, and biased in a similar way by ISHC, ISHD and ISHF. The gate of TSC with which a storage capacitor CSHC is associated, forms a second storage node S2. The gate of TSD is linked to the reference voltage Vref. The second output current of the differential pair formed by TSA and TSB at the drain of TSB forms the input current for the second differential pair formed by TSC and TSD and during sample or track mode a switch SSC connects the drain of TSB to the storage node S2, while a switch SSD connects the drain of TSC also to the storage node S2. As in FIG. 60, during the sample or track mode the input terminal and the drain of TSA are connected to the storage node S1 by means of the switches SSA and SSB. To transfer from sample or track mode to hold mode the four switches SSA . . . SSD are switched to isolate the two storage nodes S1 and S2, and to connect the drains of TSA . . . TSD to the four output current terminals Iout1 . . . Iout4. This way four output currents can be generated, or more, if more cells are put in cascade, from one input current, without being sensitive to mismatch of transistors which conduct a time-varying signal. In principle the storage capacitance CSHC associated with S2 could be between S2 and a fixed potential. However, as shown in the figure, CSHC can be between S1 and S2. This capacitive coupling of storage nodes provides a further speed and/or power improvement. In normal operation the storage node S2 will track the storage node S1. Therefore, this storage capacitor CSHC will not need much charging current to get charged to the right potential if it is in between S2 and S1. In principle, in the absence of mismatch between the different differential pairs and current sources, it would not need any charging current at all as S2 should track S1 for the second differential pair to absorb or deliver the same current as the first differential pair. As long as the storage capacitors are dominating the speed of the circuit, this capacitive coupling between storage nodes will improve the speed of the cascade of sample-and-hold or track-and-hold circuits by a factor roughly equal to the number of stages. This is a significant advantage and is therefore a further object of the invention. Note that this capacitive coupling between storage nodes to minimize charging current is not limited only to current sample-and-hold circuits, but can also be applied more generally, for instance in voltage sample-and-hold circuits.

The availability of more than one output current for one current input in a sample-and-hold or track-and-hold circuit is an important advantage here because the precision of the output currents is not affected by mismatch of components which are controlled by a time-varying signal. This allows the generation of accurately matched time-varying currents without having to drive large capacitances and will therefore result in a circuit offering a better power-speed tradeoff. These accurately matched currents can be used as inputs to one or more folders as shown in FIG. 32. The advantage of having multiple folders operating in parallel has been clearly explained before and is another aspect of the current invention.

Charge injection by switches in sample-and-hold or track-and-hold circuits is an important issue. The effect of this charge injection has been minimized in the past by compensating it using dummy switches driven by control signals with opposite polarity. Sometimes the switches have been operated inside a circuit which provided virtual ground at the terminals of the switches, and this to minimize input signal dependent charge injection.

Figure 62:
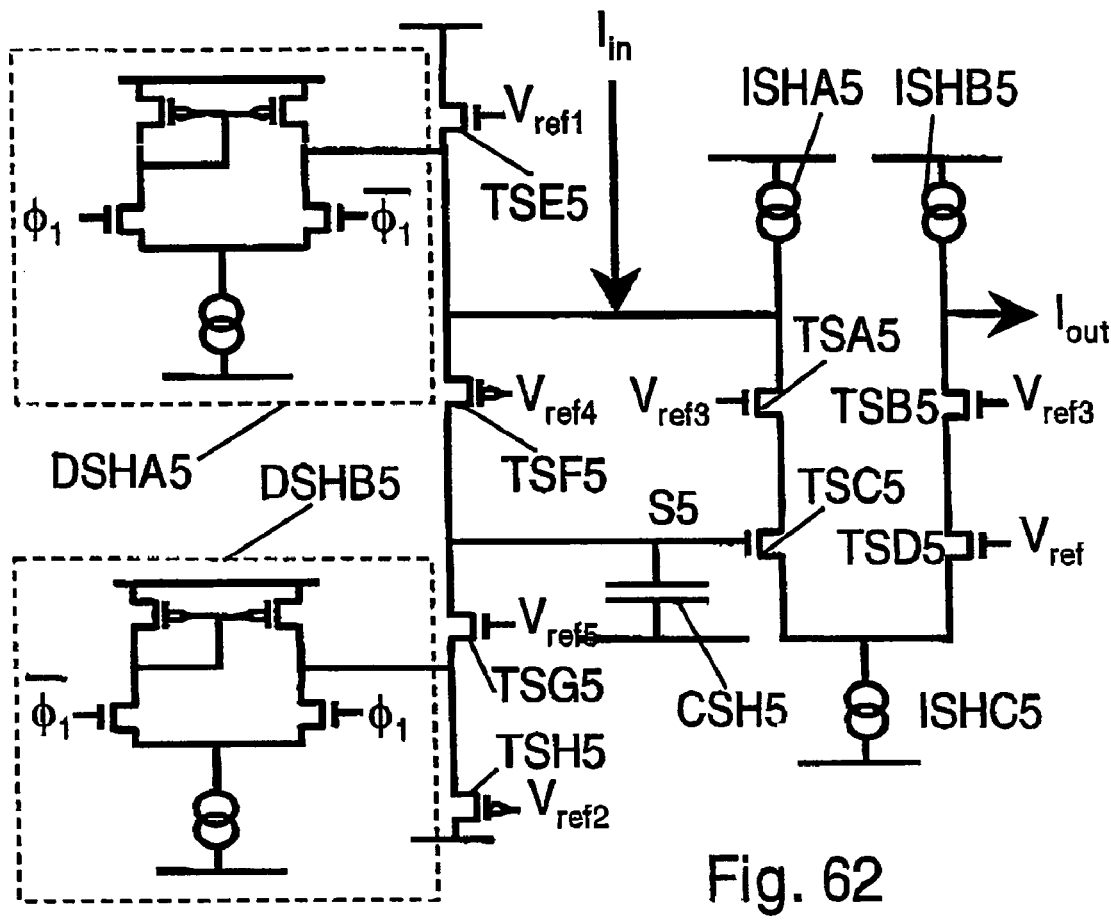
FIG. 62 shows an embodiment of how the new switch can be implemented for a current sample-and-hold or track-and-hold circuit.

FIG. 62 illustrates a way to implement a switch which inherently provides very low charge injection. The circuit shown is a current sample-and-hold or track-and-hold similar to the one shown in FIG. 59. The differential pair absorbing the current Iin during sample or track mode is formed by TSC5 and TSD5 and biased by the current sources ISHA5, ISHB5 and ISHC5. By way of example cascode transistors TSA5 and TSB5 with their gate biased by a fixed potential Vref3 are added at the drains of TSC5 and TSD5 to provide higher a higher output impedance for the differential pair. The gate of TSC5 with its associated capacitance CSH5 forms the storage node S5.

The switch has to connect the input current Iin to a current sink and has to isolate the storage node during the hold mode. These functions are implemented by means of two circuits DSHA5 and DSHB5 and four additional transistors TSE5, TSF5, TSG5 and TSH5. Each of the circuits DSHA5 and DSHB5 consist of an NMOS differential pair biased by a tail current source linked to the two sources of the NMOS transistors, and by a PMOS current mirror, which mirrors the current from one of the NMOS transistors to the drain of the other one to provide a single-ended current output for the differential pair. Each of these circuits DSHA5 and DSHB5 is controlled by two clock signals φ1 and φ1b, φ1b being of opposite phase as φ1. When these signals change phase the output current of DSHA5 and DSHB5 switches from the one extreme to the other and changes sign as well. The sum of the output current from DSHA5 and the input current Iin is injected into a first circuit of the type C1 of FIG. 3 consisting of an NMOS transistor TSE5 and a PMOS transistor TSF5. The output current of DSHB5 is injected into a second circuit of the type C1 in FIG. 3 consisting of an NMOS transistor TSG5 and PMOS transistor TSH5. The drain of TSE5 is connected to the power supply, and the drain of TSH5 to ground. The drains of TSF5 and TSG5 are connected to the storage node S5. The gates of TSE5 . . . TSH5 are biased by fixed potentials Vref1, Vref4, Vref5, and Vref2, respectively. These fixed potentials can be generated as shown in FIG. 3. During the sample or track phase φ1 is high and φ1b is low, and DSHA5 and DSHB5 controlled by φ1 and φ1b force the transistors TSE5 and TSH5 to be off, and TSF5 and TSG5 to be on. This way the storage node S5 will be influenced by the magnitude of Iin, as long as this magnitude of Iin remains smaller than the output current of DSHA5 so that TSF5 remains conductive during the track or sample phase. The potential of the storage node S5 will be adjusted such that the sum of the currents arriving at S5 equals zero. When φ1 goes low (and φ1b high) the circuit transits into hold mode: the output currents of DSHA5 and DSHB5 controlled by φ1 and φ1b reverse sign and cause the transistors TSF5 and TSG5 to turn off and TSE5 and TSH5 to turn on. This operation isolates the storage node S5 from its injecting currents and the charge on the capacitor CSH5 corresponds to the input current Iin at the moment the hold mode was initiated. The isolation of the storage node is provided by TSF5 and TSG5. The other function of the switch, i.e. the sinking of Iin, is provided by TSE5, which absorbs the sum of the input current Iin and the output of DSHA5 during hold mode. During the transition to, hold mode only the source of TSF5 and TSG5 was acted upon to push these transistors in cutoff. In principle, only a small fraction of the charge stored in the channel of those transistors is balanced by charge in the drain. Most of the channel charge is balanced by charge on the bulk and gate electrodes, both of which are at a fixed potential. During the transition to hold mode the channel charge is pulled out of the channel from the source side, and—provided the transition is carried out sufficiently fast—only a very small fraction of the channel charge should end up on the storage node. In fact, charge injection here should be dominated by source-drain capacitance, which can be minimized by layout. Implementing the switches in a sample-and-hold or track-and-hold by only acting on the source of the switches is new and minimizes charge injection, can be implemented by current folding and therefore is another aspect of the invention.

Figure 63:
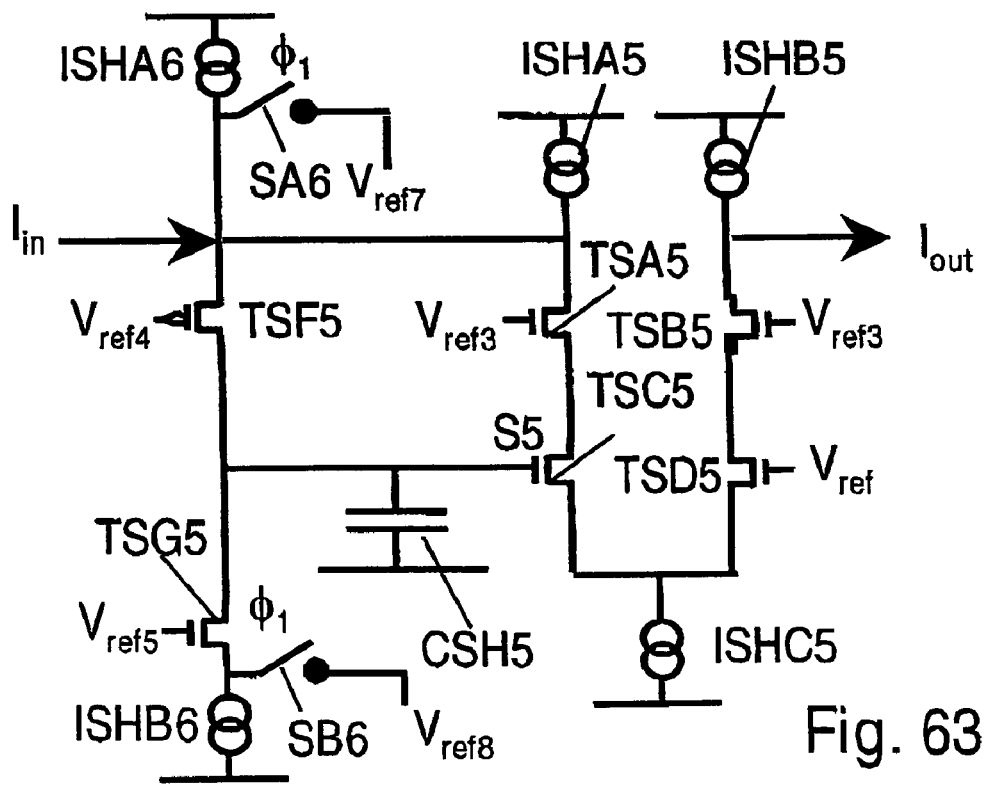
FIG. 63 shows another embodiment of the new switch inside a current sample-and-hold or track-and-hold circuit.

An alternate way to push the transistors TSF5 and TSG5 into cutoff at the transition in hold mode is shown in FIG. 63. Here traditional switches SA6 and SB6 are used to connect the sources of TSF5 and TSG5 to reference potentials Vref7 and Vref8 during the hold mode. During the track or sample mode SA6 and SB6 are open and current sources ISHA6 and ISHB6 provide current to TSF5 and TSG5 to guarantee they conduct. In case the current delivered by ISHA6 is balanced by ISHB6, the potential on the storage node S5 will be adjusted such that Iin is fully absorbed by the differential pair formed by TSC5 and TSD5. At the transition from sample or track mode to hold mode the switches SA6 and SB6 close forcing the sources of TSF5 and TSG5 to the reference potentials Vref7 and Vref8, which are such that TSF5 and TSG5 are pushed into cutoff to isolate the storage node S5. Note that the switches providing the isolation of the storage node S5 are the transistors TSF5 and TSG5 and not the switches SA6 and SB6.

FIGS. 62 and 63 were examples of how these new switches could be implemented for a current sample-and-hold or track-and-hold circuit. The storage node of a voltage sample-and-hold or track-and-hold can also be isolated during the hold phase using the same principle. This is illustrated for two different examples in FIGS. 64 and 65. In both figures the storage node S7 is isolated or not by means of the PMOS transistor TSA7 and the NMOS transistor TSB7 of which the drains are connected to the storage node S7. During track or sample mode current sources ISHA7 and ISHA8 guarantee conduction for these transistors TSA7 and TSB7. When the circuit transits from sample or track mode into hold mode, two switches SA7 and SB7 force the sources of these two transistors to fixed potentials Vref9 and Vref10 to force these transistors into cutoff to isolate the storage node S7. The operation of this part of the circuit is the same as for the current sample and hold of FIG. 63 with the transistors TSF5 and TSG5, the current sources ISHA6 and ISHB6, the switches SA6 and SB6, and the reference potentials Vref7 and Vref8.

Figure 64:
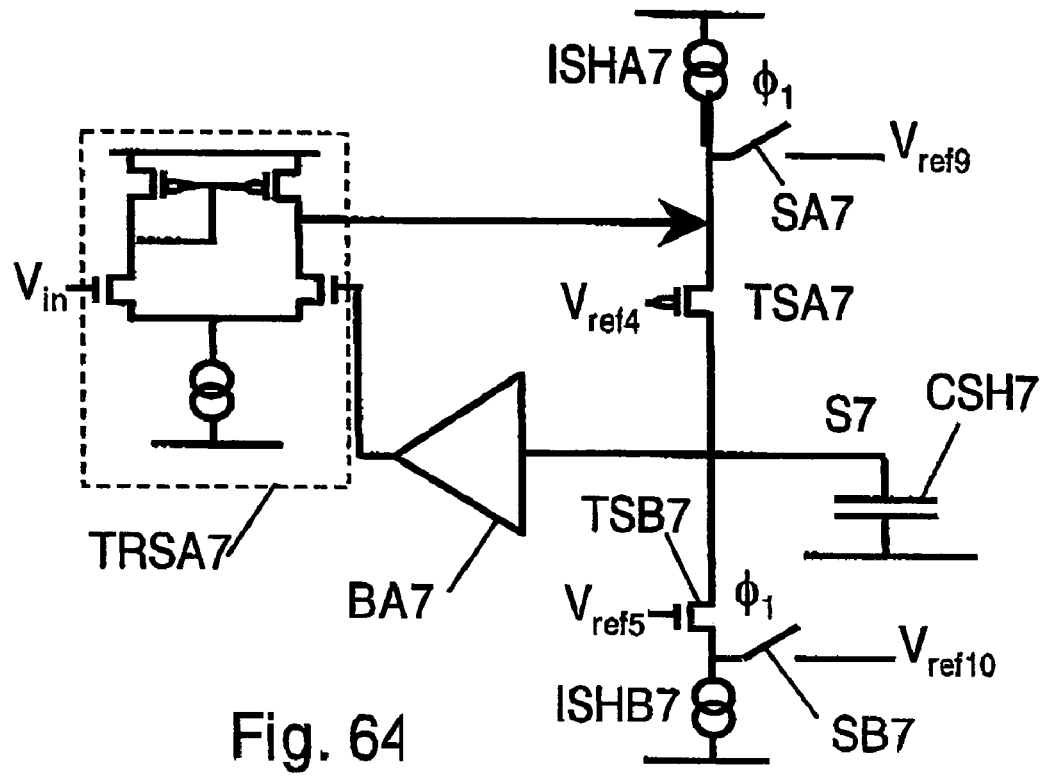
FIG. 64 shows an embodiment of the new switch inside a voltage sample-and-hold or track-and-hold circuit.

To implement a voltage sample-and-hold or track-and-hold circuit, the input voltage Vin is applied to one terminal of a transconductor TRSA7, which injects its output current into the source of TSA7. During sample or track mode TSA7 is conductive and therefore the input voltage Vin can influence the storage node C7. In FIG. 64 the storage node S7 will track the voltage input Vin during track or sample mode. This is due to a feedback loop provided by a unity gain buffer BA7, which buffers the potential of the storage node S7 to apply it to the other input of the transconductor TRSA7. The storage capacitor CSH7 between the storage node S7 and a fixed potential will be charged to the input potential Vin during track or sample mode. During hold mode the storage node S7 will be isolated and CSH7 will maintain the potential of S7 at the value at the moment of the transition of the circuit from track or sample mode into hold mode. The unity gain buffer BA7 helps to prevent coupling from the input node to the storage node during hold mode.

Figure 65:
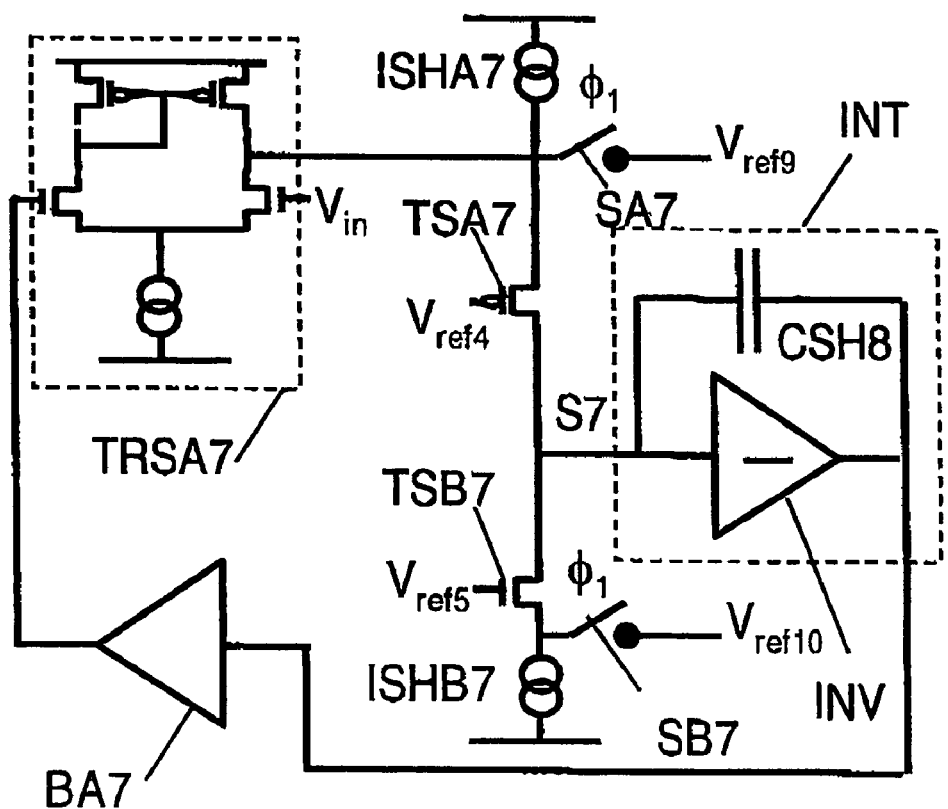
FIG. 65 shows an embodiment of the new switch inside another voltage sample-and-hold or track-and-hold circuit.

In case still there would be too much charge injection this way, an integrator can be used in a closed loop configuration to keep the storage node S7 at a potential independent of the input signal. This is illustrated in FIG. 65. The integrator is formed by an inverting amplifier INV and a storage capacitor CSH8. CSH8 provides the feedback for this inverting amplifier INV. The input potential Vin is applied to the transconductor TRSA7, but now to the second (inverting) input of TRSA7. Now it is the output of the integrator which tracks the input signal. The output of the integrator is fed back now to the first (non-inverting) input of the transconductor TRSA7 by means of the unity gain buffer BA7. The reason for interchanging the inputs of the transconductor is that the integrator using an inverting amplifier provides an additional inversion in the feedback loop. To maintain negative feedback the inputs of the transconductor TRSA7 have to be interchanged in the presence of this inverting integrator.

Note that in these example MOS devices were used as switches. Controlling the emitter of a bipolar device or the source of a JFET transistor in a similar way as the source of these MOS devices will provide similar advantages.

What is claimed is:

1. A current folding cell comprising a plurality of current inputs for receiving at least two distinct input currents to be folded, further comprising:
   at least one current output, and
   a plurality of current paths between said current inputs and said at least one current output, each path comprising at least one element,
   wherein the current path taken by each input current depends on one or both of the sign or the magnitude of said input current,
   wherein for at least one input current, when it changes from a first current path to a second current path, and therefore from at least one element to at least one other element, these two or more elements continue to conduct a non-zero current during the complete change of current path.

2. The current folding cell of claim 1, wherein for at least two input currents, when they change from a first current path to a second current path, and therefore from at least one element to at least one other element, these two or more elements continue to conduct a non-zero current during the complete change of current path.

3. The current folding cell of claim 2, comprising two current inputs, two current outputs and one current path between each current input and each current output, wherein one current input receives an input current while the second current input receives the same input current with the opposite sign.

4. The current folding cell of claim 3, wherein one current output delivers an output current while the second current output delivers the same output current with the opposite sign.

5. The current folding cell of claim 3, further comprising at least one current summing circuit where more than one current arrives, the output of said current summing circuit being connected to one of said current inputs.

6. The current folding cell of claim 3, further comprising first comparison means yielding one digital output indicating the path taken by said current, said comparison means comprising a multi-level comparator yielding a plurality of bits representative of the sign and/or amplitude of at least one of said input currents.

7. The current folding cell of claim 2, wherein said element is a non-linear element.

8. The current folding cell of claim 7, wherein at least one of said non-linear elements is constituted by a diode or by a diode-connected transistor.

9. The current folding cell of claim 7, wherein at least one of said non-linear elements is constituted by a transistor.

10. The current folding cell of claim 2, further comprising comparison means yielding at least one digital output representative of the sign and/or magnitude of said input current or input currents.

11. The current folding cell of claim 1, comprising at least two current outputs.

12. The current folding cell claim 1, comprising a first current input and a second current input, a first circuit providing two alternate current paths for the first input current, a second circuit providing two alternate current paths for the second input current, each of said current paths comprising at least one of said elements, a first current summing circuit for adding the current from one of the current paths of said first circuit with the current from one of the current paths of said second circuit and for providing the result of the addition to said first current output, and a second current summing circuit for adding the current from the other current path of said first circuit with the current from the other current path of said second circuit, the output of said second current summing circuit being connected to said second current output and for providing the result of the addition to said second current output.

13. The current folding cell of claim 12, wherein the input current in said first circuit is equal in magnitude and opposite in sign to the input current in said second circuit.

14. The current folding cell of claim 13, further comprising first comparison means yielding one digital output indicating the path taken by said current in said first circuit, and second comparison means yielding a second digital output indicating the path taken by said current in said second circuit.

15. The current folding cell of claim 14, the output of one of said comparison means being used for testing said current folding cell.

16. The current folding cell of claim 1, further comprising a biasing circuit for biasing said elements in each path with a bias current sufficiently high compared to the input currents to have two elements conduct when a small non-zero input current is presented to said current input.

17. The current folding cell of claim 16, wherein different biases are applied to said elements in two circuits in the cell.

18. The current folding cell of claim 1, further comprising at least one clipping circuit for limiting the range of said at least one of input current, thus allowing the folding cell to have a larger input current range than without clipping.

19. The current folding cell of claim 18, comprising a plurality of current outputs and further comprising a means to add the output currents of the current folding cell to the output currents of the clipping circuit in such a way that the sign and/or magnitude of the input currents determines to which output terminal each of the input currents are transferred.

20. The current folding cell of claim 1, wherein at least one of said outputs is used in a feedback loop to control at least one of said inputs in order to obtain negative dynamic resistance in some part of the range of input currents.

21. A circuit comprising at least one folding cell of one of the claims 1 to 20.

22. A circuit comprising a plurality of current folding cells connected in cascade, wherein
   at least two of said cascade connected current folding cells each comprise a plurality of current inputs for receiving at least two distinct input currents to be folded: at least one current output, a plurality of current paths between said current inputs and said at least one current output, each path comprising at least one element, and wherein the current path taken by each input current depends on one or both of the sign or the magnitude of said input current, and further wherein for at least one input current, when it changes from a first current path to a second current path, and therefore from at least one element to at least one other element, these two or more elements continue to conduct a non-zero current during the complete change of current path.

23. The circuit of claim 22, wherein the bias current applied to the most significant cells in the cascade is such that the DC-current in the elements in each path is higher than what would be needed to reach the precision of current detection of the least significant stage or stages.

24. The circuit of claim 23, wherein said circuit comprises a plurality of current folding cells operating in parallel on signals of same significance.

25. The circuit of claim 22, wherein said circuit comprises a plurality of cascades of current folding cells operating in parallel on signals of same significance.

26. The circuit of claim 25, further comprising mismatch compensating means for reducing the undesired mismatch between folding cells in different cascades or between the input signals of said cascades.

27. The circuit of claim 26, wherein said mismatch compensating means comprise means for comparing the output currents of each of said cascades and feed-back means for adjusting the mismatch in said cascades depending on the result of the comparison.

28. The circuit of claim 27, wherein said mismatch compensating means comprise a load after a stage in said cascade, said comparison means comparing the voltage loss over said load with a reference, the current after said load being fed back in order to adjust said mismatch.

29. The circuit of claim 22, further comprising at least one re-injection circuit for reducing the influence of a parasitic capacitance linked to a node by re-injecting in a node a current equal to the capacitive current, but with an opposite sign.

30. The circuit of claim 29, wherein said re-injection circuit re-injects said current into a different node along the current path.

31. The circuit of claim 22, being an analog-to-digital converter.

32. The circuit of claim 31, comprising a plurality of cascades of current folding cells, wherein at least one bit of the digital output of the converter is derived from a plurality of outputs provided by folding cells of the same order or significance in different cascades.

33. The circuit of claim 32, wherein a different offset current is added to the input currents of the different cascades, and wherein the least significant bit(s) is/are determined by establishing the cascade of which the output currents of the last stage were nearest to the zero crossing.

34. The circuit of claim 32, wherein said outputs are current outputs, and wherein output currents provided by folding cells of the same order in different cascades are summed, the result of said sum being used for determining said one bit.

35. The circuit of claim 32, wherein a majority voting scheme is used for deriving said one bit from a plurality of output currents provided by folding cells of the same order in different cascades.

36. The circuit of claim 32, wherein said one bit is derived from a plurality of output currents provided by one or several selected folding cells of the same order in different cascades, wherein only the folding cells corresponding to the cascade or cascades of which the current outputs are nearer to the zero crossing are selected.

37. The circuit of claim 22, further comprising a track and hold circuit or sample and hold circuit between at least some stages in the cascade of folding cells to construct a pipelined analog-to-digital converter.

38. The circuit of claim 22, further comprising means for measuring the output current of the last folding cell in said folding cell.

39. The circuit of claim 22, being a mixer for mixing several currents, said mixer comprising a at least one current summing circuit where more than one current arrives, the output of said current summing circuit being connected to one of said current inputs.

40. The circuit of claim 22, being a multilevel memory in which an output current of at least one of said folding cell is used in a feedback loop which controls one or more input of the circuit.

41. The circuit of claim 22, being an array of cells in which said current folding cell are used for providing multi-level detection of the currents in the cells.

42. The circuit of claim 22, being a self-latching analog-to-digital converter in which the current of at least one of said folding cell is used in a feedback loop which controls one or more input of the circuit.

43. The circuit of claim 22, being an oscillator using the change in slopes of the output currents as a function of the input currents, provided by the folding cell.

44. The circuit of claim 22, being used to implement a frequency multiplier.

45. The circuit of claim 22, being used to provide switching means.

46. The circuit of claim 22, further comprising:
level detection means for detecting the level of each of said output,
verification means for verifying the relationship between said levels, and
feed-back means for correcting this relationship by acting on one or both of said circuit or the input signal of said circuit.

47. The circuit of claim 46, wherein said outputs are current outputs.

48. The circuit of claim 47, wherein said level detection means comprise:
a load after said output, and
comparing means for comparing the voltage loss over said load to a reference.

49. The circuit of claim 48, wherein said level detection means comprise a load after said output, wherein said verification and feed-back means make use of the current after said load which is fed back into said circuit in order to adjust said relationship.

50. The circuit of claim 22, further comprising at least one current sample-and-hold or track-and-hold circuit.

51. The circuit of claim 50, wherein an input current of said current sample-and-hold or track-and-hold circuit is injected into a terminal of a component or circuit to convert the input current to a voltage so that this voltage can be stored on a storage capacitor, and where the input current is transferred to another terminal of this component or circuit from where it is provided to one folding cell.

52. The circuit of claim 22, wherein for at least two input currents of one of said current folding cell, when they change from a first current path to a second current path, and therefore from at least one element to at least one other element, these two or more elements continue to conduct a non-zero current during the complete change of current path.

53. The circuit of claim 22, wherein at least one current folding cell comprises at least two current outputs.

54. The circuit of claim 22, wherein at least one current folding cell comprises:
    two current inputs,
    two current outputs, and
    one current path between each current input and each current output, wherein
        one current input receives an input current while the second current input receives the same input current with the opposite sign.

55. The circuit of claim 54, further comprising at least one amplification stage between two cascaded folding cells.

56. The circuit of claim 54, wherein said amplification stage includes a current mirror to amplify the current flowing from one stage to the next one.

57. The circuit of claim 54, wherein one current output delivers an output current while the second current output delivers the same output current with the opposite sign.

58. The circuit of claim 57, wherein at least one of said outputs of at least one folding cell in the cascade is used in a feedback loop to control at least one of said inputs of at least one folding cell the cascade.

59. A current sample-and-hold or track-and-hold circuit, wherein an input current is injected into a terminal of a transistor to convert the input current to a voltage so that this voltage can be stored on a storage capacitor, and where the input current is transferred to another terminal of the transistor from where it is made available for further use.

60. The current sample-and-hold or track-and-hold circuit of claim 59, said output being cascade-connected to the input of another current sample-and-hold or track-and-hold circuit.

61. The current sample-and-hold or track-and-hold circuit of claim 60, the storage nodes of said current sample-and-hold or track-and-hold circuits being mutually capacitively coupled.

62. The current sample-and-hold or track-and-hold circuit of claim 59, wherein an isolation of the storage capacitor during hold mode is provided by means of a circuit acting solely on the source or emitter of one or more transistors.

63. A current sample-and-hold or track-and-hold circuit, wherein an input current is injected into a terminal of a transconductor to convert the input current to a voltage so that this voltage can be stored on a storage capacitor, and where the input current is transferred to another terminal of the transconductor from where it is made available for further use.

* * * * *

UNITED STATES PATENT AND TRADEMARK OFFICE
CERTIFICATE OF CORRECTION

PATENT NO. : 6,972,706 B2
APPLICATION NO. : 10/669590
DATED : December 6, 2005
INVENTOR(S) : Snoeijs It is certified that error appears in the above-identified patent and that said Letters Patent is hereby corrected as shown below:

Col. 39, Line 23 Claim 56, please delete "The circuit of claim 54" and insert --The circuit of claim 55--.

Signed and Sealed this

Twelfth Day of September, 2006

JON W. DUDAS
*Director of the United States Patent and Trademark Office*